(12) United States Patent
Yamazaki et al.

(10) Patent No.: US 12,437,985 B2
(45) Date of Patent: *Oct. 7, 2025

(54) CLEANING METHOD OF GLASS SUBSTRATE, MANUFACTURING METHOD OF SEMICONDUCTOR DEVICE, AND GLASS SUBSTRATE

(71) Applicant: Semiconductor Energy Laboratory Co., Ltd., Atsugi (JP)

(72) Inventors: Shunpei Yamazaki, Setagaya (JP); Masataka Sato, Tochigi (JP); Satoru Idojiri, Tochigi (JP); Natsuko Takase, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/137,553

(22) Filed: Apr. 21, 2023

(65) Prior Publication Data

US 2023/0260778 A1    Aug. 17, 2023

Related U.S. Application Data

(63) Continuation of application No. 16/332,546, filed as application No. PCT/IB2017/055991 on Sep. 29, 2017, now Pat. No. 11,637,009.

(30) Foreign Application Priority Data

Oct. 7, 2016    (JP) .................... 2016-198925

(51) Int. Cl.
*H01L 21/02* (2006.01)
*H01L 21/304* (2006.01)
(Continued)

(52) U.S. Cl.
CPC ...... *H01L 21/02041* (2013.01); *H01L 21/304* (2013.01); *H01L 21/30604* (2013.01); *B23K 26/38* (2013.01)

(58) Field of Classification Search
CPC ......... H01L 21/02041; H01L 21/30604; H01L 21/304; B23K 26/38
(Continued)

(56) References Cited

U.S. PATENT DOCUMENTS 6,127,199 A    10/2000    Inoue et al.
6,372,608 B1    4/2002    Shimoda et al.
(Continued)

FOREIGN PATENT DOCUMENTS

CN    101311789 A    11/2008
CN    102082150 A    6/2011
(Continued)

OTHER PUBLICATIONS

International Search Report (Application No. PCT/IB2017/055991) Dated Dec. 19, 2017.
(Continued)

*Primary Examiner* — Duy Vu N Deo
(74) *Attorney, Agent, or Firm* — Eric J. Robinson; Robinson Intellectual Property Law Office, P.C.

(57) ABSTRACT

A glass substrate is reused. The mass productivity of a semiconductor device is increased. A glass substrate one surface of which includes a first material and a second material. The first material includes one or both of a metal and a metal oxide. The second material includes one or both of a resin and a decomposition product of a resin. A cleaning method of a glass substrate, which includes a step of preparing the glass substrate one surface of which includes
(Continued)

a first material and a second material and a step of exposing the first material by removing at least part of the second material.

21 Claims, 34 Drawing Sheets

(51) Int. Cl.
*H01L 21/306* (2006.01)
*B23K 26/38* (2014.01)

(58) Field of Classification Search
USPC ..................................................... 134/1–1.3
See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,530 B2 | 11/2004 | Shimoda et al. | |
| 6,905,800 B1* | 6/2005 | Yuen ................ | H01L 21/32137 |
| | | | 257/E21.256 |
| 6,946,361 B2 | 9/2005 | Takayama et al. | |
| 7,094,665 B2 | 8/2006 | Shimoda et al. | |
| 7,285,476 B2 | 10/2007 | Shimoda et al. | |
| 7,361,573 B2 | 4/2008 | Takayama et al. | |
| 7,364,954 B2 | 4/2008 | Kuwashima et al. | |
| RE40,601 E | 12/2008 | Inoue et al. | |
| 7,468,308 B2 | 12/2008 | Shimoda et al. | |
| 7,485,511 B2 | 2/2009 | Yamada et al. | |
| 7,521,383 B2 | 4/2009 | Morisue et al. | |
| 7,816,685 B2 | 10/2010 | Yamada et al. | |
| 8,043,936 B2 | 10/2011 | Eguchi et al. | |
| 8,048,770 B2 | 11/2011 | Eguchi et al. | |
| 8,048,777 B2 | 11/2011 | Eguchi et al. | |
| 8,120,034 B2 | 2/2012 | Yamada et al. | |
| 8,173,519 B2 | 5/2012 | Morisue et al. | |
| 8,222,666 B2 | 7/2012 | Hatano et al. | |
| 8,242,494 B2 | 8/2012 | Suzawa et al. | |
| 8,362,485 B2 | 1/2013 | Yamada et al. | |
| 8,367,440 B2 | 2/2013 | Takayama et al. | |
| 8,378,343 B2 | 2/2013 | Yamazaki et al. | |
| 8,415,208 B2 | 4/2013 | Takayama et al. | |
| 8,450,769 B2 | 5/2013 | Hatano et al. | |
| 8,507,322 B2 | 8/2013 | Chida et al. | |
| 8,579,126 B1* | 11/2013 | Cole ................ | D06F 57/08 |
| | | | 211/85.24 |
| 8,686,417 B2 | 4/2014 | Suzawa et al. | |
| 8,728,868 B2 | 5/2014 | Chida et al. | |
| 8,759,132 B2 | 6/2014 | Kimura et al. | |
| 8,766,314 B2 | 7/2014 | Hatano et al. | |
| 8,980,685 B2 | 3/2015 | Suzawa et al. | |
| 9,054,141 B2 | 6/2015 | Eguchi et al. | |
| 9,093,397 B2 | 7/2015 | Tanaka et al. | |
| 9,171,867 B2 | 10/2015 | Kimura et al. | |
| 9,190,428 B2 | 11/2015 | Chida et al. | |
| 9,202,987 B2 | 12/2015 | Takayama et al. | |
| 9,397,001 B2* | 7/2016 | Tanaka ................ | H01L 21/78 |
| 9,419,142 B2 | 8/2016 | Morisue et al. | |
| 9,425,371 B2 | 8/2016 | Hatano et al. | |
| 9,437,831 B2 | 9/2016 | Yamazaki et al. | |
| 9,472,429 B2 | 10/2016 | Eguchi et al. | |
| 9,559,316 B2 | 1/2017 | Yamazaki et al. | |
| 9,559,317 B2 | 1/2017 | Yamazaki et al. | |
| 9,608,004 B2 | 3/2017 | Takayama et al. | |
| 9,608,083 B2 | 3/2017 | Ozaki et al. | |
| 9,623,633 B2 | 4/2017 | Kim et al. | |
| 9,647,242 B2 | 5/2017 | Fukuda et al. | |
| 9,780,070 B2 | 10/2017 | Chida et al. | |
| 9,796,879 B2 | 10/2017 | Mori et al. | |
| 9,799,716 B2 | 10/2017 | Hatano et al. | |
| 9,895,868 B2 | 2/2018 | Nakase et al. | |
| 9,947,568 B2 | 4/2018 | Yasumoto et al. | |
| 9,960,213 B2 | 5/2018 | Senda et al. | |
| 10,043,897 B2 | 8/2018 | Ozaki | |
| 10,189,048 B2 | 1/2019 | Yamazaki et al. | |
| 10,424,514 B2 | 9/2019 | Kato et al. | |
| 10,586,816 B2 | 3/2020 | Takayama et al. | |
| 10,636,692 B2 | 4/2020 | Yasumoto et al. | |
| 11,177,373 B2 | 11/2021 | Katayama et al. | |
| 11,355,382 B2 | 6/2022 | Yasumoto et al. | |
| 11,637,009 B2* | 4/2023 | Yamazaki .......... | H01L 21/7806 |
| | | | 134/1 |
| 2003/0116768 A1 | 6/2003 | Ishikawa | |
| 2005/0161680 A1 | 7/2005 | Kawakami et al. | |
| 2006/0012742 A1 | 1/2006 | Tsai et al. | |
| 2007/0110917 A1 | 5/2007 | Okada | |
| 2007/0117288 A1* | 5/2007 | Miyairi ................ | B23K 26/073 |
| | | | 257/E27.113 |
| 2008/0292786 A1 | 11/2008 | Hatano et al. | |
| 2009/0023251 A1 | 1/2009 | Eguchi et al. | |
| 2010/0267203 A1 | 10/2010 | Chen et al. | |
| 2011/0031493 A1 | 2/2011 | Yamazaki et al. | |
| 2011/0052836 A1 | 3/2011 | Kim et al. | |
| 2011/0294244 A1 | 12/2011 | Hattori et al. | |
| 2012/0091522 A1 | 4/2012 | Ozaki et al. | |
| 2013/0240896 A1 | 9/2013 | Ozaki | |
| 2014/0217383 A1 | 8/2014 | Park et al. | |
| 2015/0069358 A1 | 3/2015 | Chida et al. | |
| 2015/0155505 A1 | 6/2015 | Yamazaki et al. | |
| 2016/0035758 A1 | 2/2016 | Kimura et al. | |
| 2016/0172244 A1* | 6/2016 | Tanaka ................ | H10D 30/6758 |
| | | | 438/125 |
| 2016/0283028 A1 | 9/2016 | Yamazaki et al. | |
| 2016/0299387 A1 | 10/2016 | Yamazaki et al. | |
| 2016/0329531 A1 | 11/2016 | Morisue et al. | |
| 2016/0358986 A1 | 12/2016 | Yamazaki et al. | |
| 2017/0031192 A1 | 2/2017 | Yamazaki et al. | |
| 2017/0031471 A1 | 2/2017 | Yamazaki et al. | |
| 2017/0033172 A1 | 2/2017 | Yamazaki et al. | |
| 2017/0133450 A1 | 5/2017 | Yamazaki et al. | |
| 2017/0294462 A1 | 10/2017 | Yamazaki et al. | |
| 2018/0061638 A1 | 3/2018 | Yamazaki et al. | |
| 2018/0166524 A1 | 6/2018 | Yamazaki et al. | |
| 2019/0035820 A1 | 1/2019 | Yanaka et al. | |
| 2019/0084003 A1 | 3/2019 | Yamazaki et al. | |
| 2019/0096977 A1 | 3/2019 | Yamazaki et al. | |

FOREIGN PATENT DOCUMENTS

| | | |
|---|---|---|
| CN | 104395080 A | 3/2015 |
| CN | 104769021 A | 7/2015 |
| EP | 0858110 A | 8/1998 |
| EP | 1351308 A | 10/2003 |
| EP | 1655633 A | 5/2006 |
| EP | 1744365 A | 1/2007 |
| EP | 1758169 A | 2/2007 |
| EP | 2290726 A | 3/2011 |
| EP | 2865523 A | 4/2015 |
| JP | 10-206896 A | 8/1998 |
| JP | 2001-230419 A | 8/2001 |
| JP | 2003-096565 A | 4/2003 |
| JP | 2003-098977 A | 4/2003 |
| JP | 2003-163337 A | 6/2003 |
| JP | 2003-174153 A | 6/2003 |
| JP | 2004-349543 A | 12/2004 |
| JP | 2005-171373 A | 6/2005 |
| JP | 2005-294800 A | 10/2005 |
| JP | 2006-332619 A | 12/2006 |
| JP | 2007-012917 A | 1/2007 |
| JP | 2007-098677 A | 4/2007 |
| JP | 2007-264609 A | 10/2007 |
| JP | 2008-109123 A | 5/2008 |
| JP | 2009-260166 A | 11/2009 |
| JP | 2010-165673 A | 7/2010 |
| JP | 2011-048374 A | 3/2011 |
| JP | 2011-248072 A | 12/2011 |
| JP | 2011-253899 A | 12/2011 |
| JP | 2012-089677 A | 5/2012 |
| JP | 2012-104569 A | 5/2012 |
| JP | 4954359 | 6/2012 |
| JP | 2013-042180 A | 2/2013 |
| JP | 2013-069769 A | 4/2013 |

(56) References Cited

FOREIGN PATENT DOCUMENTS

| | | |
|---|---|---|
| JP | 2013-197220 A | 9/2013 |
| JP | 2014-187356 A | 10/2014 |
| JP | 2015-052101 A | 3/2015 |
| JP | 2015-072361 A | 4/2015 |
| JP | 2015-109467 A | 6/2015 |
| JP | 2015-133481 A | 7/2015 |
| JP | 2015-187701 A | 10/2015 |
| JP | 2015-215882 A | 12/2015 |
| JP | 2015-223823 A | 12/2015 |
| JP | 2016-086158 A | 5/2016 |
| JP | 2016-111106 A | 6/2016 |
| JP | 2016-115930 A | 6/2016 |
| JP | 2016-136644 A | 7/2016 |
| JP | 2018-078292 A | 5/2018 |
| KR | 2008-0103443 A | 11/2008 |
| KR | 2015-0120376 A | 10/2015 |
| WO | WO-1997/023806 | 7/1997 |
| WO | WO-2008/044473 | 4/2008 |
| WO | WO-2010/071089 | 6/2010 |
| WO | WO-2011/040441 | 4/2011 |
| WO | WO-2012/060199 | 5/2012 |
| WO | WO-2013/005254 | 1/2013 |
| WO | WO-2014/073591 | 5/2014 |
| WO | WO-2014/129519 | 8/2014 |
| WO | WO-2015/083029 | 6/2015 |
| WO | WO-2015/087192 | 6/2015 |
| WO | WO-2016/140229 | 9/2016 |
| WO | WO-2018/083568 | 5/2018 |

OTHER PUBLICATIONS

Written Opinion (Application No. PCT/IB2017/055991) Dated Dec. 19, 2017.
Chinese Office Action (Application No. 201780056499.X) Dated Nov. 10, 2022.

\* cited by examiner $$M-O-C + H_2O \rightarrow M-OH + C-OH$$

FIG. 5A1
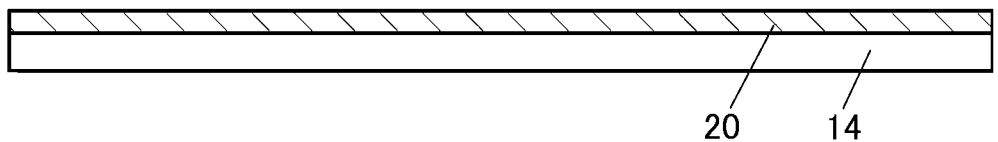
FIG. 5A2
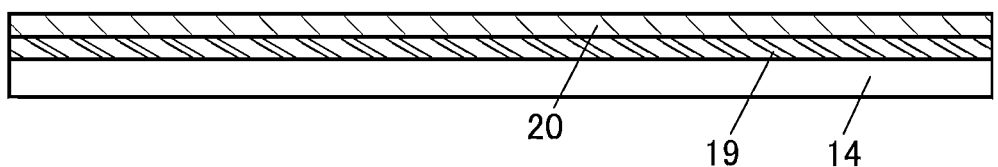
FIG. 5B
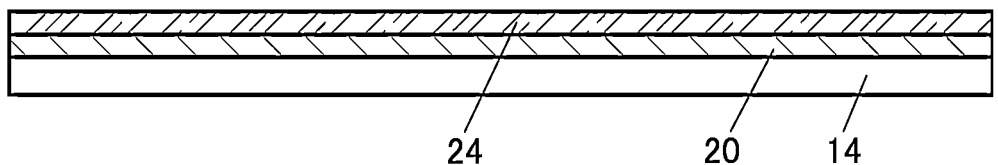
FIG. 5C
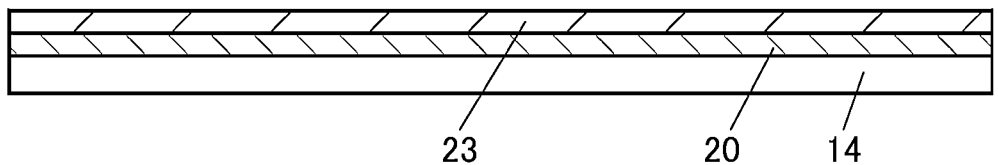
FIG. 5D
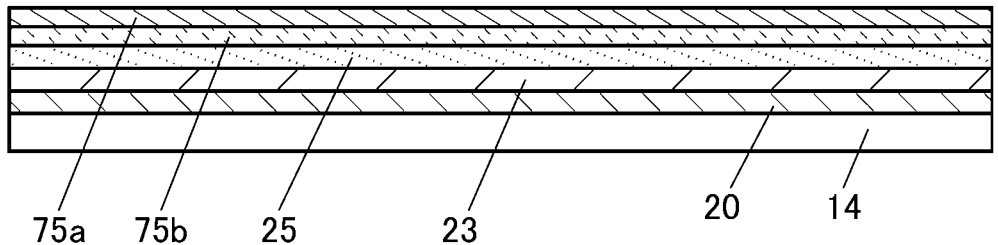

FIG. 8A1
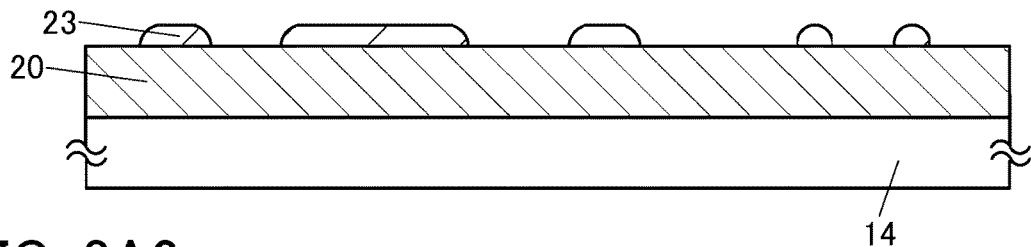
FIG. 8A2
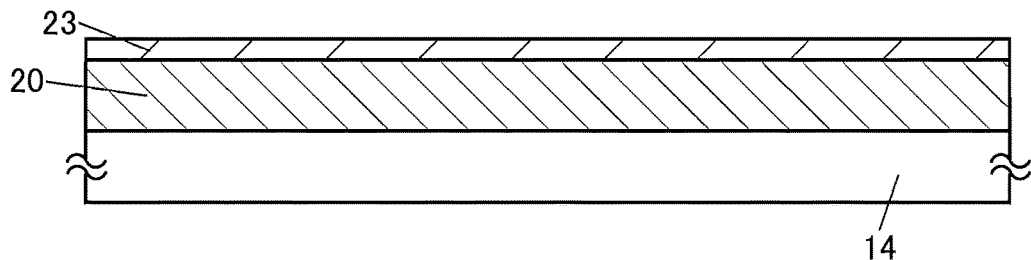
FIG. 8B
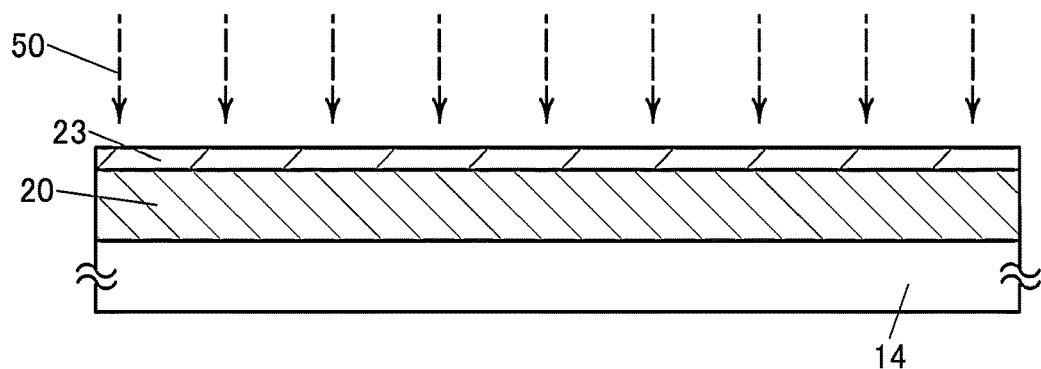
FIG. 8C1
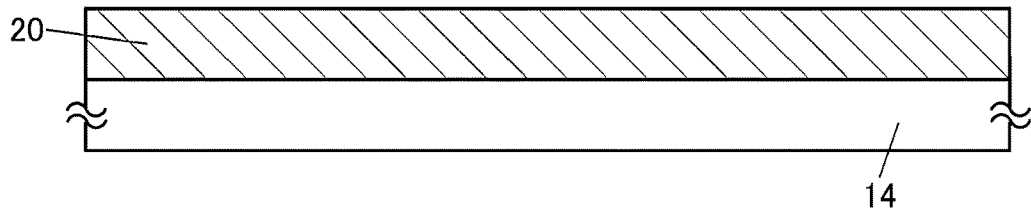
FIG. 8C2
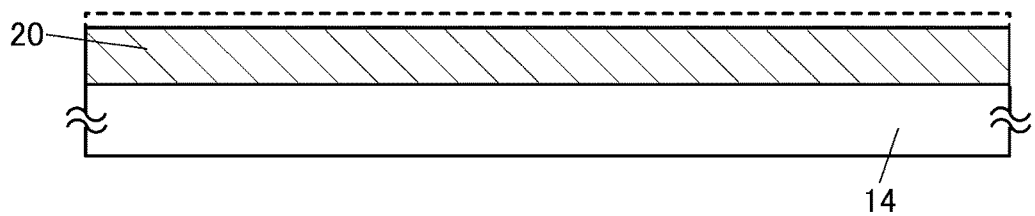

CLEANING METHOD OF GLASS SUBSTRATE, MANUFACTURING METHOD OF SEMICONDUCTOR DEVICE, AND GLASS SUBSTRATE

TECHNICAL FIELD

One embodiment of the present invention relates to a cleaning method of a substrate. One embodiment of the present invention relates to a glass substrate and a cleaning method of a glass substrate. One embodiment of the present invention relates to a peeling method, a manufacturing method of a semiconductor device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor or the like), an input/output device (e.g., a touch panel or the like), a driving method thereof, and a manufacturing method thereof.

Note that in this specification and the like, a semiconductor device generally means a device that can function by utilizing semiconductor characteristics. A transistor, a semiconductor circuit, a display device, a light-emitting device, an input device, an input/output device, an arithmetic device, a memory device, and the like are each an embodiment of a semiconductor device. In addition, an imaging device, an electro-optical device, a power generation device (including a thin film solar cell, an organic thin film solar cell, and the like), and an electronic device each include a semiconductor device in some cases.

BACKGROUND ART

Display devices using organic EL (Electro Luminescence) elements or liquid crystal elements have been known. Other examples of display devices include a light-emitting device provided with a light-emitting element such as a light-emitting diode (LED), and electronic paper performing display with an electrophoretic method or the like.

The organic EL element has a basic structure in which a layer containing a light-emitting organic compound is provided between a pair of electrodes. When voltage is applied to the element, light emission from the light-emitting organic compound can be obtained. With the use of such an organic EL element, thin, lightweight, high-contrast, and low-power-consumption display devices can be achieved.

In addition, when a semiconductor element such as a transistor and a display element such as an organic EL element are formed over a substrate (film) having flexibility, a flexible display device can be achieved.

Disclosed in Patent Document 1 is a method for manufacturing a flexible display device in which a supporting substrate (a glass substrate) provided with a heat-resistant resin layer and electronic elements with a sacrificial layer therebetween is irradiated with laser light to peel the heat-resistant resin layer from the glass substrate.

PRIOR ART DOCUMENT

[Patent Document]

[Patent Document 1] Japanese Published Patent Application No. 2015-223823

SUMMARY OF THE INVENTION

Problems to be Solved by the Invention

An object of one embodiment of the present invention is to provide a novel cleaning method of a substrate (typically, a glass substrate), a novel glass substrate, a novel peeling method, a novel manufacturing method of a semiconductor device, or a novel manufacturing method of a display device. An object of one embodiment of the present invention is to reuse a glass substrate. An object of one embodiment of the present invention is to provide a peeling method, a manufacturing method of a semiconductor device, or a manufacturing method of a display device each having a low cost and a high mass productivity. An object of one embodiment of the present invention is to provide a high-yield peeling method. An object of one embodiment of the present invention is to manufacture a semiconductor device or a display device using a large-sized substrate. An object of one embodiment of the present invention is to manufacture a semiconductor device or a display device at low temperatures.

Note that the description of the objects does not preclude the existence of other objects. One embodiment of the present invention does not necessarily achieve all the objects. Other objects can be derived from the description of the specification, the drawings, and the claims.

Means for Solving the Problems

One embodiment of the present invention is a cleaning method of a glass substrate, which includes a step of preparing the glass substrate one surface of which includes a first material and a step of removing at least part of the first material. The first material includes one or both of a metal and a metal oxide. In the step of removing at least part of the first material, one or more of wet etching, dry etching, ashing, cleaning, and polishing are preferably performed.

One embodiment of the present invention is a cleaning method of a glass substrate, which includes a step of preparing the glass substrate one surface of which includes a first material and a second material and a step of exposing the first material by removing at least part of the second material. The first material includes one or both of a metal and a metal oxide. The second material includes one or both of a resin and a decomposition product of a resin. In the step of exposing the first material, one or more of wet etching, dry etching, ashing, cleaning, and polishing are preferably performed.

One embodiment of the present invention is a manufacturing method of a semiconductor device, which includes a step of forming a first material layer over a glass substrate; a step of forming a second material layer over the first material layer; a step of forming a first layer to be peeled over the second material layer; a step of separating the glass substrate and the first layer to be peeled from each other with the use of the first material layer and the second material layer; and a step of removing at least part of the first material layer remaining on the glass substrate. The step of removing at least part of the first material layer may be further followed by a step of forming a third material layer over the glass substrate, a step of forming a fourth material layer over the third material layer, a step of forming a second layer to be peeled over the fourth material layer, and a step of separating the glass substrate and the second layer to be peeled from each other with the use of the third material layer and the fourth material layer. The first material layer and the third material layer each include one or both of a metal and a metal oxide. The second material layer and the fourth material layer each include a resin. In the step of removing at least part of the first material layer, one or more of wet etching, dry etching, ashing, cleaning, and polishing are preferably performed.

One embodiment of the present invention is a manufacturing method of a semiconductor device, which includes a step of forming a first material layer over a glass substrate; a step of forming a second material layer over the first material layer; a step of forming a first layer to be peeled over the second material layer; a step of separating the glass substrate and the first layer to be peeled from each other with the use of the first material layer and the second material layer; and a step of exposing the first material layer by removing at least part of the second material layer remaining on the glass substrate. The step of exposing the first material layer may be further followed by a step of forming a third material layer over the first material layer, a step of forming a second layer to be peeled over the third material layer, and a step of separating the glass substrate and the second layer to be peeled from each other with the use of the first material layer and the third material layer. The first material layer includes one or both of a metal and a metal oxide. The second material layer and the third material layer each include a resin. In the step of exposing the first material layer, one or more of wet etching, dry etching, ashing, cleaning, and polishing are preferably performed.

The first material layer and the glass substrate preferably include a common metal.

One embodiment of the present invention is a cleaning method of a glass substrate, which includes a step of preparing the glass substrate one surface of which includes a first material and second material; a step of exposing the first material by removing at least part of the second material; a step of forming a third material over the exposed first material; a step of heating the first material and the third material in a state of being stacked; and a step of separating the first material and the third material from each other. The first material includes one or both of a metal and a metal oxide. The first material includes one or more of hydrogen, oxygen, and water. The second material and the third material each include a resin. In the heating step, water is separated out at an interface between the first material and the third material or in the vicinity of the interface. In the separating step, the first material and the third material are separated from each other by irradiating the water existing at the interface or in the vicinity of the interface with light. After the step of exposing the first material, a step of forming a fourth material over the exposed first material may be included. In that case, in the step of forming the third material, the third material is formed over the fourth material. The fourth material and the first material include a common metal.

In the step of exposing the first material, one or more of wet etching, dry etching, ashing, cleaning, and polishing are preferably performed.

The irradiation with the light is preferably performed such that a wavelength range includes greater than or equal to 180 nm and less than or equal to 450 nm.

The irradiation with the light is preferably performed with the use of a laser apparatus.

The irradiation with the light is preferably performed at an energy density greater than or equal to 250 mJ/cm$^2$ and less than or equal to 360 mJ/cm$^2$.

The first material preferably includes one or both of titanium and titanium oxide.

One embodiment of the present invention is a glass substrate one surface of which includes a first material and a second material over the first material. The first material includes one or both of a metal and a metal oxide. The first material preferably includes one or both of titanium and titanium oxide. The second material includes a resin. The second material preferably includes a residue of a compound represented by Structural Formula (100).

[Chemical 1]

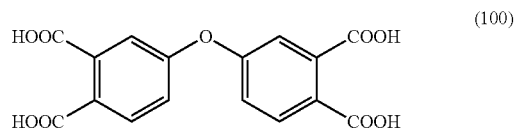

(100)

Effect of the Invention

According to one embodiment of the present invention, a novel cleaning method of a substrate, a novel glass substrate, a novel peeling method, a novel manufacturing method of a semiconductor device, or a novel manufacturing method of a display device can be provided. According to one embodiment of the present invention, a glass substrate can be reused. According to one embodiment of the present invention, a peeling method, a manufacturing method of a semiconductor device, or a manufacturing method of a display device each having a low cost and a high mass productivity can be provided. According to one embodiment of the present invention, a high-yield peeling method can be provided. According to one embodiment of the present invention, a semiconductor device or a display device using a large-sized substrate can be manufactured. According to one embodiment of the present invention, a semiconductor device or a display device can be manufactured at low temperatures.

Note that the description of the effects does not preclude the existence of other effects. One embodiment of the present invention does not necessarily have all the effects. Other effects can be derived from the description of the specification, the drawings, and the claims.

BRIEF DESCRIPTION OF THE DRAWINGS

FIGS. 5A1-D Cross-sectional views illustrating an example of a manufacturing method of a display device.

FIGS. 8A1-C2 Cross-sectional views illustrating an example of a cleaning method.

MODE FOR CARRYING OUT THE INVENTION

Figure 1:
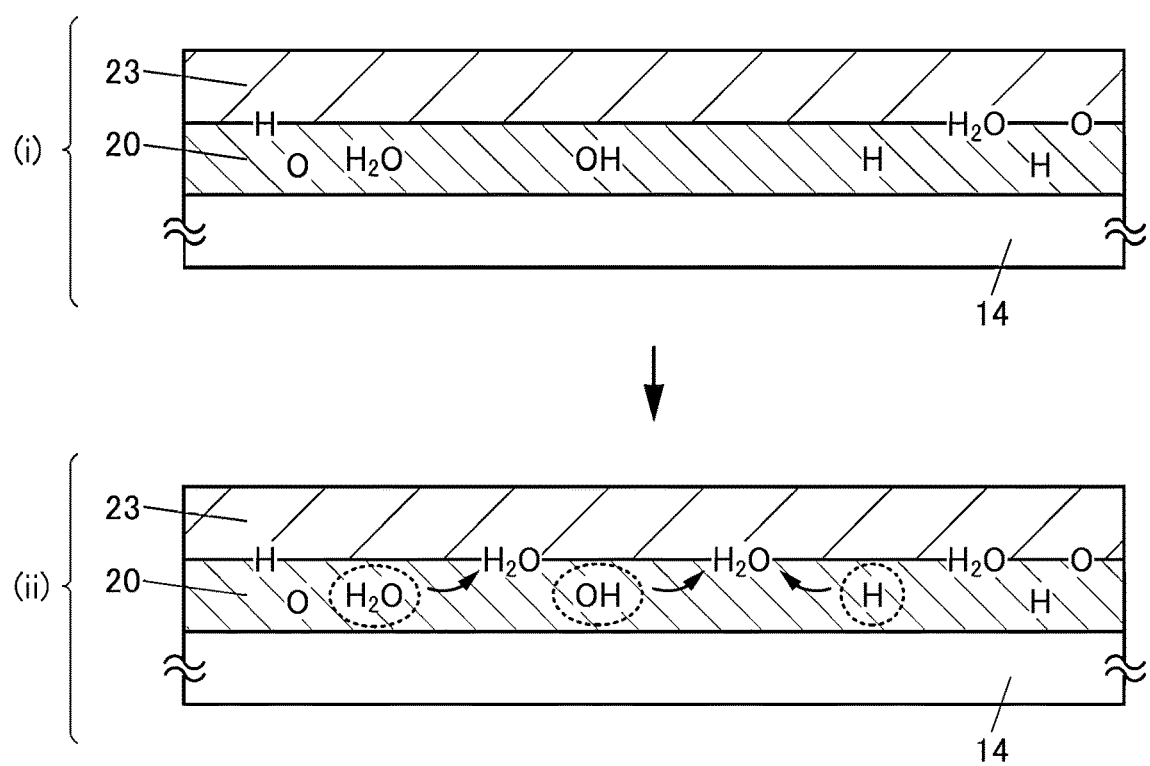
FIG. 1 A schematic diagram illustrating an example of a peeling method.

Embodiments will be described in detail with reference to the drawings. Note that it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, an OS FET can also be called a transistor including a metal oxide or an oxide semiconductor.

Furthermore, in this specification and the like, metal oxides containing nitrogen are also collectively referred to as a metal oxide in some cases. Moreover, a metal oxide containing nitrogen may be referred to as a metal oxynitride.

Embodiment 1

In this embodiment, a peeling method, a manufacturing method of a display device, and a cleaning method of a substrate that are embodiments of the present invention will be described with reference to FIG. 1 to FIG. 27.

In this embodiment, a display device that includes a transistor and an organic EL element (also referred to as an active matrix organic EL display device) will be described as an example. The display device can be a flexible device by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other functional elements.

In this embodiment, first, a first material layer, which is a metal oxide layer here, is formed over a substrate. Then, a second material layer, which is a resin layer here, is formed over the metal oxide layer. After that, the metal oxide layer and the resin layer are separated from each other by light irradiation.

In this embodiment, a layer serving as a base (also referred to as a base layer) is formed between the substrate and the resin layer. This base layer has lower adhesion (adhesiveness) to the resin layer than the substrate does. Although the metal oxide layer is used as the base layer in an example described in this embodiment, one embodiment of the present invention is not limited to this example.

Light is preferably used for the separation between the metal oxide layer and the resin layer. An interface between the metal oxide layer and the resin layer or the vicinity thereof (also referred to as an interface or the vicinity of the interface) is preferably irradiated with the light. Furthermore, the inside of the metal oxide layer may be irradiated with the light. Furthermore, the inside of the resin layer may be irradiated with the light. Note that in this specification and the like, "an interface between A and B or the vicinity thereof" and "an interface between A and B or the vicinity of the interface" each include at least the interface between A and B and also include a range from the interface between A and B to within 20% of the thickness of A or B.

The interface between the metal oxide layer and the resin layer (as well as the inside of the metal oxide layer and the inside of the resin layer) is heated by the light irradiation, and the adhesion (or adhesiveness) between the metal oxide layer and the resin layer can be decreased. In addition, the metal oxide layer and the resin layer can be separated from each other.

After the separation, a substrate on which the metal oxide layer remains (e.g., a glass substrate) can be cleaned.

A cleaning method of a substrate that is one embodiment of the present invention includes a step of preparing the substrate one surface of which includes a first material and a step of removing at least part of the first material. The first material includes one or both of a metal and a metal oxide. In the step of removing at least part of the first material, one or more of wet etching, dry etching, ashing, cleaning, and polishing are preferably performed.

In addition, after the separation, not only the metal oxide layer but also the resin layer remains on the substrate in some cases.

A cleaning method of a substrate that is one embodiment of the present invention includes a step of preparing the substrate one surface of which includes a first material and a second material and a step of removing at least part of the second material. The first material includes one or both of a metal and a metal oxide. The second material includes one or both of a resin and a decomposition product of a resin. In the step of removing at least part of the second material, one or more of wet etching, dry etching, ashing, cleaning, and polishing are preferably performed. The first material is exposed by removing at least part of the second material. In some cases, at least part of the first material is removed in the step of removing at least part of the second material.

It is possible to reuse the substrate treated by the cleaning method of a substrate that is one embodiment of the present invention. A variety of devices such as a semiconductor device and a display device can be manufactured with the use of the substrate. When the substrate is reused, the cost can be greatly reduced.

For example, this substrate can be used as a substrate used in the manufacturing method of a display device of one embodiment of the present invention.

As an example, a case in which a substrate where a first material is exposed is used as a substrate used in the manufacturing method of a display device of one embodiment of the present invention is described. By applying the cleaning method of a substrate of one embodiment of the present invention, the substrate where the first material is exposed can be obtained. With such a substrate, a step of forming the first material over the substrate can be omitted. A substrate one surface of which is provided with the first material is prepared and the second material can be formed over the first material. Alternatively, the first material (or a fourth material containing the same metal as the first material) may be further formed over the first material. For example, in the case where the thickness of the first material remaining on the substrate is too small, the first material or the fourth material may be further formed over the first material.

The first material and the glass substrate preferably include a common metal. Even when a metal originally contained in the glass substrate remains over the glass substrate, the metal is less likely to affect manufacture of various devices adversely (is less likely to serve as an impurity). Thus, even when the first material partly remains on the substrate treated by the cleaning method of a substrate of one embodiment of the present invention, the substrate can be reused for various applications. The substrate can be used as a substrate used in a method other than the manufacturing method of a display device of one embodiment of the present invention (e.g., a method not using the first material).

Note that various substrates can be cleaned by the cleaning method of a substrate of one embodiment of the present invention. That is, a substrate to be cleaned is not limited to the substrate used in the peeling method, the manufacturing method of a display device, or the like described in this embodiment as examples. Furthermore, the substrate that is treated by the cleaning method of a substrate of one embodiment of the present invention can be used for various applications. That is, the application of the cleaned substrates is not limited to their use in the peeling method, the manufacturing method of a display device, or the like described in this embodiment.

An example of the principle of separation of the metal oxide layer and the resin layer from each other is described with reference to FIG. 1 to FIG. 3.

First, the effect that $H_2O$ impairs adhesion between a metal oxide layer 20 and a resin layer 23 (hereinafter referred to as an impairing effect) is described with reference to FIG. 1 and FIG. 2.

In FIG. 1, the metal oxide layer 20 is provided over a formation substrate 14 and the resin layer 23 is provided over the metal oxide layer 20.

At an interface between the metal oxide layer 20 and the resin layer 23 and/or in the metal oxide layer 20, one or more of $H_2O$, hydrogen (H), oxygen (O), a hydroxyl group (OH), a hydrogen radical (H*), an oxygen radical (O*), and a hydroxy radical (OH*) are present. These can be supplied by a formation step of the metal oxide layer 20, an addition (doping) step after the formation of the metal oxide layer 20, or the like. In an example of Step (i) in FIG. 1, $H_2O$, H, O, and the like are present both at the interface between the metal oxide layer and the resin layer 23 and in the metal oxide layer 20.

H, O, $H_2O$, and the like supplied to the interface between the metal oxide layer 20 and the resin layer 23 and into the metal oxide layer 20 are sometimes separated out as $H_2O$ at the interface by a step (e.g., heating at 350° C.) in which the resin layer 23 (e.g., a polyimide or the like) is solidified (goes solid or is hardened). In that case, $H_2O$ separated out at the interface between the metal oxide layer 20 and the resin layer 23 might impair the adhesion between the metal oxide layer 20 and the resin layer 23. In other words, $H_2O$ separated out at the interface between the metal oxide layer 20 and the resin layer 23 has an effect of impairing adhesion (an impairing effect). In an example of Step (ii) in FIG. 1, $H_2O$ in the metal oxide layer 20 is separated out at the interface between the metal oxide layer 20 and the resin layer 23. Furthermore, in an example of Step (ii) in FIG. 1, hydrogen and a hydroxyl group (OH) in the metal oxide layer 20 are separated out as $H_2O$ at the interface between the metal oxide layer 20 and the resin layer 23.

Next, a stack including the formation substrate 14, the metal oxide layer 20, and the resin layer 23 is irradiated with light. In an example of Step (iii) in FIG. 2, the stack is placed with the formation substrate 14 positioned on the upper side. In Step (iii) in FIG. 2, the stack is moved by a transfer mechanism (not illustrated) in a direction shown by an arrow in the drawing; thus, the light irradiation is performed from the right side to the left side in the drawing. The interface between the metal oxide layer 20 and the resin layer 23 or the vicinity thereof is irradiated with the light through the formation substrate 14. Here, an example of using linear laser light is shown. In the example of Step (iii) and Step (iv) in FIG. 2, a processing region 27 is irradiated with a linear beam 26 through the formation substrate 14. The interface between the metal oxide layer 20 and the resin layer 23 (as well as the inside of the metal oxide layer 20 and the inside of the resin layer 23) is heated by the light irradiation. Furthermore, by the light irradiation, $H_2O$ present at the interface between the metal oxide layer 20 and the resin layer 23 is vaporized (evaporated) instantaneously at high energy and ablated (or exploded).

Figure 2:
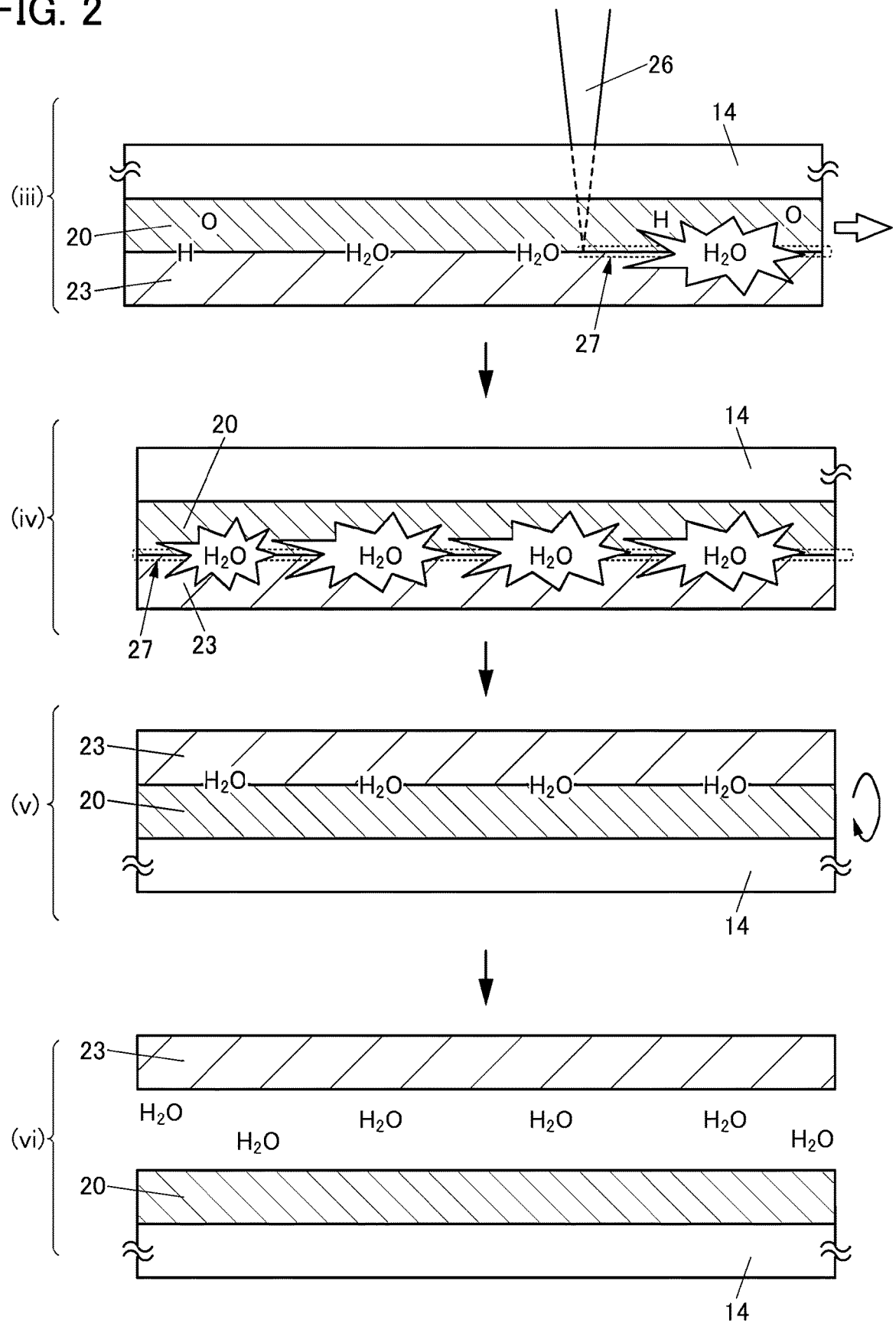
FIG. 2 A schematic diagram illustrating an example of a peeling method.

In an example of Step (v) in FIG. 2, the stack is reversed upside down. In an example of Step (vi) in FIG. 2, the metal oxide layer 20 and the resin layer 23 are separated from each other. $H_2O$ becomes water vapor by light irradiation to have an expanded volume. As a result, the adhesion between the metal oxide layer 20 and the resin layer 23 is reduced, which allows for the separation between the metal oxide layer 20 and the resin layer 23.

Next, a bond between the metal oxide layer 20 and the resin layer 23 is described with reference to FIG. 3.

Figure 3:
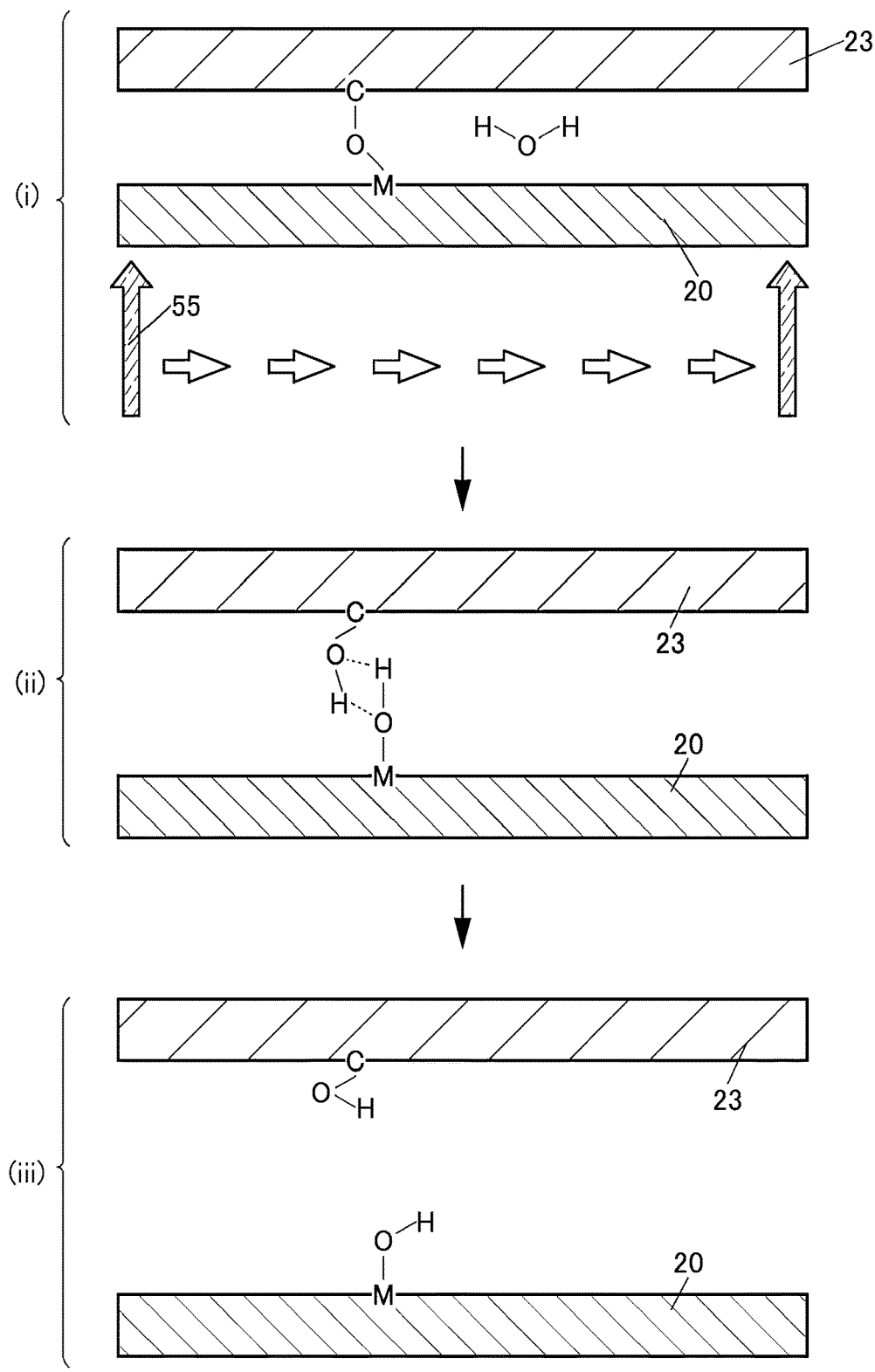
FIG. 3 A schematic diagram illustrating an example of a peeling method.

In FIG. 3, the metal oxide layer 20 and the resin layer 23 are stacked.

A bond is probably formed between the metal oxide layer 20 and the resin layer 23. Specifically, a chemical bond such as a covalent bond, an ionic bond, or a hydrogen bond is formed between the metal oxide layer 20 and the resin layer 23.

In an example of Step (i) in FIG. 3, a metal M of the metal oxide layer 20 and carbon C of the resin layer 23 are bonded through oxygen O.

The stacked-layer structure of the metal oxide layer 20 and the resin layer 23 is irradiated with light (see laser light 55 in FIG. 3). Here, an example of using linear laser light is shown. By relatively moving the substrate and a light source, scanning with the laser light 55 is performed and the irradiation with the laser light 55 is performed across a region where peeling is desirably caused.

The light irradiation heats the interface between the metal oxide layer 20 and the resin layer 23 (as well as the inside of the metal oxide layer 20 and the inside of the resin layer 23) and causes a reaction represented by Formula (1) (see below and FIG. 3). The light irradiation allows $H_2O$ (water vapor) to cut the metal M-oxygen O-carbon C bond. Then, the bond between the metal oxide layer 20 and the resin layer 23 is changed into a hydrogen bond.

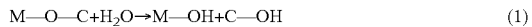

$$M\text{—}O\text{—}C+H_2O \rightarrow M\text{—}OH+C\text{—}OH \qquad (1)$$

In an example of Step (ii) in FIG. 3, the metal M of the metal oxide layer 20 and the oxygen O are bonded and the carbon C of the resin layer 23 and another oxygen O are bonded. The two oxygens form covalent bonds with the respective hydrogens. Furthermore, the two oxygens each form a hydrogen bond with the hydrogen bonded to the other oxygen.

A hydrogen bond is much weaker than a covalent bond and thus can be easily cut. Furthermore, water is evaporated by energy of the light irradiation to be water vapor. At this time, a hydrogen bond between the metal oxide layer 20 and the resin layer 23 can be cut by expansion force in some cases. Thus, the metal oxide layer 20 and the resin layer 23 can be easily separated from each other.

In an example of Step (iii) in FIG. 3, the oxygen and the hydrogen that have been hydrogen-bonded are detached from each other and the metal oxide layer 20 and the resin layer 23 are separated from each other. The metal M of the metal oxide layer 20 and the oxygen O are bonded and the carbon C of the resin layer 23 and another oxygen O are bonded. The two oxygens form covalent bonds with the respective hydrogens.

As described above, irradiating the stacked-layer structure of the metal oxide layer 20 and the resin layer 23 with light allows $H_2O$ to change a strong bond between the metal oxide layer 20 and the resin layer 23 into a hydrogen bond, which is a weak bond. This can reduce the force required for the separation between the metal oxide layer 20 and the resin layer 23. Furthermore, the metal oxide layer 20 and the resin layer 23 can be separated from each other by expansion of $H_2O$ due to energy of the light irradiation.

Next, $H_2O$ that is involved in the above impairing effect and the reaction represented by Formula (1) above is described.

$H_2O$ is sometimes present in the metal oxide layer 20, in the resin layer 23, and at the interface between the metal oxide layer 20 and the resin layer 23, for example.

In addition, hydrogen (H), oxygen (O), a hydroxyl group (OH), a hydrogen radical (H*), an oxygen radical (O*), a hydroxy radical (OH*), and the like present in the metal oxide layer 20, in the resin layer 23, and at the interface between the metal oxide layer 20 and the resin layer 23, for example, are sometimes changed into $H_2O$ by heating.

One or more of $H_2O$, hydrogen (H), oxygen (O), a hydroxyl group (OH), a hydrogen radical (H*), an oxygen radical (O*), and a hydroxy radical (OH*) are preferably added into the metal oxide layer 20, to a surface of the metal oxide layer 20 (the surface in contact with the resin layer 23), or to the interface between the metal oxide layer 20 and the resin layer 23.

Note that the above impairing effect and the reaction represented by Formula (1) above are sometimes caused at the same time in the peeling method of one embodiment of the present invention. It is estimated that in that case, the adhesion between the metal oxide layer 20 and the resin layer 23 can be further reduced, or in other words, peelability between the metal oxide layer 20 and the resin layer 23 can be further increased.

It is preferable that large amounts of $H_2O$, hydrogen (H), oxygen (O), hydroxyl groups (OH), hydrogen radicals (H*), oxygen radicals (O*), hydroxy radicals (OH*), and the like be present in the metal oxide layer 20, in the resin layer 23, and at the interface between the metal oxide layer 20 and the resin layer 23, for example. A larger amount of $H_2O$, which contributes to the reaction, promotes the reaction and can further reduce the force required for the separation.

For example, during the formation of the metal oxide layer 20, large amounts of $H_2O$, hydrogen, oxygen, hydroxyl groups, hydrogen radicals (H*), oxygen radicals (O*), hydroxy radicals (OH*), and the like are preferably contained in the metal oxide layer 20 or on the surface of the metal oxide layer 20.

Specifically, the metal oxide layer 20 is preferably formed in such a manner that a metal layer is formed and radical treatment is performed on a surface of the metal layer. In the radical treatment, the surface of the metal layer is preferably exposed to an atmosphere containing at least one of an oxygen radical and a hydroxy radical. For example, plasma treatment is preferably performed in an atmosphere containing one or both of oxygen and water vapor ($H_2O$).

Alternatively, it is preferable that the metal oxide layer 20 be formed and radical treatment be performed on the surface of the metal oxide layer 20. In the radical treatment, the surface of the metal oxide layer 20 is preferably exposed to an atmosphere containing at least one kind among an oxygen radical, a hydrogen radical, and a hydroxy radical. For example, plasma treatment is preferably performed in an atmosphere containing one or more of oxygen, hydrogen, and water vapor ($H_2O$).

The radical treatment can be performed with a plasma generation apparatus or an ozone generation apparatus.

For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor ($H_2O$). In particular, water plasma treatment is preferable because it makes a large amount of moisture be contained on the surface of the metal oxide layer 20 or in the metal oxide layer 20.

Plasma treatment may be performed in an atmosphere containing two or more kinds among oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. The use of an argon gas for one of gasses of the plasma treatment is favorable because the plasma treatment can be performed with the metal layer or the metal oxide layer 20 being damaged.

Two or more kinds of plasma treatment may be performed sequentially without exposure to the air. For example, water plasma treatment may be performed after argon plasma treatment is performed.

Figure 4:
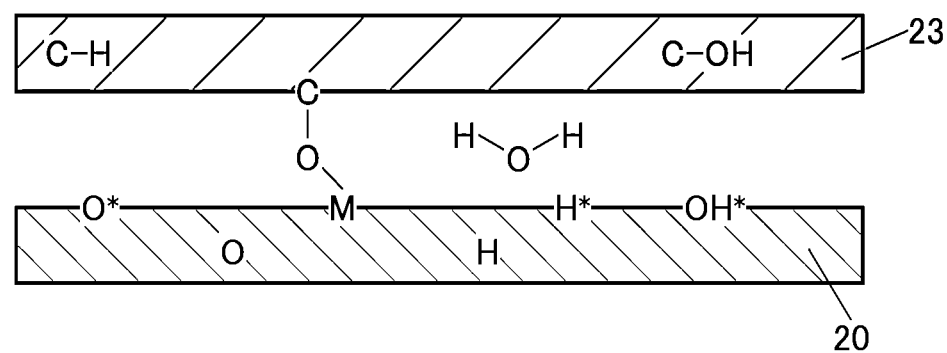
FIG. 4 A schematic diagram illustrating an example of an interface between a metal oxide layer and a resin layer.

Thus, hydrogen, oxygen, a hydrogen radical (H*), an oxygen radical (O*), a hydroxy radical (OH*), and the like can be contained on the surface of the metal oxide layer 20 or in the metal oxide layer 20 as illustrated in FIG. 4. Furthermore, in the example illustrated in FIG. 4, the resin layer 23 contains hydrogen H and a hydroxyl group OH which are bonded to carbon C. These are probably changed into $H_2O$ by being heated by heat treatment or light irradiation.

The light irradiation can be performed with a lamp, a laser apparatus, or the like.

The laser light irradiation is preferably performed with a linear laser apparatus. Laser apparatuses for the manufacturing lines for low temperature polysilicon (LTPS) and the like can be used, which enables effective use of the apparatuses. The linear laser condenses light in a long rectangular shape (is shaped into a linear laser beam) and the interface between the metal oxide layer and the resin layer is irradiated with light.

The irradiation with the light is preferably performed such that a wavelength range includes greater than or equal to 180 nm and less than or equal to 450 nm. Further preferably, the irradiation with the light is preferably performed such that a wavelength range includes 308 nm or around 308 nm.

The energy density of the light is preferably greater than or equal to 250 mJ/cm$^2$ and less than or equal to 400 mJ/cm$^2$, further preferably greater than or equal to 250 mJ/cm$^2$ and less than or equal to 360 mJ/cm$^2$.

In the case where the light irradiation is performed with a laser apparatus, the number of shots of laser light with which the same portion is irradiated can be greater than or equal to 1 shot and less than or equal to 50 shots, preferably greater than 1 shot and less than or equal to 10 shots, further preferably greater than 1 shot and less than or equal to 5 shots.

There are portions with low light intensity on both ends of the short axis of the beam. Accordingly, it is preferable that between one shot and the next shot be provided with a portion overlapping by greater than or equal to the width of the portion with low light intensity. Therefore, the number of laser light shots is preferably greater than or equal to 1.1 shots, further preferably greater than or equal to 1.25 shots.

Note that in this specification, the number of laser light shots refers to the number of times a point (region) is irradiated with laser light, and is determined by a beam width, scanning speed, a frequency, an overlap percentage, or the like. Furthermore, there is an overlapping portion between a pulse and another pulse when a linear beam is moved in a scanning direction, i.e., between one shot and the next shot, and the overlapping ratio is referred to as an overlap percentage. Note that as the overlap percentage becomes closer to 100%, the number of shots is increased; as the overlap percentage becomes further from 100%, the number of shots is decreased; and as the scanning speed becomes higher, the number of shots is decreased.

That the number of shots of the laser light is 1.1 shots means that there is an overlap with a width of approximately one-tenth of the beam between two successive shots, and can mean that the overlap percentage is 10%. Similarly, 1.25 shots mean that there is an overlap with a width of approximately one-fourth of the beam between two successive shots, and can mean that the overlap percentage is 25%.

Here, the energy density of light used for irradiation in the laser crystallization step of LTPS is high, e.g., greater than or equal to 350 mJ/cm$^2$ and less than or equal to 400 mJ/cm$^2$. Furthermore, the number of laser shots needs to be large, e.g., greater than or equal to 10 shots and less than or equal to 100 shots.

Meanwhile, in this embodiment, light irradiation for separating the metal oxide layer and the resin layer 23 from each other can be performed at a lower energy density or with a smaller number of shots than that under the condition used in the laser crystallization step. Accordingly, the number of substrates which can be treated by a laser apparatus can be increased. Furthermore, a reduction in the running costs of a laser apparatus such as a reduction in the frequency of maintenance of the laser apparatus is possible. Consequently, the manufacturing costs of display devices and the like can be reduced.

Furthermore, since the light irradiation is performed at a lower energy density or with a smaller number of shots than that under the condition used in the laser crystallization step, damage to the substrate caused by the laser light irradiation can be reduced. Thus, the strength of the substrate is less likely to be reduced after the substrate is used once, and the substrate can be reused. Consequently, the costs can be reduced.

In this embodiment, the metal oxide layer 20 is placed between the formation substrate 14 and the resin layer 23. With the use of the metal oxide layer 20, in some cases, the light irradiation can be performed at a lower energy density or with a smaller number of shots than that in the case where the metal oxide layer 20 is not used.

If a foreign matter such as dust is adhered to the light irradiation surface of the formation substrate at the time of the light irradiation through the formation substrate, in some cases, nonuniformity occurs in the light irradiation and part with low peelability is generated, leading to a reduction in the yield of the step of separating the metal oxide layer and the resin layer from each other. For that reason, it is preferable that the light irradiation surface be cleaned before or during the light irradiation. For example, the light irradiation surface of the formation substrate can be cleaned with an organic solvent such as acetone, water, or the like. Furthermore, the light irradiation may be performed while a gas is sprayed with an air knife. Thus, nonuniformity in the light irradiation can be reduced and the yield of the separation can be increased.

Alternatively, first, the metal oxide layer is formed over the substrate in this embodiment. Then, the resin layer is formed over the metal oxide layer. Next, an insulating layer covering an end portion of the resin layer is formed over the substrate and the resin layer. Then, a transistor including a metal oxide in a channel formation region is formed over the resin layer with the insulating layer positioned therebetween. Next, the interface between the metal oxide layer and the resin layer or the vicinity thereof is irradiated with light. Next, at least part of the resin layer is separated from the metal oxide layer, whereby a separation trigger is formed. Then, the metal oxide layer and the resin layer are separated from each other.

Over the substrate are provided a portion in contact with the resin layer and a portion in contact with the insulating layer. The insulating layer is provided to cover the end portion of the resin layer. The insulating layer has higher adhesion or adhesiveness to the metal oxide layer than the resin layer does. When the insulating layer is provided to cover the end portion of the resin layer, unintended peeling of the resin layer from the substrate after the light irradiation can be suppressed. For example, peeling of the resin layer when the substrate is transferred from the laser apparatus to another place can be suppressed. In addition, the formation of the separation trigger enables the metal oxide layer and the resin layer to be separated from each other at desired timing. In other words, in this embodiment, the timing of the separation between the metal oxide layer and the resin layer can be controlled, and the force required for the separation is small. This can increase the yield of the process for separating the metal oxide layer and the resin layer from each other and that of the manufacturing process of a display device.

In the display device of this embodiment, the channel formation region of the transistor preferably includes a metal oxide. A metal oxide can function as an oxide semiconductor.

In the case where low temperature polysilicon (LTPS) is used for a channel formation region of a transistor, the resin layer is required to have heat resistance because a temperature of approximately 500° C. to 550° C. needs to be applied. Furthermore, in some cases, the resin layer is required to have a larger thickness to relieve the damage in a laser crystallization step.

In contrast, a transistor including a metal oxide in a channel formation region can be formed at a temperature lower than or equal to 350° C., or even lower than or equal to 300° C. Thus, the resin layer is not required to have high heat resistance. Accordingly, the upper temperature limit of the resin layer can be low, widening the range of choices for materials.

Furthermore, the transistor including a metal oxide in the channel formation region does not need a laser crystallization step. Furthermore, in this embodiment, the light irradiation can be performed at a lower energy density or a smaller number of shots than that under the condition used in the laser crystallization step. Furthermore, the resin layer is irradiated with the laser light without through the substrate in the laser crystallization step, whereas the resin layer is irradiated with the laser light through the formation substrate and the metal oxide layer in this embodiment. Since damage to the resin layer is low as described above, the resin layer can be thin. Since the resin layer is not required to have high heat resistance and can be thinned, the manufacturing cost of a device can be expected to significantly fall. In addition, as compared with the case of using LTPS, the steps can be simplified, which is preferable.

Note that the display device of one embodiment of the present invention is not limited to the structure in which the transistor includes a metal oxide in the channel formation region. For example, in the display device of this embodiment, the transistor can include silicon in the channel formation region. As silicon, amorphous silicon or crystalline silicon can be used. As crystalline silicon, microcrystalline silicon, polycrystalline silicon, single crystal silicon, and the like can be given.

LTPS is preferably used for the channel formation region. Polycrystalline silicon, e.g., LTPS, can be formed at a lower temperature than single crystal silicon and has higher field effect mobility and higher reliability than amorphous silicon.

The resin layer 23 may have a thickness greater than or equal to 0.1 µm and less than or equal to 5 µm. When the resin layer 23 is formed to be thin, the display device can be manufactured at low costs. In addition, the display device can be lightweight and thin. Furthermore, the display device can have higher flexibility.

The visible-light-transmitting property of the resin layer 23 is not particularly limited. For example, the resin layer 23 may be a layer having a color or a transparent layer. When the resin layer 23 is positioned on the display surface side of the display device and the resin layer 23 is colored (has a color), a problem such as a reduced light extraction efficiency, a change in the color of the extracted light, or reduced display quality might occur.

The resin layer 23 can be removed with a wet etching apparatus, a dry etching apparatus, an ashing apparatus, or the like. In particular, removing the resin layer 23 by ashing using oxygen plasma is favorable.

In this embodiment, the metal oxide layer 20 is provided between the formation substrate 14 and the resin layer 23. Since the metal oxide layer 20 has a function of absorbing light, the effect of light irradiation can be obtained even when the resin layer 23 has low light absorptance. Accordingly, the resin layer 23 having high visible-light transmittance can be used. Therefore, even when the resin layer 23 is located on the display surface side of the display device, high display quality can be obtained. Moreover, a step of removing the resin layer 23 which is colored (has a color) to enhance the display quality can be omitted. In addition, the range of choices for the material of the resin layer 23 is widened.

The average value of the transmittance of light with a wavelength greater than or equal to 450 nm and less than or equal to 700 nm of the resin layer 23 is preferably higher than or equal to 70% and lower than or equal to 100%, further preferably higher than or equal to 80% and lower than or equal to 100%, still further preferably higher than or equal to 90% and lower than or equal to 100%.

In this embodiment, the transistor or the like is formed at a temperature lower than or equal to the upper temperature limit of the resin layer. The heat resistance of the resin layer can be evaluated by, for example, heat-induced weight loss percentage, specifically, 5% weight loss temperature. In the peeling method of this embodiment and the manufacturing method of a display device of this embodiment, the maximum temperature in the process can be low. For example, in this embodiment, the 5% weight loss temperature of the resin layer can be higher than or equal to 200° C. and lower than or equal to 650° C., higher than or equal to 200° C. and lower than or equal to 500° C., higher than or equal to 200° C. and lower than or equal to 400° C., or higher than or equal to 200° C. and lower than or equal to 350° C. Thus, the range of choices for materials is widened. Note that the 5% weight loss temperature of the resin layer may be higher than 650° C.

Before or during the separation, a water-containing liquid is preferably fed to the separation interface. Water present at the separation interface further reduces adhesion or adhesiveness between the resin layer 23 and the metal oxide layer 20 and can reduce the force required for the separation. Furthermore, feeding a water-containing liquid to the separation interface sometimes weakens or cuts a bond between the resin layer 23 and the metal oxide layer 20. A chemical bond with the liquid is utilized to cut a bond between the resin layer 23 and the metal oxide layer 20, which allows the separation to proceed. For example, in the case where a hydrogen bond is formed between the resin layer 23 and the metal oxide layer 20, it can be assumed that feeding the water-containing liquid forms a hydrogen bond between the water and the resin layer 23 or the metal oxide layer 20 to cut the hydrogen bond between the resin layer 23 and the metal oxide layer 20.

The metal oxide layer 20 preferably has low surface tension and high wettability with respect to a water-containing liquid. In that case, the water-containing liquid can be distributed over the entire surface of the metal oxide layer 20 and can be easily fed to the separation interface. Distribution of the water over the entire metal oxide layer 20 leads to uniform peeling.

The contact angle between the metal oxide layer 20 and the water-containing liquid is preferably greater than 0° and less than or equal to 60°, further preferably greater than 0° and less than or equal to 50°. Note that when the wettability with respect to the water-containing liquid is extremely high (e.g., when the contact angle is approximately 20° or less), it is sometimes difficult to obtain an accurate value of the contact angle. The higher the wettability of the metal oxide layer 20 with respect to the water-containing liquid, the better; therefore, the wettability with respect to the water-containing liquid may be high enough to prevent an accurate value of the contact angle from being obtained.

The water-containing liquid present at the separation interface can inhibit an adverse effect of static electricity that is caused at the time of separation on a functional element included in a layer to be peeled (e.g., breakage of a semiconductor element due to static electricity). Furthermore, static electricity on a surface of the layer to be peeled which is exposed by the separation may be removed with an ionizer or the like.

In the case where a liquid is fed to the separation interface, the surface of the layer to be peeled which is exposed by the separation may be dried.

The manufacturing method of the display device of this embodiment will be specifically described below.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

Thin films included in the display device (e.g., insulating films, semiconductor films, or conductive films) can be formed by a method such as spin coating, dipping, spray coating, ink-jetting, dispensing, screen printing, offset printing, a doctor knife, slit coating, roll coating, curtain coating, or knife coating.

When thin films that form the display device are processed, a lithography method or the like can be used for the processing. Alternatively, island-shaped thin films may be formed by a film formation method using a blocking mask. Alternatively, a nanoimprinting method, a sandblasting method, a lift-off method, or the like may be used for the processing of thin films. As a photolithography method, there are a method in which a resist mask is formed over a thin film to be processed, the thin film is processed by etching or the like, and the resist mask is removed, and a method in which a photosensitive thin film is formed, and then exposed to light and developed to be processed into a desired shape.

In the case of using light in the lithography method, any of an i-line (a wavelength of 365 nm), a g-line (a wavelength of 436 nm), and an h-line (a wavelength of 405 nm), or combined light of any of them can be used for light exposure. Besides, ultraviolet light, KrF laser light, ArF laser light, or the like can be used. Furthermore, light exposure may be performed by liquid immersion light exposure technique. Furthermore, as the light used for the light exposure, extreme ultra-violet light (EUV) or X-rays may be used. Furthermore, instead of the light used for the light exposure, an electron beam can also be used. It is preferable to use extreme ultra-violet light, X-rays, or an electron beam because extremely minute processing can be performed. Note that in the case of performing light exposure by scanning of a beam such as an electron beam, a photomask is not needed.

For etching of thin films, a dry etching method, a wet etching method, a sandblast method, or the like can be used.

[Peeling Method]

First, the metal oxide layer 20 is formed over the formation substrate 14 (FIG. 5(A1)). Alternatively, a metal layer 19 and the metal oxide layer 20 are stacked over the formation substrate 14 (FIG. 5(A2)).

The formation substrate 14 has rigidity high enough for easy transfer and has heat resistance to the temperature applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

As described above, a base layer is formed between the formation substrate 14 and the resin layer 23 in this embodiment. The base layer has lower adhesion (adhesiveness) to the resin layer 23 than the formation substrate 14 does. Although the metal oxide layer 20 is used in an example described in this embodiment, one embodiment of the present invention is not limited to this example.

Specifically, the base layer can be a layer that includes one or more of titanium, molybdenum, aluminum, tungsten, silicon, indium, zinc, gallium, tantalum, tin, hafnium, yttrium, zirconium, magnesium, lanthanum, cerium, neodymium, bismuth, and niobium. The base layer can contain a metal, an alloy, and a compound thereof (e.g., a metal oxide). The base layer preferably includes one or more of titanium, molybdenum, aluminum, tungsten, silicon, indium, zinc, gallium, tantalum, and tin.

Furthermore, the material for the base layer is not limited to an inorganic material and may be an organic material. For example, a variety of organic materials that can be used for an EL layer of an organic EL element may be used. An evaporation film of such an organic material can be used as the base layer. In that case, a film with low adhesion can be formed.

For the metal layer 19, a variety of metals and alloys can be used, for example.

For the metal oxide layer 20, oxides of a variety of metals can be used. As examples of the metal oxides, titanium oxide ($TiO_x$), molybdenum oxide, aluminum oxide, tungsten oxide, indium tin oxide containing silicon (ITSO), indium zinc oxide, an In—Ga—Zn oxide, and the like can be given.

Besides, as the metal oxides, indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, niobate, and the like can be given.

There is no particular limitation on a method for forming the metal oxide layer 20. For example, the metal oxide layer 20 can be formed by a sputtering method, a plasma-enhanced CVD method, an evaporation method, a sol-gel method, an electrophoretic method, a spray method, or the like.

The metal oxide layer 20 can be formed in such a manner that a metal layer is formed and then oxygen is introduced into the metal layer. At this time, only a surface of the metal layer or the entire metal layer is oxidized. In the former case, the introduction of oxygen into the metal layer forms a structure in which the metal layer 19 and the metal oxide layer 20 are stacked (FIG. 5(A2)).

The oxidation of the metal layer can be performed, for example, by heating the metal layer in an oxygen-containing atmosphere. It is preferable that the metal layer be heated while an oxygen-containing gas is supplied. The temperature at which the metal layer is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer is heated is preferably set to lower than or equal to the maximum temperature in manufacturing the transistor. In that case, the maximum temperature in manufacturing the display device can be prevented from increasing. When the temperature at which the metal layer is heated is set to lower than or equal to the maximum temperature in manufacturing the transistor, a manufacturing apparatus for the manufacturing process of the transistor, for example, can also be utilized, which can reduce additional capital investment and the like. As a result, the display device with reduced manufacturing costs can be obtained. When the formation temperature of the transistor is up to 350° C., for example, the temperature of the heat treatment is preferably lower than or equal to 350° C.

Alternatively, the metal layer can be oxidized by performing radical treatment on the surface of the metal layer. In the radical treatment, the surface of the metal layer is preferably exposed to an atmosphere containing at least one of an oxygen radical and a hydroxy radical. For example, plasma treatment is preferably performed in an atmosphere containing one or both of oxygen and water vapor ($H_2O$).

As described above, the force required for the separation of the metal oxide layer 20 and the resin layer 23 from each other can be reduced when hydrogen, oxygen, a hydrogen radical (H*), an oxygen radical (O*), a hydroxy radical (OH*), or the like is contained on the surface of the metal oxide layer 20 or in the metal oxide layer 20. This also means that performing radical treatment or plasma treatment for the formation of the metal oxide layer is favorable.

Performing radical treatment or plasma treatment on the surface of the metal layer to oxidize the metal layer eliminates the need for a step of heating the metal layer at high temperatures. Accordingly, the maximum temperature in manufacturing the display device can be prevented from increasing.

Alternatively, the metal oxide layer 20 can be formed in an oxygen atmosphere. For example, a metal oxide film is formed by a sputtering method while an oxygen-containing gas is supplied, whereby the metal oxide layer 20 can be formed. Also in this case, the surface of the metal oxide layer 20 is preferably subjected to radical treatment. In the radical treatment, the surface of the metal oxide layer 20 is preferably exposed to an atmosphere containing at least one kind among an oxygen radical, a hydrogen radical, and a hydroxy radical. For example, plasma treatment is preferably performed in an atmosphere containing one or more of oxygen, hydrogen, and water vapor ($H_2O$).

For details of the radical treatment, the above description can be referred to.

As other introduction methods of oxygen, hydrogen, water, or the like, an ion implantation method, an ion doping method, a plasma immersion ion implantation method, and the like can be given.

The metal layer 19 preferably has a thickness greater than or equal to 1 nm and less than or equal to 100 nm, further preferably greater than or equal to 1 nm and less than or equal to 50 nm, still further preferably greater than or equal to 1 nm and less than or equal to nm.

The metal oxide layer 20 preferably has a thickness of, for example, greater than or equal to 1 nm and less than or equal to 200 nm, further preferably greater than or equal to 5 nm and less than or equal to 100 nm, still further preferably greater than or equal to 5 nm and less than or equal to 50 nm. Note that in the case where the metal oxide layer 20 is formed using the metal layer, the completed metal oxide layer 20 is sometimes thicker than the formed metal layer.

The force required for the separation can be reduced by feeding a water-containing liquid to the interface between the metal oxide layer 20 and the resin layer 23 before or during the separation. The smaller the contact angle between the metal oxide layer 20 and the liquid is, the more effective the liquid feeding is. Specifically, the contact angle between the metal oxide layer 20 and the water-containing liquid is preferably greater than 0° and less than or equal to 60°, further preferably greater than 0° and less than or equal to 50°.

Titanium oxide, tungsten oxide, or the like is suitable for the metal oxide layer 20. Titanium oxide is preferably used because the costs can be lower than that when tungsten oxide is used.

Next, a first layer 24 is formed over the metal oxide layer 20 (FIG. 5(B)).

FIG. 5(B) illustrates an example in which the first layer 24 is formed over the entire surface of the metal oxide layer 20 by a coating method. One embodiment of the present invention is not limited to this example and a printing method or the like may be employed to form the first layer 24. The first layer 24 having an island-like shape, the first layer 24 having an opening or an unevenness shape, or the like may be formed over the metal oxide layer 20.

A variety of resin materials (including resin precursors) can be used to form the first layer 24.

The first layer 24 is preferably formed using a thermosetting material.

The first layer 24 may be formed using a material with photosensitivity or a material without photosensitivity (also called a non-photosensitive material).

When a photosensitive material is used, the resin layer 23 can be formed to have a desired shape by removing part of the first layer 24 by a lithography method using light.

The first layer 24 is preferably formed using a material containing a polyimide resin or a polyimide resin precursor. The first layer 24 can be formed using, for example, a material containing a polyimide resin and a solvent, a material containing a polyamic acid and a solvent, or the like. Polyimide is a material suitably used for a planarization film or the like of a display device, and thus, the film formation apparatus and the material can be shared. Thus, another apparatus and another material are not needed for obtaining the structure of one embodiment of the present invention.

Specifically, the resin layer 23 preferably contains a residue of a compound represented by Structural Formula (100) (an oxydiphthalic acid).

[Chemical 2]

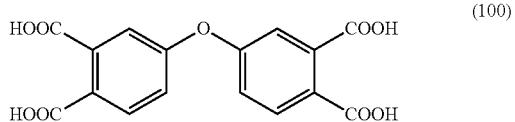

(100)

A polyimide resin obtained using an acid component including an oxydiphthalic acid or an oxydiphthalic acid derivative and an amine component including an aromatic amine or an aromatic amine derivative is suitable for the resin layer 23. Examples of the oxydiphthalic acid derivative include an oxydiphthalic anhydride. Furthermore, the resin layer 23 may contain fluorine. In the case where the resin layer 23 contains fluorine, a hydrogen bond between the metal oxide layer 20 and the resin layer 23 is sometimes formed using the fluorine.

Other examples of resin materials which can be used to form the first layer 24 include an acrylic resin, an epoxy resin, a polyamide resin, a polyimide-amide resin, a siloxane resin, a benzocyclobutene-based resin, a phenol resin, and precursors of these resins.

The first layer 24 is preferably formed with a spin coater. With the use of a spin coating method, a thin film can be uniformly formed over a large-sized substrate.

The first layer 24 is preferably formed using a solution having a viscosity greater than or equal to 5 cP and less than 500 cP, further preferably greater than or equal to 5 cP and less than 100 cP, still further preferably greater than or equal to 10 cP and less than or equal to 50 cP. As the viscosity of the solution is lower, application is performed more easily. In addition, as the viscosity of the solution is lower, inclusion of air bubbles can be reduced more; thus, a high-quality film can be formed.

Alternatively, the first layer 24 can be formed by dipping, spray coating, ink-jetting, dispensing, screen printing, offset printing, a doctor knife, slit coating, roll coating, curtain coating, or knife coating, for example.

Next, heat treatment is performed on the first layer 24, so that the resin layer 23 is formed (FIG. 5(C)).

The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

When heating is performed in an air atmosphere or performed while a gas containing oxygen is supplied, the resin layer 23 is sometimes colored by oxidation to have a decreased visible-light-transmitting property.

For that reason, heating is preferably performed while a nitrogen gas is supplied. Thus, the visible-light-transmitting property of the resin layer 23 can be increased.

By the heat treatment, gas components to be released (e.g., hydrogen, water, or the like) in the resin layer 23 can be reduced. In particular, the heating is preferably performed at a temperature higher than or equal to the formation temperature of each layer formed over the resin layer 23. Thus, a gas released from the resin layer 23 in the manufacturing process of the transistor can be significantly reduced.

For example, in the case where the formation temperature of the transistor is up to 350° C., a film to be the resin layer 23 is preferably heated at a temperature higher than or equal to 350° C. and lower than or equal to 450° C., further preferably lower than or equal to 400° C., still further preferably lower than or equal to 375° C. Thus, a gas released from the resin layer 23 in the manufacturing process of the transistor can be significantly reduced.

The temperature of the heat treatment is preferably set to lower than or equal to the maximum temperature in manufacturing the transistor. When the temperature of the heat treatment is set to lower than or equal to the maximum temperature in manufacturing the transistor, a manufacturing apparatus for the manufacturing process of the transistor, for example, can also be utilized, which can reduce additional capital investment and the like. As a result, the display device with reduced manufacturing costs can be obtained. When the formation temperature of the transistor is up to 350° C., for example, the temperature of the heat treatment is preferably lower than or equal to 350° C.

The maximum temperature in manufacturing the transistor is preferably equal to the temperature of the heat treatment, in which case it is possible to prevent the heat treatment from increasing the maximum temperature in manufacturing the display device and it is also possible to reduce the gas components to be released in the resin layer 23.

Even when the heating temperature is relatively low, increasing the treatment time sometimes achieves separability equivalent to that under a condition with a higher heating temperature. It is thus preferable to increase the treatment time when the heating temperature cannot be increased owing to the structure of the heating apparatus.

The duration of the heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the heat treatment is not limited thereto. For example, the duration of the heat treatment may be shorter than five minutes in the case where the heat treatment is performed by an RTA (Rapid Thermal Annealing) method.

As the heating apparatus, it is possible to use a variety of apparatuses such as an electric furnace and an apparatus for heating an object by heat conduction or heat radiation from a heating element such as a resistance heating element. For example, an RTA apparatus such as a GRTA (Gas Rapid Thermal Anneal) apparatus or an LRTA (Lamp Rapid Thermal Anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment by using a high-temperature gas. With an RTA apparatus, the treatment time can be shortened and thus the RTA apparatus is preferred for mass production. Furthermore, the heat treatment may be performed using an in-line heating apparatus.

Note that the heat treatment sometimes changes the thickness of the resin layer 23 from the thickness of the first layer 24. For example, in some cases, the volume decreases when the solvent that was contained in the first layer 24 is removed or when the density increases with proceeding curing, which makes the thickness of the resin layer 23 smaller than that of the first layer 24.

Before the heat treatment, heat treatment (also referred to as prebaking treatment) for removing the solvent contained in the first layer 24 may be performed. The temperature of the prebaking treatment can be set as appropriate according to the material that is used. For example, it can be higher than or equal to 50° C. and lower than or equal to 180° C., higher than or equal to 80° C. and lower than or equal to 150° C., or higher than or equal to 90° C. and lower than or equal to 120° C. Alternatively, the heat treatment may double as the prebaking treatment, and the solvent contained in the first layer 24 may be removed by the heat treatment.

The resin layer 23 has flexibility. The formation substrate 14 has lower flexibility than the resin layer 23 does.

The resin layer 23 preferably has a thickness greater than or equal to 0.01 μm and less than 10 μm, further preferably greater than or equal to 0.1 μm and less than or equal to 5 μm, still further preferably greater than or equal to 0.5 μm and less than or equal to 3 μm. By forming the resin layer thin, the display device can be manufactured at low costs. Furthermore, the display device can be lightweight and thin. Furthermore, the display device can have higher flexibility. With a solution having low viscosity, the resin layer 23 having a small thickness can be easily formed. Note that the thickness of the resin layer 23 is not limited thereto, and may be greater than or equal to 10 μm. For example, the resin layer 23 may have a thickness greater than or equal to 10 μm and less than or equal to 200 μm. The resin layer 23 having a thickness greater than or equal to 10 μm is favorable because the rigidity of the display device can be increased.

The resin layer 23 preferably has a thermal expansion coefficient greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 23 is, the more the generation of a crack in a layer included in a transistor or the like and breakage of a transistor or the like which are caused owing to the heating can be prevented.

Next, a layer 25 to be peeled is formed over the resin layer 23 (FIG. 5(D)).

An insulating layer or a functional element (e.g., a transistor or a display element), for example, can be provided as the layer 25 to be peeled.

The layer 25 to be peeled preferably includes an insulating layer. The insulating layer preferably has a function of blocking hydrogen, oxygen, and water that are released from the metal oxide layer 20, the resin layer 23, and the like in a later heating step.

The layer to be peeled preferably includes, for example, a silicon nitride film, a silicon oxynitride film, or a silicon nitride oxide film. For example, a silicon nitride film is formed by a plasma-enhanced CVD method using a deposition gas containing a silane gas, a hydrogen gas, and an ammonia ($NH_3$) gas. There are no particular limitations on the thickness of the insulating layer. The thickness can be, for example, greater than or equal to 50 nm and less than or equal to 600 nm, preferably greater than or equal to 100 nm and less than or equal to 300 nm.

Note that in this specification and the like, "silicon oxynitride" is a material that contains more oxygen than nitrogen in its composition. Moreover, in this specification and the like, "silicon nitride oxide" is a material that contains more nitrogen than oxygen in its composition.

Next, a protective layer is formed over the layer 25 to be peeled. The protective layer is a layer positioned on the outermost surface of the display device. The protective layer preferably has a high visible-light-transmitting property. The protective layer preferably includes an organic insulating film because it is possible to prevent the surface of the display device from being damaged or cracked.

FIG. 5(D) illustrates an example in which a substrate 75a is bonded onto the layer 25 to be peeled, with the use of an adhesive layer 75b.

For the adhesive layer 75b, a variety of curable adhesives such as a reactive curable adhesive, a thermosetting adhesive, an anaerobic adhesive, and a photocurable adhesive such as an ultraviolet curable adhesive can be used. Furthermore, an adhesive sheet or the like may be used.

For the substrate 75a, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used. For the substrate 75a, a variety of materials such as glass, quartz, a resin, a metal, an alloy, and a semiconductor that are thin enough to be flexible may be used.

Figure 6A:
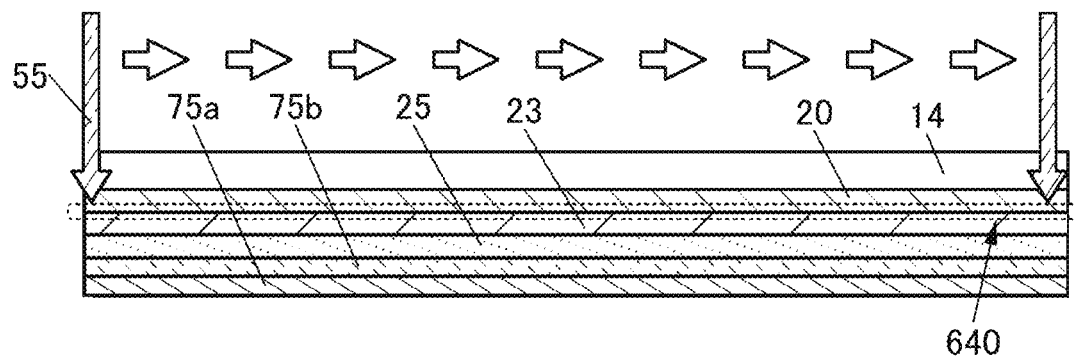
FIGS. 6A-B2 Cross-sectional views illustrating an example of a manufacturing method of a display device.

Next, the irradiation with the laser light 55 is performed (FIG. 6(A)). The laser light 55 is, for example, a linear laser beam with which scanning is performed from the left side to the right side in FIG. 6(A), and the major axis is perpendicular to the scanning direction and the incident direction (from top to bottom). In the laser apparatus, the stack is placed with the formation substrate 14 being on the upper side. The stack is irradiated with the laser light 55 from the upper side of the stack (the formation substrate 14).

The interface between the metal oxide layer 20 and the resin layer 23 or the vicinity thereof is preferably irradiated with the laser light 55 through the formation substrate 14 (see a processing region 640 in FIG. 6(A)). Furthermore, the inside of the metal oxide layer 20 may be irradiated with the laser light 55 or the inside of the resin layer 23 may be irradiated with the laser light 55.

The metal oxide layer 20 absorbs the laser light 55. The resin layer 23 may absorb the laser light 55.

The absorptance of the laser light 55 of the stacked-layer structure including the formation substrate 14 and the metal oxide layer 20 is preferably higher than or equal to 50% and lower than or equal to 100%, further preferably higher than or equal to 75% and lower than or equal to 100%, still further preferably higher than or equal to 80% and lower than or equal to 100%. Most of the laser light 55 is absorbed by the stacked-layer structure, so that peeling can be surely performed at the interface between the metal oxide layer and the resin layer 23. Furthermore, damage to the resin layer 23 due to light can be reduced.

The irradiation with the laser light 55 reduces adhesion or adhesiveness between the metal oxide layer 20 and the resin layer 23. The resin layer 23 is embrittled by the irradiation with the laser light 55 in some cases.

As the laser light 55, light having a wavelength at which at least part of the laser light 55 is transmitted through the formation substrate 14 and absorbed by the metal oxide layer 20 is selected and used. The laser light 55 is preferably light in a wavelength range from visible light to ultraviolet light. For example, light with a wavelength greater than or equal to 180 nm and less than or equal to 450 nm, preferably greater than or equal to 200 nm and less than or equal to 400 nm, further preferably greater than or equal to 250 nm and less than or equal to 350 nm, can be used.

The laser light 55 preferably has energy that is higher than the energy gap of the metal oxide layer 20. For example, the energy gap of titanium oxide is approximately 3.2 eV. Thus, in the case where titanium oxide is used for the metal oxide layer 20, light preferably has energy higher than 3.2 eV.

In particular, an excimer laser having a wavelength of 308 nm is preferably used because the productivity is high. The excimer laser is preferable because the excimer laser is used also for laser crystallization of LTPS, so that the existing LTPS manufacturing line apparatus can also be used and new capital investment is not necessary. The energy of the light with a wavelength of 308 nm is approximately 4.0 eV. That is, in the case where titanium oxide is used for the metal oxide layer 20, an excimer laser with a wavelength of 308 nm is favorable. Furthermore, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running costs can be reduced compared with those of an excimer laser. Furthermore, a pulsed laser such as a picosecond laser may be used.

In the case where linear laser light is used as the laser light 55, by relatively moving the formation substrate 14 and a light source, scanning with the laser light 55 is performed and the irradiation with the laser light 55 is performed across a region where peeling is desirably caused.

Figure 7A:
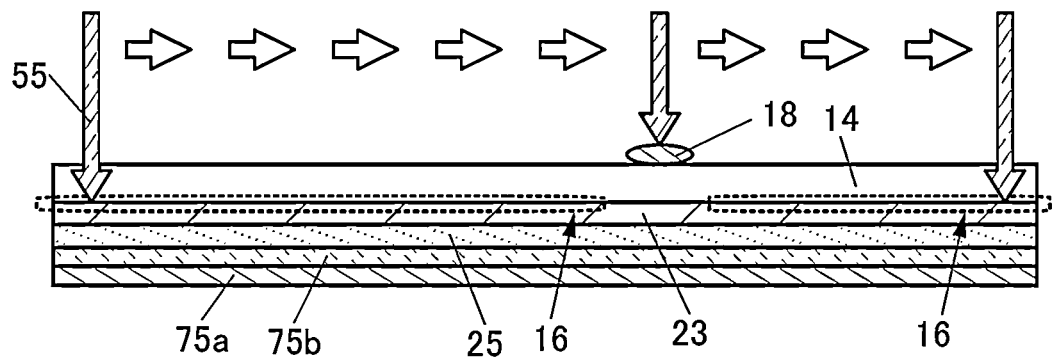
FIGS. 7A-B Cross-sectional views illustrating an example of a manufacturing method of a display device.

Here, when the foreign matter 18 such as dust is adhered to the light irradiation surface of the formation substrate 14, nonuniformity occurs in the light irradiation in some cases. FIG. 7(A) illustrates a comparative example where the resin layer 23 is formed over and in contact with the formation substrate 14. In FIG. 7(A), a region 16 irradiated with light is discontinuous in a portion directly below the foreign matter 18, at the interface between the formation substrate 14 and the resin layer 23 or in the vicinity thereof. That portion has lower peelability than the other portions, and thus, there is a concern that the yield of the step of separating the formation substrate 14 and the resin layer 23 is lowered.

Figure 7B:
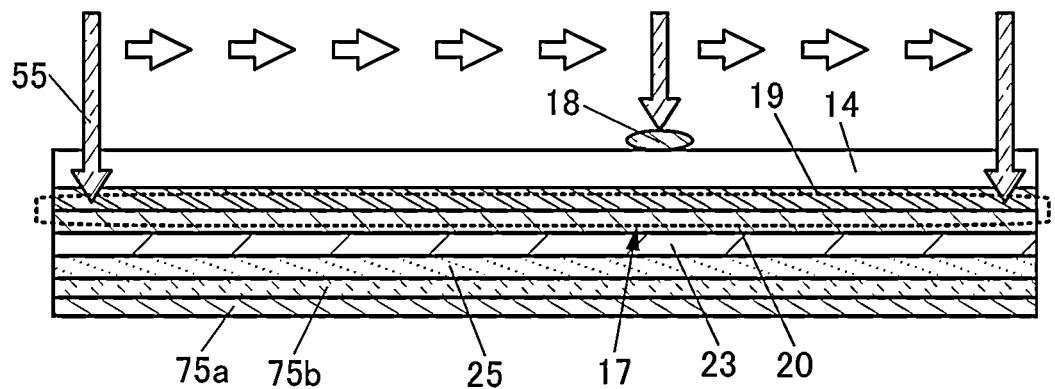

Meanwhile, in this embodiment, a base layer is formed between the formation substrate 14 and the resin layer 23. As the base layer, the metal layer 19, the metal oxide layer 20, a stack including the metal layer 19 and the metal oxide layer 20 illustrated in FIG. 7(B), or the like is given. The base layer preferably includes a layer having high thermal conductivity. For example, in the case where the metal layer 19 in FIG. 7(B) has high thermal conductivity, heat is uniformly conducted to the entire metal layer 19 owing to the heated metal layer 19 around the foreign matter 18 even when the foreign matter 18 is adhered to the light irradiation surface of the formation substrate 14. Heat is transferred to a portion of the metal layer 19 that is shielded by the foreign matter 18, so that formation of a portion having low peelability can be prevented. As illustrated in FIG. 7(B), at the interface between the metal layer 19 and the metal oxide layer 20 or in the vicinity thereof, a heated region 17 is formed on an entire surface including a portion directly below the foreign matter 18.

At the interface between the metal oxide layer 20 and the resin layer 23 or in the vicinity thereof, a region which is not irradiated with light may be provided in one place or a plurality of places. The areas of the regions which are not irradiated with light are not particularly limited and are each greater than or equal to 1 $\mu m^2$ and less than or equal to 1 $cm^2$, for example. The area of the region which is not irradiated with light may be less than or equal to 1 $\mu m^2$ or greater than or equal to 1 $cm^2$ in some cases.

Then, the formation substrate 14 and the resin layer 23 are separated from each other. Since the adhesion or adhesiveness between the metal oxide layer 20 and the resin layer 23 is low, the separation occurs at the interface between the metal oxide layer 20 and the resin layer 23 (FIG. 6(B1)). Furthermore, the separation occurs in the embrittled resin layer 23 in some cases.

The formation substrate 14 and the resin layer 23 can be separated from each other by applying a perpendicular tensile force to the resin layer 23, for example. Specifically, part of a top surface of the substrate 75a is suctioned and pulled up, whereby the resin layer 23 can be peeled from the formation substrate 14.

Figure 6A:
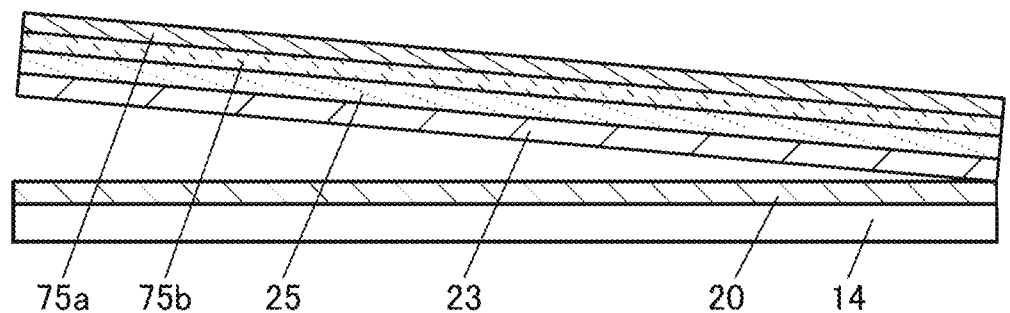
Figure 6A:
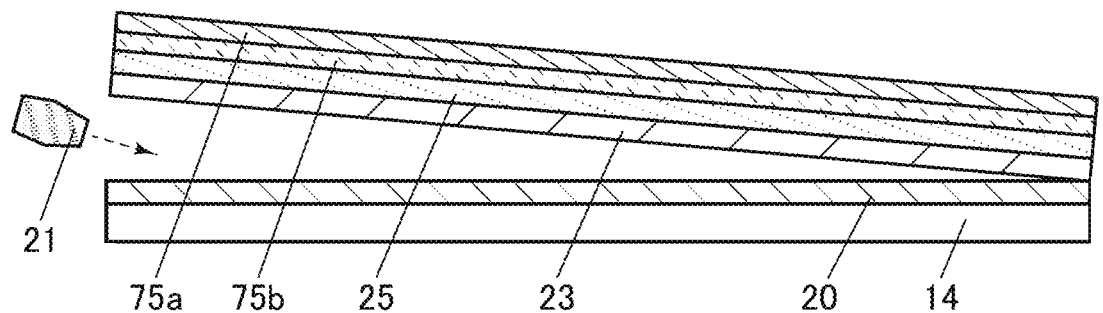

Here, if the separation is performed in such a manner that a water-containing liquid such as water or an aqueous solution is added to the separation interface and the liquid penetrates into the separation interface during the separation, the separation can be performed easily. Furthermore, an adverse effect of static electricity caused during the separation on the functional element such as a transistor (e.g., breakage of a semiconductor element by static electricity) can be suppressed. FIG. 6(B2) illustrates an example in which a liquid is fed to the separation interface with a liquid feeding mechanism 21.

As the liquid to be fed, water (preferably pure water), a neutral, alkaline, or acidic aqueous solution, and an aqueous solution in which a salt is dissolved can be given. Furthermore, ethanol, acetone, and the like can be given. Furthermore, a variety of organic solvents may also be used.

Before the separation, a separation trigger may be formed by separating part of the resin layer 23 from the formation substrate 14. For example, the separation trigger may be formed by inserting a sharp instrument such as a knife between the formation substrate 14 and the resin layer 23. Alternatively, the separation trigger may be formed by cutting the resin layer 23 from the substrate 75a side with a sharp instrument. Alternatively, the separation trigger may be formed by a method using a laser, such as a laser ablation method.

In this embodiment, the metal oxide layer 20 and the resin layer 23 are stacked and irradiated with light. As a result, the adhesion or adhesiveness between the metal oxide layer 20 and the resin layer 23 can be lowered. Accordingly, the formation substrate 14 and the resin layer 23 can be easily separated from each other.

The use of the peeling method of this embodiment makes it possible to provide a manufacturing method of a semiconductor device or a peeling method each having a low cost and a high mass productivity. In addition, the use of the cleaning method of a substrate of this embodiment makes it possible to clean or retreat the formation substrate 14 after separation. For example, since the formation substrate 14 (e.g., a glass substrate) or a stack including the formation substrate 14 and the metal oxide layer 20 can be repeatedly used multiple times in the peeling method of this embodiment, the manufacturing costs can be reduced.

[Cleaning Method and Cleaning Apparatus]

Next, examples of a cleaning apparatus and a cleaning method of a substrate will be described with reference to FIG. 8 and FIG. 9. Here, the method for cleaning the formation substrate 14 used in the above-described peeling method is described as an example.

As illustrated in FIGS. 8(A1) and (A2), the metal oxide layer 20 remains over the formation substrate 14 from which the substrate 75a (see FIG. 6(B1) or the like) is separated. Furthermore, the resin layer 23 remains over the metal oxide layer 20 in some cases. FIG. 8(A1) illustrates an example in which the resin layer 23 partly remains over the metal oxide layer 20. FIG. 8(A2) illustrates an example in which the resin layer 23 in a film form remains on the metal oxide layer 20.

Next, as illustrated in FIG. 8(B), at least part of the resin layer 23 is removed. FIG. 8(B) illustrates an example in which the resin layer 23 is removed by ashing using oxygen plasma 50. Note that at least part of the metal oxide layer 20 may be removed.

Examples of a method that can be used for removal of at least one of the resin layer 23 and the metal oxide layer 20 include etching, ashing, cleaning, and polishing. Alternatively, plasma treatment, light irradiation treatment, or the like may be performed.

As an etching method, a wet etching method, a dry etching method, a sandblast method, and the like can be given.

As a dry etching method, for example, a reactive ion etching (RIE) method, an ICP etching method, an electron cyclotron resonance (ECR) etching method, a parallel plate type (capacitive coupled type) etching method, a magnetron plasma etching method, a dual-frequency plasma etching method, a helicon wave plasma etching method, and the like can be given.

The ashing using oxygen plasma is particularly favorable in removing the organic material such as a resin.

As cleaning, ultrasonic cleaning such as megasonic cleaning, two-fluid jet cleaning, and the like can be given.

Furthermore, cleaning can be performed using hydrofluoric acid, alkali, pure water, ozone water, or the like.

Polishing can be performed by, for example, a chemical mechanical polishing method (CMP).

For the light irradiation treatment, a laser, a lamp, or the like can be used, for example. In the light irradiation treatment, ultraviolet light irradiation can be performed, for example.

Furthermore, UV ozone treatment may be performed.

In the above manner, the resin layer 23 can be removed as illustrated in FIG. 8(C1). Furthermore, as illustrated in FIG. 8(C2), part of the metal oxide layer 20 is removed and thinned in some cases. Furthermore, depending on the treatment, the metal oxide layer 20 is removed and the surface of the substrate 14 is exposed in some cases.

When a variety of devices are manufactured using the stack illustrated in FIG. 8(C1) or FIG. 8(C2), it is possible to reuse the formation substrate 14, as well as the metal oxide layer 20. Consequently, costs can be reduced. For example, the stack can be used in the above-described peeling method. Specifically, without performing the step for forming the metal oxide layer 20 in FIG. 5(A1), the first layer 24 can be formed, in FIG. 5(B), over the stack illustrated in FIG. 8(C1) or FIG. 8(C2). Consequently, the number of steps can be reduced.

Next, description is made on the equipment that can be used for the cleaning method of one embodiment of the present invention. The following describes equipment including an ashing apparatus; however, one embodiment of the present invention is not limited thereto. For example, an etching apparatus, a cleaning apparatus, a polishing apparatus, or the like may be provided instead of an ashing apparatus.

Figure 9A:
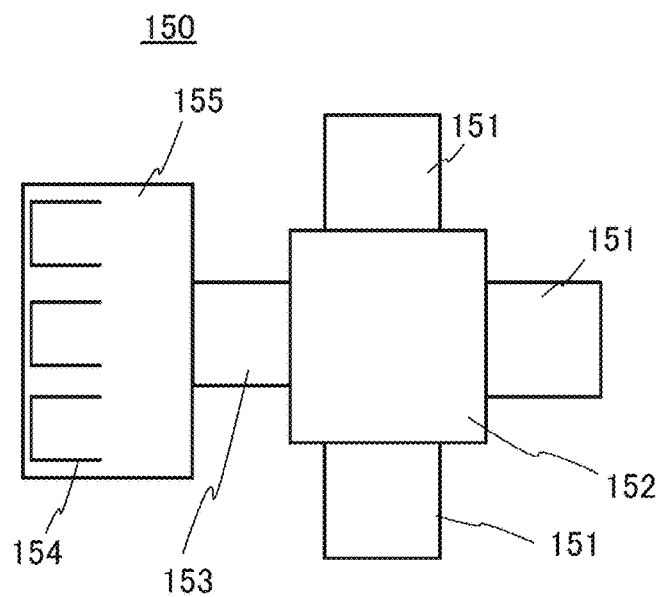
FIGS. 9A-C Drawings illustrating examples of multi-chamber equipment, in-line equipment, and an ashing apparatus.
Figure 9B:
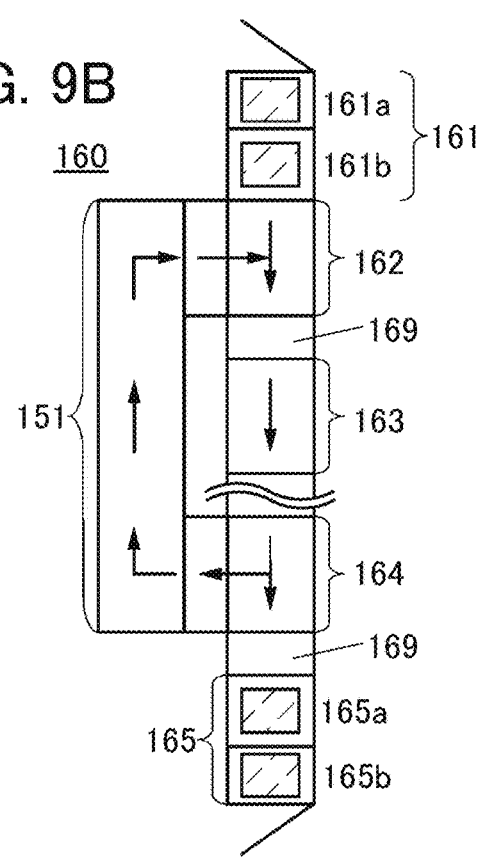
Figure 9C:
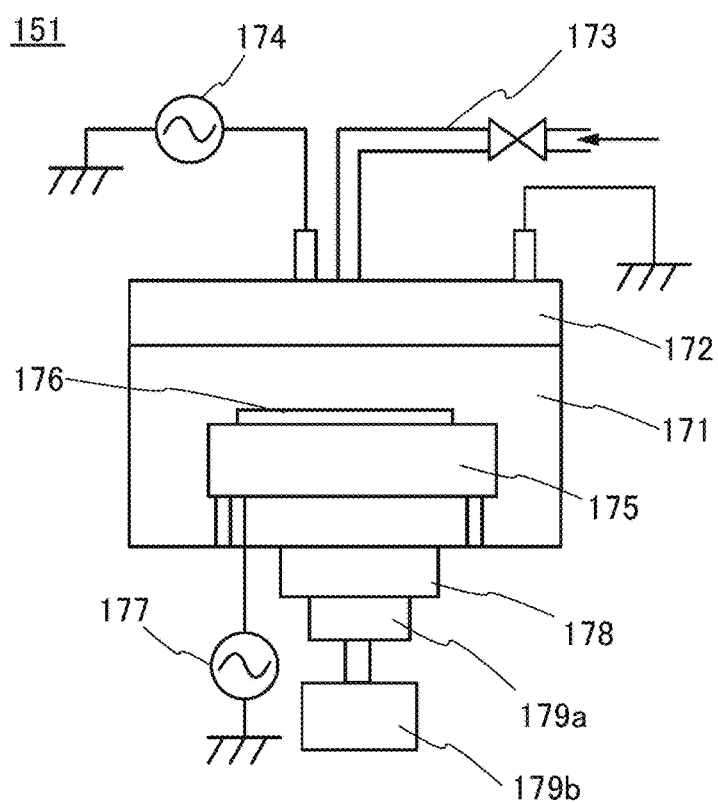

FIG. 9(A) illustrates an example of multi-chamber equipment 150. FIG. 9(B) illustrates an example of in-line equipment 160. FIG. 9(C) illustrates an example of an ashing apparatus 151. The multi-chamber equipment 150 and the in-line equipment 160 each include one or more ashing apparatuses 151.

The multi-chamber equipment 150 includes the ashing apparatus 151, a transfer chamber 152, a load lock chamber 153, a substrate supply chamber 155, and the like. The multi-chamber equipment 150 in the example illustrated in FIG. 9(A) includes three ashing apparatuses 151 but the number of the ashing apparatuses is not limited. The substrate supply chamber 155 includes one or more cassette ports 154 for storing a substrate to be treated. FIG. 9(A) illustrates an example in which the substrate supply chamber 155 includes three cassette ports 154. A substrate supplied to the substrate supply chamber 155 is transferred to a vacuum chamber 171 in the ashing apparatus 151 through the load lock chamber 153 and the transfer chamber 152, and ashing is performed. The substrate where ashing is completed is transferred from the ashing apparatus to the substrate supply chamber 155 through the load lock chamber 153 and the transfer chamber 152. Note that a transfer robot for transferring a substrate to be treated is placed in each of the substrate supply chamber 155 and the transfer chamber 152.

The in-line equipment in FIG. 9(B) includes a pretreatment portion 161, a treatment chamber 162, a treatment chamber 163, a treatment chamber 164, a posttreatment portion 165, the ashing apparatus 151, and the like.

The pretreatment portion 161 includes a loader portion 161a and a pretreatment chamber 161b. The loader portion 161a is a chamber where a plurality of substrates which are carried in with the atmospheric pressure are stocked and the pressure is reduced with an evacuation unit, which is not shown, to a desired pressure. Impurities attached to the substrate are removed by the pretreatment in the pretreatment chamber 161b. As examples of the pretreatment, vacuum heat treatment, UV irradiation treatment, and the like can be given.

FIG. 9(B) illustrates the treatment chamber 162, the treatment chamber 163, and the treatment chamber 164. Furthermore, one or more treatment chambers may further be provided between the treatment chamber 163 and the treatment chamber 164. Treatments such as deposition, processing, and separation can be performed in the treatment chambers. Each treatment chamber includes a transfer mechanism and an evacuation mechanism. Furthermore, a buffer portion 169 is provided between the treatment chambers. A substrate can be transferred to the treatment chamber with a different pressure through the buffer portion 169.

An example in which the steps of the above peeling method are performed using the in-line equipment 160 is described. Note that in this embodiment, the case where the formation substrate 14 on which the metal oxide layer 20 is formed in advance is carried in is described. First, the formation substrate 14 on which the metal oxide layer 20 is formed is carried into the pretreatment portion 161. After pretreatment of the formation substrate 14 in the pretreatment portion 161, the formation substrate 14 is carried into the treatment chamber 162. Next, while the formation substrate 14 is transferred from the treatment chamber 162 to the front of the treatment chamber 164, the resin layer 23, the layer 25 to be peeled, the substrate 75a, and the like are formed over the metal oxide layer 20. Then, the metal oxide layer 20 and the resin layer 23 are separated from each other in the treatment chamber 164. The stack including the substrate 75a is carried into the posttreatment portion 165. Furthermore, the formation substrate 14 on which the metal oxide layer 20 and the resin layer 23 remain is carried into the ashing apparatus 151. The resin layer 23 can be removed by ashing in the ashing apparatus 151. The formation substrate 14 from which the resin layer 23 is removed and on which the metal oxide layer 20 remains is carried into the treatment chamber 162 from the ashing apparatus 151. Treatment is repeated in and after the chamber 162. This enables the repeated use of the formation substrate 14 and the metal oxide layer 20.

The posttreatment portion 165 includes a posttreatment chamber 165a and an unloader portion 165b. In the posttreatment chamber 165a, a substrate such as a film can be bonded to a surface of the stack including the substrate 75a which is exposed by separation. Then, the stack can be carried out from the unloader portion 165b.

The ashing apparatus 151 illustrated in FIG. 9(C) includes the vacuum chamber 171.

A plurality of gas outlets and an ICP coil 172 (an inductively coupled plasma coil) which is a generation source of plasma are placed on a top portion of the vacuum chamber 171.

The plurality of gas outlets are each connected to a gas supply source for supplying an oxygen gas through a gas flow path 173. The gas supply source is provided with a mass flow controller or the like and can supply an oxygen gas to the gas flow path 173 at a desired flow rate (greater than 0 and less than or equal to 1000 sccm). The oxygen gas supplied from the gas supply source is supplied from the gas flow path 173, through the gas outlet, into the vacuum chamber 171.

In the ICP coil 172, a plurality of strip-like conductors are placed to have a spiral form. One end of each of the conductors is electrically connected to a high-frequency power source 174 (e.g., 13.56 MHz) through a matching circuit for controlling impedance, and the other end thereof is grounded.

A substrate stage 175 functioning as a bottom electrode is placed in a lower portion of the vacuum chamber 171. By an electrostatic chuck or the like provided for the substrate stage 175, a substrate 176 to be treated is held on the substrate stage 175 so as to be detachable. The substrate stage 175 is provided with a heater as a heating mechanism and a He gas flow path as a cooling mechanism. The substrate stage 175 is connected to a high-frequency power source 177 (e.g., 3.2 MHz) for applying a substrate bias voltage.

The vacuum chamber 171 is provided with an evacuation port and an automatic pressure control valve 178 (also referred to as an APC). The APC is connected to a turbo molecular pump 179a and further, connected to a dry pump 179b through the turbo molecular pump 179a. The APC controls the pressure inside the vacuum chamber, and the turbo molecular pump 179a and the dry pump 179b reduce the inside pressure of the vacuum chamber 171.

For example, oxygen plasma is generated in the vacuum chamber 171 illustrated in FIG. 9(C) and the resin layer 23 provided for the substrate 176 to be treated is irradiated with oxygen plasma, whereby the resin layer 23 can be removed.

Manufacturing Method Example 1

Next, manufacturing method examples of the display device of this embodiment will be described. Portions similar to those in the above-described peeling method are not described in some cases.

Figure 10A:
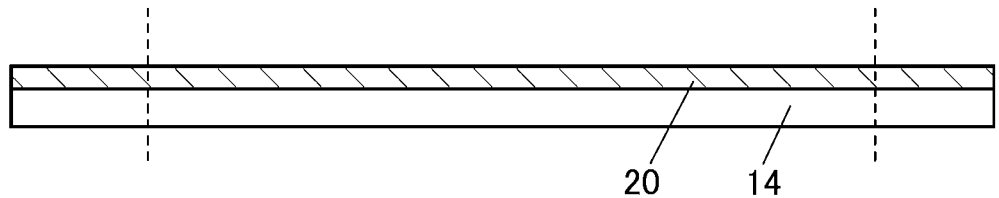
FIGS. 10A-E Cross-sectional views illustrating an example of a manufacturing method of a display device.

First, the metal oxide layer 20 is formed over the formation substrate 14 (FIG. 10(A)). For the metal oxide layer 20, the description of the above peeling method can be referred to.

Figure 10B:
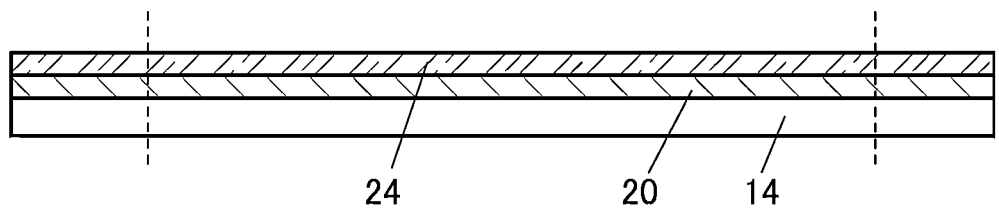
Figure 10C:
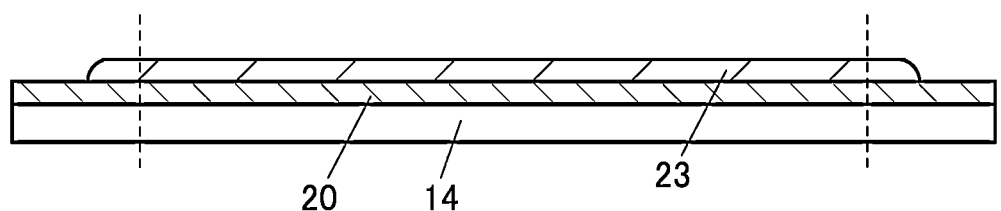

Next, the first layer 24 is formed over the metal oxide layer 20 (FIG. 10(B)). For the first layer 24, the description of the above peeling method can be referred to.

In this embodiment, the first layer 24 is formed using a photosensitive and thermosetting material. Note that the first layer 24 may be formed using a non-photosensitive material.

Heat treatment (prebaking treatment) for removing a solvent is performed after formation of the first layer 24, and then light exposure is performed using a photomask. Then, development treatment is performed, whereby an unnecessary portion can be removed. Subsequently, heat treatment is performed on the first layer 24 that has been processed into a desired shape, so that the resin layer 23 is formed (FIG. 10(C)). In the example illustrated in FIG. 10(C), the resin layer 23 having an island-like shape is formed.

Note that the resin layer 23 is not necessarily in the form of a single island and may be in the form of a plurality of islands or a shape having an opening, for example. In addition, an unevenness shape may be formed on the surface of the resin layer 23 by a light exposure technique using a half-tone mask or a gray-tone mask, a multiple light exposure technique, or the like.

The resin layer 23 with a desired shape can be formed in such a manner that a mask such as a resist mask or a hard mask is formed over the first layer 24 or the resin layer 23 and etching is performed. This method is particularly suitable for the case of using a non-photosensitive material.

For example, an inorganic film is formed over the resin layer 23, and a resist mask is formed over the inorganic film.

After the inorganic film is etched with the use of the resist mask, the resin layer 23 can be etched using the inorganic film as a hard mask.

As an inorganic film that can be used as the hard mask, a variety of inorganic insulating films, metal films and alloy films that can be used for a conductive layer, and the like can be given.

It is preferable that the mask with an extremely small thickness can be formed and the mask can be removed concurrently with the etching, in which case a step of removing the mask can be eliminated.

For details of the heat treatment, the description of the heat treatment in the above peeling method can be referred to.

Figure 10D:
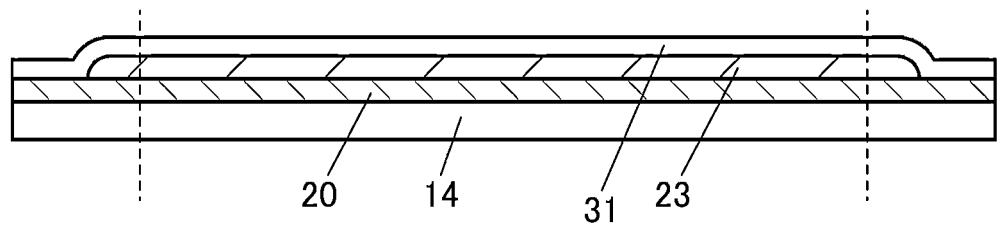

Next, an insulating layer 31 is formed over the resin layer 23 (FIG. 10(D)). The insulating layer 31 is formed to cover an end portion of the resin layer 23. Over the metal oxide layer 20 is a portion where the resin layer 23 is not provided. Accordingly, the insulating layer 31 can be formed over and in contact with the metal oxide layer 20.

The insulating layer 31 is formed at a temperature lower than or equal to the upper temperature limit of the resin layer 23. The insulating layer 31 is preferably formed at a temperature lower than the temperature of the heat treatment.

The insulating layer 31 can be used as a barrier layer that prevents diffusion of impurities contained in the resin layer 23 to a transistor and a display element formed later. For example, the insulating layer 31 preferably prevents moisture and the like contained in the resin layer 23 from diffusing to the transistor and the display element when the resin layer 23 is heated. Thus, the insulating layer 31 preferably has a high barrier property.

As the insulating layer 31, for example, an inorganic insulating film such as a silicon nitride film, a silicon oxynitride film, a silicon oxide film, a silicon nitride oxide film, an aluminum oxide film, or an aluminum nitride film can be used. Moreover, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Furthermore, a stack of two or more of the above insulating films may also be used. It is particularly preferable that a silicon nitride film be formed over the resin layer 23 and a silicon oxide film be formed over the silicon nitride film.

An inorganic insulating film is preferably formed at high temperatures because the film can have higher density and a higher barrier property as the deposition temperature is higher.

The substrate temperature during the formation of the insulating layer 31 is preferably higher than or equal to room temperature (25° C.) and lower than or equal to 350° C., further preferably higher than or equal to 100° C. and lower than or equal to 300° C.

Figure 10E:
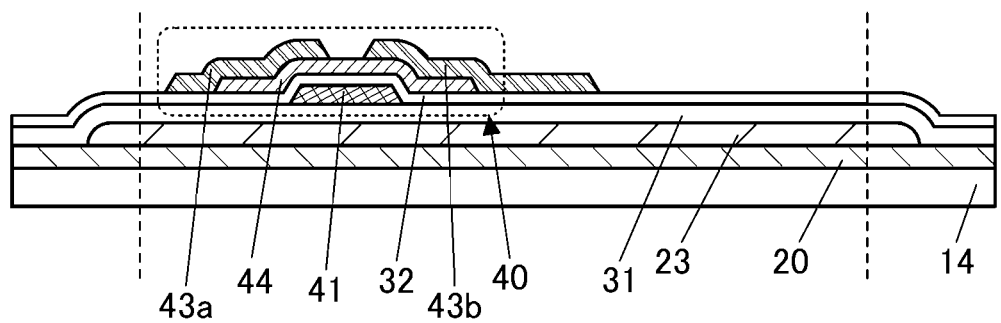

Next, a transistor 40 is formed over the insulating layer 31 (FIG. 10(E)).

There is no particular limitation on the structure of the transistor included in the display device. For example, a planar transistor may be used, a staggered transistor may be used, or an inverted staggered transistor may be used. In addition, a top-gate transistor or a bottom-gate transistor may be used. Alternatively, gate electrodes may be provided above and below a channel.

Here, the case where a bottom-gate transistor including a metal oxide layer 44 is formed as the transistor 40 is described. The metal oxide layer 44 can function as a semiconductor layer of the transistor 40. A metal oxide can function as an oxide semiconductor.

In this embodiment, an oxide semiconductor is used as a semiconductor of a transistor. A semiconductor material having a wider bandgap and a lower carrier density than silicon is preferably used because off-state current of the transistor can be reduced.

The transistor 40 is formed at a temperature lower than or equal to the upper temperature limit of the resin layer 23. The transistor 40 is preferably formed at a temperature lower than the temperature of the heat treatment.

Specifically, first, a conductive layer 41 is formed over the insulating layer 31. The conductive layer 41 can be formed in the following manner: after a conductive film is formed, a resist mask is formed, the conductive film is etched, and then the resist mask is removed.

The substrate temperature during the formation of the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Furthermore, a semiconductor such as an oxide semiconductor or polycrystalline silicon whose resistance is lowered by containing an impurity element, for example, or silicide such as nickel silicide may be used. Furthermore, a film containing graphene can also be used. The film containing graphene can be formed, for example, by reducing a film containing graphene oxide. Furthermore, a semiconductor such as an oxide semiconductor containing an impurity element may also be used. Alternatively, the conductive layers may be formed using a conductive paste of silver, carbon, copper, or the like or a conductive polymer such as polythiophene. A conductive paste is preferable because it is inexpensive. A conductive polymer is preferable because it is easily applied.

Next, an insulating layer 32 is formed. For the insulating layer 32, the inorganic insulating film that can be used for the insulating layer 31 can be referred to.

Then, the metal oxide layer 44 is formed. The metal oxide layer 44 can be formed in the following manner: after a metal oxide film is formed, a resist mask is formed, the metal oxide film is etched, and then the resist mask is removed.

The substrate temperature at the time of depositing the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, the metal oxide film preferably contains indium and zinc.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Next, a conductive layer 43a and a conductive layer 43b are formed. The conductive layer 43a and the conductive layer 43b can be formed in the following manner: after a conductive film is formed, a resist mask is formed, the conductive film is etched, and then the resist mask is removed. Each of the conductive layer 43a and the conductive layer 43b is connected to the metal oxide layer 44.

Note that during the processing of the conductive layer 43a and the conductive layer 43b, part of the metal oxide layer 44 not covered by the resist mask might be etched to be thin.

The substrate temperature during the formation of the conductive film is preferably higher than or equal to room temperature and lower than or equal to 350° C., further preferably higher than or equal to room temperature and lower than or equal to 300° C.

In the above manner, the transistor 40 can be manufactured (FIG. 10(E)). In the transistor 40, part of the conductive layer 41 functions as a gate, part of the insulating layer 32 functions as a gate insulating layer, and the conductive layer 43a and the conductive layer 43b each function as either of a source and a drain.

Figure 11A:
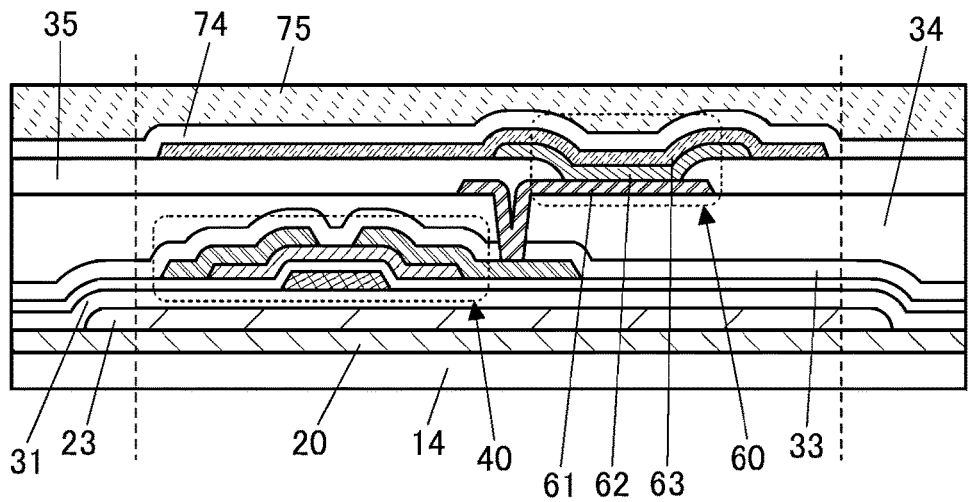
FIGS. 11A-B4 Cross-sectional views and top views illustrating examples of a manufacturing method of a display device.
Figure 11A:
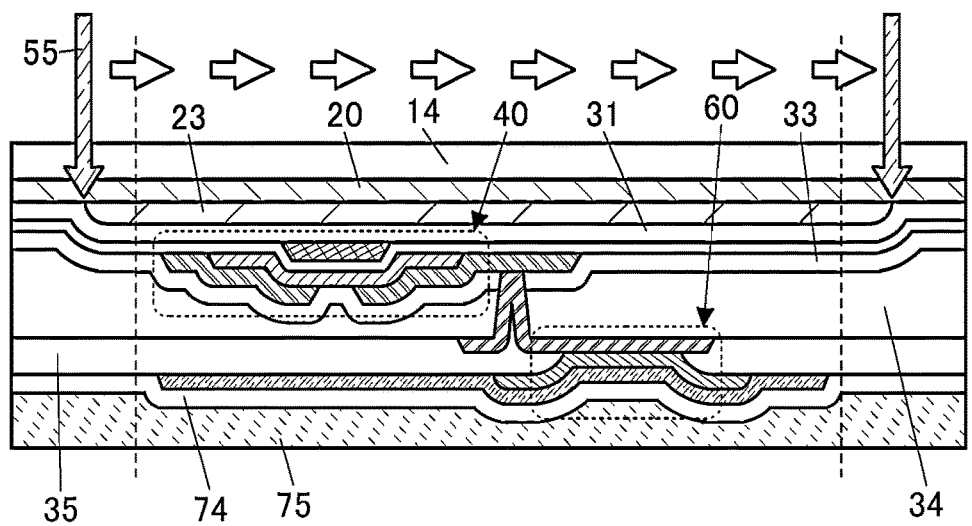
Figure 11A:
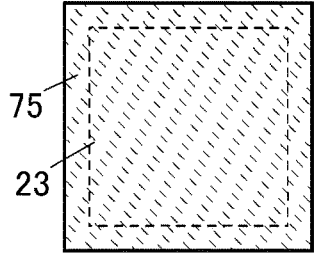
Figure 11A:
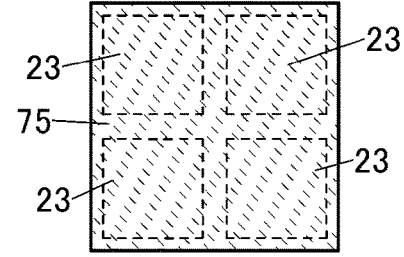
Figure 11A:
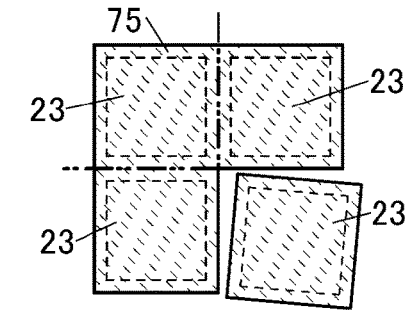

Next, an insulating layer 33 covering the transistor 40 is formed (FIG. 11(A)). The insulating layer 33 can be formed using a method similar to that of the insulating layer 31.

Furthermore, it is preferable to use an oxide insulating film, such as a silicon oxide film or a silicon oxynitride film, formed in an oxygen-containing atmosphere for the insulating layer 33. Furthermore, an insulating film with low oxygen diffusibility and oxygen permeability, such as a silicon nitride film, is preferably stacked over the silicon oxide film or the silicon oxynitride film. The oxide insulating film formed in an oxygen-containing atmosphere can be an insulating film that easily releases a large amount of oxygen by heating. When heat treatment is performed in a state where such an oxide insulating film that releases oxygen and such an insulating film with low oxygen diffusibility and oxygen permeability are stacked, oxygen can be supplied to the metal oxide layer 44. As a result, oxygen vacancies in the metal oxide layer 44 and defects at the interface between the metal oxide layer 44 and the insulating layer 33 can be repaired, leading to a reduction in the concentration of defect levels. Consequently, a display device with extremely high reliability can be achieved.

Through the above steps, the insulating layer 31, the transistor 40, and the insulating layer 33 can be formed over the resin layer 23 (FIG. 11(A)).

If the formation substrate 14 and the transistor 40 are separated from each other at this stage by a method described later, a device including no display element can be manufactured. Forming the transistor 40 or forming a capacitor, a resistor, a wiring, and the like in addition to the transistor 40 can provide a semiconductor device, for example.

Then, an insulating layer 34 is formed over the insulating layer 33 (FIG. 11(A)). Since the insulating layer 34 is a layer having a surface on which a display element to be formed later is formed, it preferably functions as a planarization layer. For the insulating layer 34, the organic insulating film or the inorganic insulating film that can be used for the insulating layer 31 can be referred to.

The insulating layer 34 is formed at a temperature lower than or equal to the upper temperature limit of the resin layer 23. The insulating layer 34 is preferably formed at a temperature lower than the temperature of the heat treatment.

In the case of using an organic insulating film for the insulating layer 34, the temperature applied to the resin layer 23 during the formation of the insulating layer 34 is preferably higher than or equal to room temperature and lower than or equal to 350° C., further preferably higher than or equal to room temperature and lower than or equal to 300° C.

In the case of using an inorganic insulating film as the insulating layer 34, the substrate temperature during the deposition is preferably higher than or equal to room temperature and lower than or equal to 350° C., further preferably higher than or equal to 100° C. and lower than or equal to 300° C.

Next, an opening that reaches the conductive layer 43b is formed in the insulating layer 34 and the insulating layer 33.

After that, a conductive layer 61 is formed. Part of the conductive layer 61 functions as a pixel electrode of a light-emitting element 60. The conductive layer 61 can be formed in such a manner that after a conductive film is formed, a resist mask is formed, the conductive film is etched, and then the resist mask is removed.

The conductive layer 61 is formed at a temperature lower than or equal to the upper temperature limit of the resin layer 23. The conductive layer 61 is preferably formed at a temperature lower than the temperature of the heat treatment.

The substrate temperature during the formation of the conductive film is preferably higher than or equal to room temperature and lower than or equal to 350° C., further preferably higher than or equal to room temperature and lower than or equal to 300° C.

Next, an insulating layer 35 is formed to cover an end portion of the conductive layer 61. For the insulating layer 35, the organic insulating film or the inorganic insulating film that can be used for the insulating layer 31 can be referred to.

The insulating layer 35 is formed at a temperature lower than or equal to the upper temperature limit of the resin layer 23. The insulating layer 35 is preferably formed at a temperature lower than the temperature of the heat treatment.

In the case of using an organic insulating film for the insulating layer 35, the temperature applied to the resin layer 23 during the formation of the insulating layer 35 is preferably higher than or equal to room temperature and lower than or equal to 350° C., further preferably higher than or equal to room temperature and lower than or equal to 300° C.

In the case of using an inorganic insulating film as the insulating layer 35, the substrate temperature during the deposition is preferably higher than or equal to room temperature and lower than or equal to 350° C., further preferably higher than or equal to 100° C. and lower than or equal to 300° C.

Then, an EL layer 62 and a conductive layer 63 are formed. Part of the conductive layer 63 functions as a common electrode of the light-emitting element 60.

The EL layer 62 can be formed by an evaporation method, a coating method, a printing method, a discharge method, or the like. In the case where the EL layer 62 is separately formed for each individual pixel, it can be formed by an evaporation method using a shadow mask such as a metal mask, an ink-jet method, or the like. In the case of not separately forming the EL layer 62 for each individual pixel, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature that is lower than or equal to the upper temperature limit of the resin layer 23 and lower than or equal to the upper temperature limit of the EL layer 62. Furthermore, the conductive layer 63 is preferably formed at a temperature lower than the temperature of the heat treatment.

In the above manner, the light-emitting element 60 can be formed (FIG. 11(A)). The light-emitting element 60 has a structure in which the conductive layer 61 part of which functions as the pixel electrode, the EL layer 62, and the conductive layer 63 part of which functions as the common electrode are stacked.

Although an example where a top-emission light-emitting element is formed as the light-emitting element 60 is described here, one embodiment of the present invention is not limited thereto.

The light-emitting element may be of top-emission type, bottom-emission type, or dual-emission type. A conductive film that transmits visible light is used for the electrode through which light is extracted. Moreover, a conductive film that reflects visible light is preferably used for the electrode through which light is not extracted.

Next, an insulating layer 74 is formed so as to cover the conductive layer 63 (FIG. 11(A)). The insulating layer 74 functions as a protective layer that prevents diffusion of impurities such as water to the light-emitting element 60. The light-emitting element 60 is sealed with the insulating layer 74. After the conductive layer 63 is formed, the insulating layer 74 is preferably formed without exposure to the air.

The insulating layer 74 is formed at a temperature that is lower than or equal to the upper temperature limit of the resin layer 23 and lower than or equal to the upper temperature limit of the light-emitting element 60. The insulating layer 74 is preferably formed at a temperature lower than the temperature of the heat treatment.

The insulating layer 74 preferably has, for example, a structure including an inorganic insulating film with a high barrier property that can be used as the insulating layer 31 described above. Furthermore, a stack of an inorganic insulating film and an organic insulating film may also be used.

The insulating layer 74 can be formed by an ALD method, a sputtering method, or the like. An ALD method and a sputtering method are preferable because low-temperature film formation is possible. An ALD method is preferable because the coverage with the insulating layer 74 is improved.

Then, a protective layer 75 is formed over the insulating layer 74 (FIG. 11(A)). The adhesive layer 75b and the substrate 75a may be used as the protective layer 75 as illustrated in FIG. 5(D).

Next, the irradiation with the laser light 55 is performed (FIG. 11(B1)). The laser light 55 is, for example, a linear laser beam with which scanning is performed from the left side to the right side in FIG. 11(B1), and the major axis is perpendicular to the scanning direction and the incident direction (from top to bottom). In the laser apparatus, the stack is placed with the formation substrate 14 being on the upper side. The stack is irradiated with the laser light 55 from the upper side of the stack (the formation substrate 14).

For the laser light irradiation step, the description of the above peeling method can be referred to.

Note that in the case where a plurality of display devices are fabricated using one formation substrate (multiple panels are obtained), the plurality of display devices can be formed using one resin layer 23. Alternatively, a plurality of resin layers 23 may be used and the resin layers 23 may be separately formed for display devices. FIG. 11(B2) illustrates an example where one resin layer 23 is provided over the formation substrate. FIGS. 11(B3) and (B4) illustrate an example where four resin layers 23 are provided over a formation substrate.

Treatment of a large-sized substrate is difficult for a laser apparatus or a laser apparatus is expensive in some cases. Therefore, depending on the size of the formation substrate, as illustrated in FIG. 11(B4), the formation substrate may be cut and then the cut formation substrates may each be irradiated with laser light.

Figure 12A:
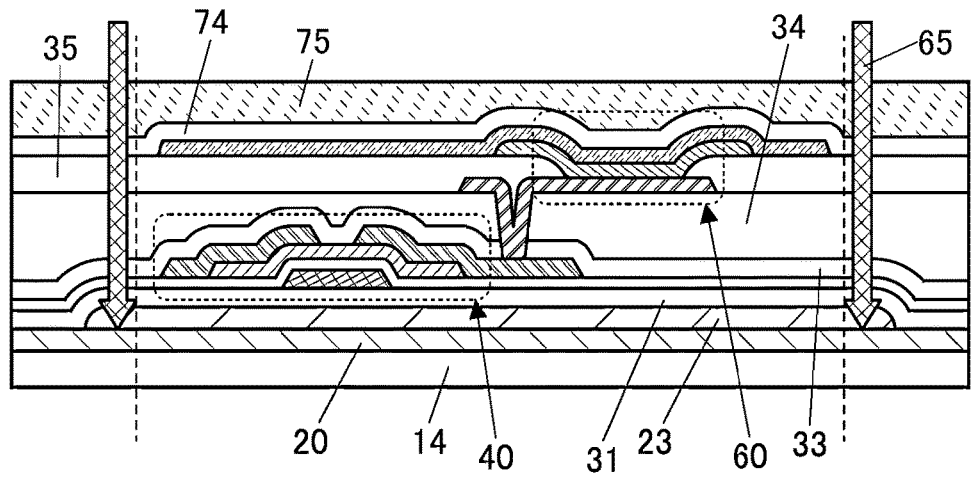
FIGS. 12A-C A cross-sectional view and top views illustrating examples of a manufacturing method of a display device.
Figure 12B:
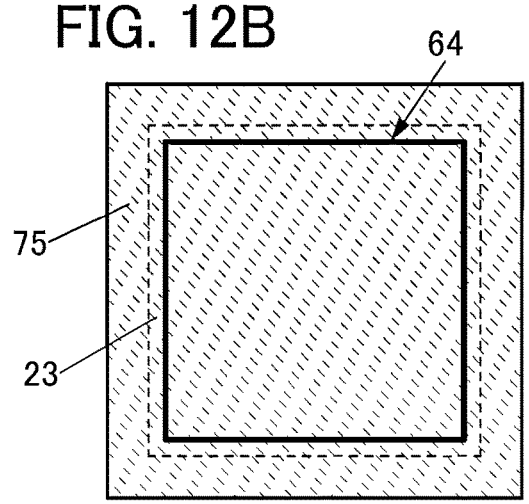
Figure 12C:
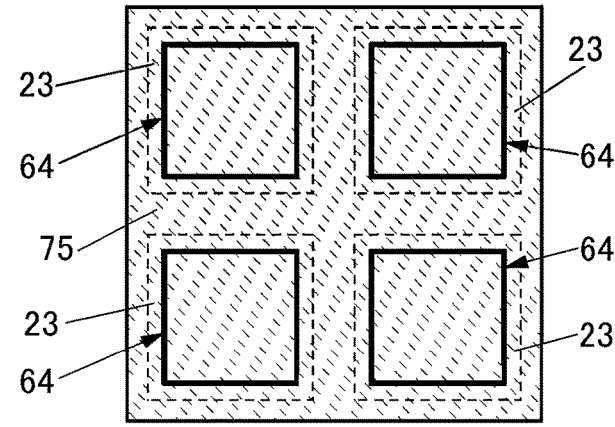

Next, a separation trigger is formed in the resin layer 23 (FIGS. 12(A) to (C)).

For example, a sharp instrument 65, e.g., a knife, is inserted from the protective layer 75 side into a portion located inward from an end portion of the resin layer 23 to make a cut 64 in a frame-like shape.

Alternatively, the resin layer 23 may be irradiated with laser light in a frame-like shape.

As described above, a plurality of display devices can be formed using one resin layer 23 by obtaining multiple panels. For example, the plurality of display devices are placed inside the cut 64 shown in FIG. 12(B). In that case, the plurality of display devices can be separated from the formation substrate at a time.

Alternatively, a plurality of resin layers 23 may be used and the resin layers 23 may be separately formed for display devices. In the example illustrated in FIG. 12(C), four resin layers 23 are formed over a formation substrate. The cut 64 is made in a frame-like shape in each of the four resin layers 23, whereby the display devices can be separated from the formation substrate at different timings.

In the manufacturing method example 1, over the metal oxide layer 20 are provided a portion in contact with the resin layer 23 and a portion in contact with the insulating layer 31. The adhesion (adhesiveness) between the metal oxide layer 20 and the insulating layer 31 is higher than that between the metal oxide layer 20 and the resin layer 23. Therefore, unintentional peeling of the resin layer 23 from the metal oxide layer 20 can be inhibited. In addition, the formation of the separation trigger enables the metal oxide layer 20 and the resin layer 23 to be separated from each other at desired timing. Accordingly, the timing of the separation can be controlled and the force required for the separation is small. This can increase the yield of the separation process and that of the manufacturing process of a display device.

Figure 13A:
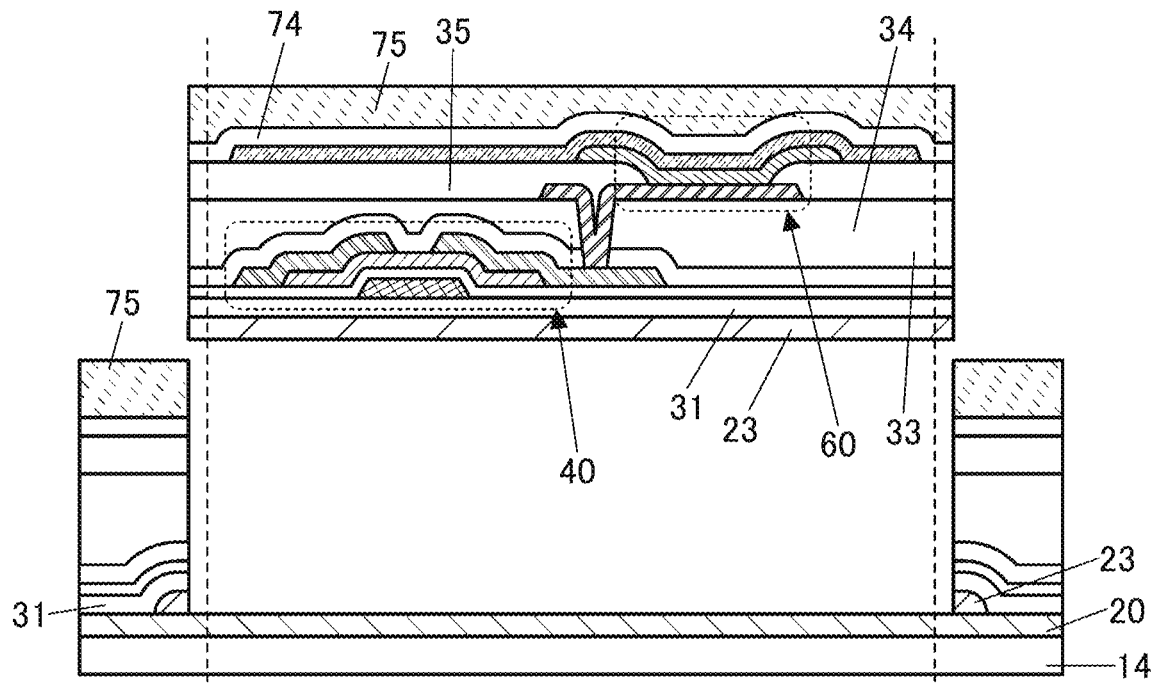
FIGS. 13A-B Cross-sectional views illustrating an example of a manufacturing method of a display device.

Then, the metal oxide layer 20 and the resin layer 23 are separated from each other (FIG. 13(A)).

Figure 13B:
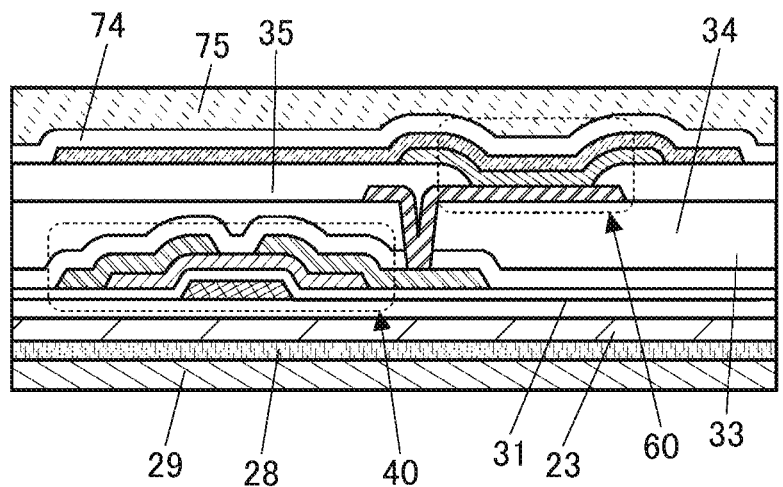

After that, a substrate 29 is bonded to the exposed resin layer 23 with an adhesive layer 28 (FIG. 13(B)).

The substrate 29 can serve as a supporting substrate of the display device. A film is preferably used as the substrate 29, and a resin film is particularly preferably used. In that case, the display device can be reduced in weight and thickness. Furthermore, the display device using a film substrate is less likely to be broken than that in the case of using glass, a metal, or the like. In addition, the display device can have higher flexibility.

With the use of the peeling method described in this embodiment, the transistor 40, the light-emitting element 60, and the like that are fabricated over the formation substrate 14 can be peeled from the formation substrate 14 and transferred onto the substrate 29.

For the adhesive layer 28, the material that can be used for the adhesive layer 75*b* can be used. The material that can be used for the substrate 75*a* can be used for the substrate 29.

In the manufacturing method example 1, the metal oxide layer 20 and the resin layer 23 are stacked and irradiated with light. As a result, the adhesion or adhesiveness between the metal oxide layer 20 and the resin layer 23 can be lowered. Accordingly, the formation substrate 14 and the resin layer 23 can be easily separated from each other.

Structure Example 1 of Display Device

Figure 14A:
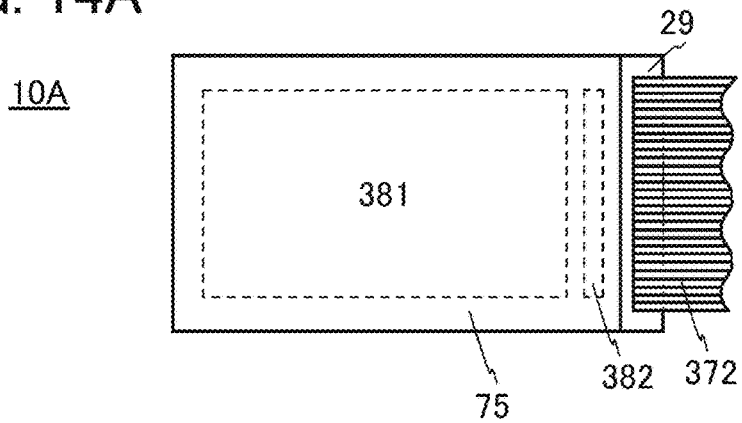
FIGS. 14A-C A top view and cross-sectional views illustrating examples of a display device.
Figure 14B:
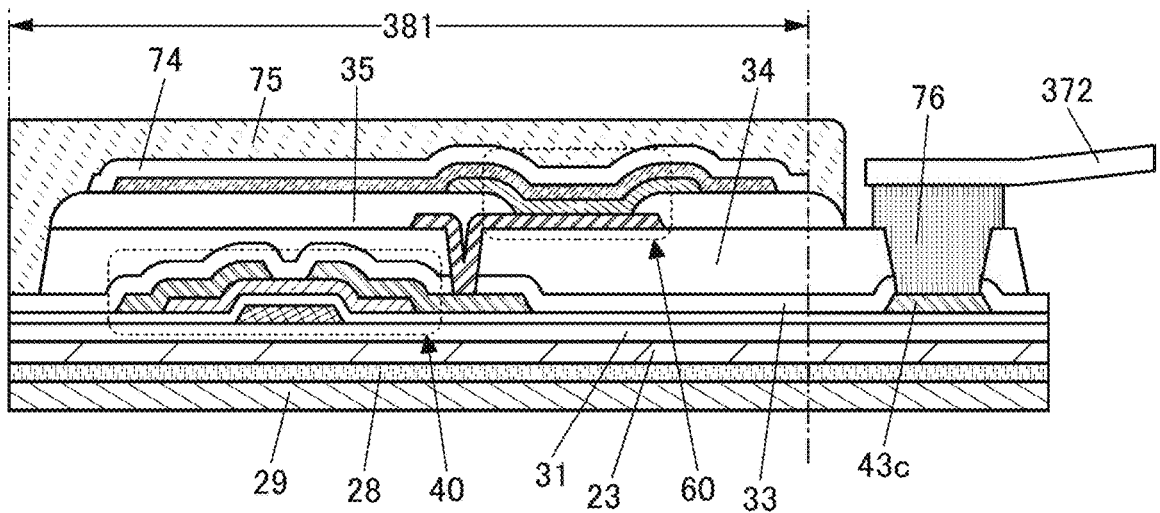

FIG. 14(A) is a top view of a display device 10A. FIGS. 14(B) and (C) are examples of a cross-sectional view illustrating a display portion 381 of the display device 10A and a cross-sectional view illustrating a portion for connection to an FPC 372.

The display device 10A can be manufactured with the use of the above manufacturing method example 1. The display device 10A can be held in a bent state and can be bent repeatedly, for example.

The display device 10A includes the protective layer 75 and the substrate 29. The protective layer 75 side is the display surface side of the display device. The display device 10A includes the display portion 381 and a driver circuit portion 382. The FPC 372 is attached to the display device 10A.

A conductive layer 43*c* and the FPC 372 are electrically connected through a connector 76 (FIGS. 14(B) and (C)). The conductive layer 43*c* can be formed using the same material and the same step as those of the source and the drain of the transistor.

As the connector 76, various anisotropic conductive films (ACF), anisotropic conductive pastes (ACP), and the like can be used.

Figure 14C:
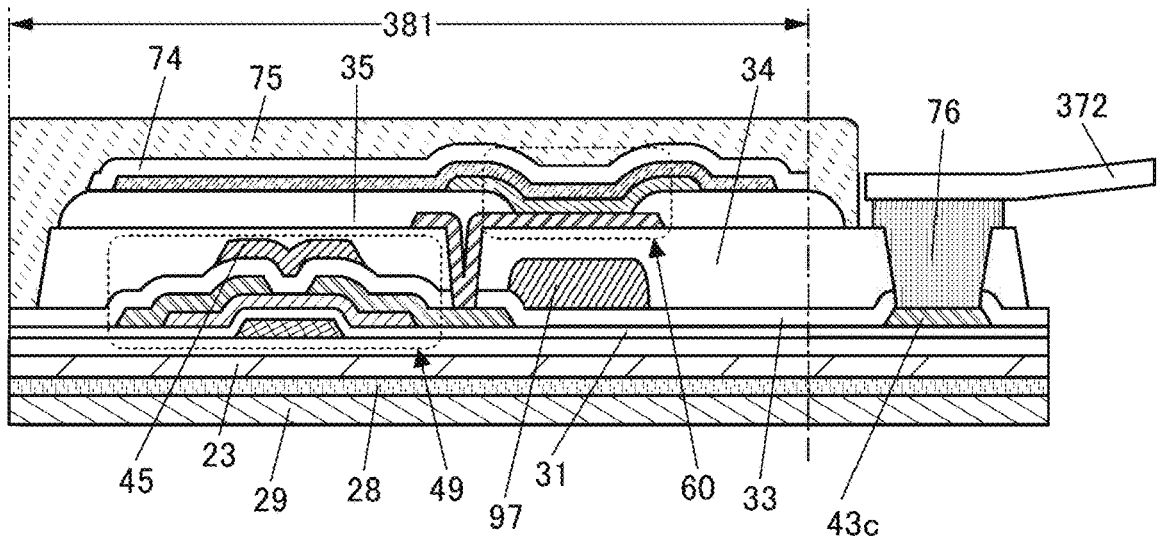

The display device illustrated in FIG. 14(C) is different from the structure illustrated in FIG. 14(B) in that not the transistor 40 but a transistor 49 is provided and that a coloring layer 97 is provided over the insulating layer 33. In the case where the light-emitting element 60 has a bottom-emission structure, the coloring layer 97 may be provided closer to the substrate 29 than the light-emitting element 60 is. In the above manufacturing method example 1, a material having high transmittance of visible light can be used for the resin layer 23. Thus, even a display device in which light from the light-emitting element 60 is extracted through the resin layer 23 can have high display quality.

The transistor 49 illustrated in FIG. 14(C) includes a conductive layer 45 serving as a gate, as well as the components of the transistor 40 in FIG. 14(B).

The structure in which the semiconductor layer where a channel is formed is provided between two gates is used for the transistor 49. Such a structure enables the control of the threshold voltage of a transistor. The two gates may be connected to each other and supplied with the same signal to operate the transistor. Such a transistor can have higher field-effect mobility and thus have a higher on-state current than other transistors. Consequently, a circuit capable of high-speed operation can be manufactured. Furthermore, the area occupied by a circuit portion can be reduced. The use of the transistor having a high on-state current can reduce signal delay in wirings and can suppress display unevenness even if the number of wirings is increased when a display device is increased in size or resolution.

Alternatively, by supplying a potential for controlling the threshold voltage to one of the two gates and a potential for driving to the other, the threshold voltage of the transistor can be controlled.

Manufacturing Method Example 2

Figure 15A:
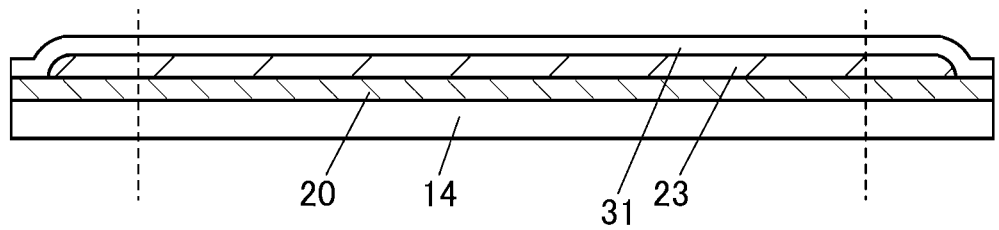
FIGS. 15A-C Cross-sectional views illustrating an example of a manufacturing method of a display device.

First, the components from the metal oxide layer 20 to the insulating layer 31 are formed over the formation substrate 14 as in the above peeling method (FIG. 15(A)).

Figure 15B:
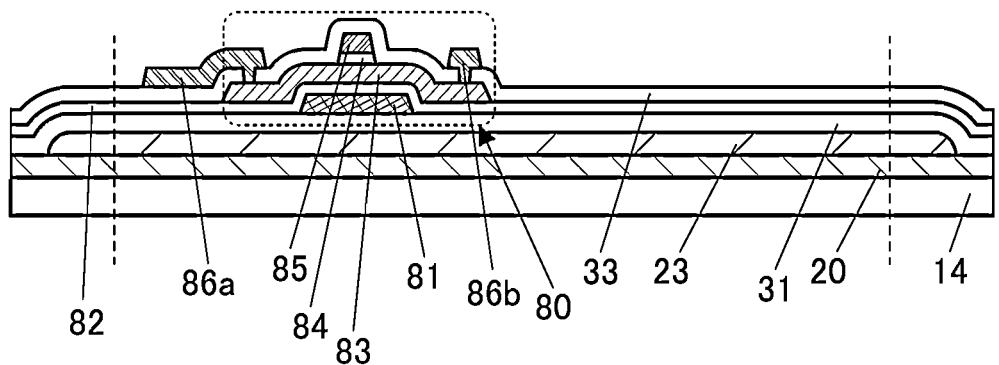

Next, a transistor 80 is formed over the insulating layer 31 (FIG. 15(B)).

In the case described here, a transistor including a metal oxide layer 83 and two gates is fabricated as the transistor 80.

The transistor 80 is formed at a temperature lower than or equal to the upper temperature limit of the resin layer 23. The transistor 80 is preferably formed at a temperature lower than the temperature of the heat treatment.

Specifically, first, a conductive layer 81 is formed over the insulating layer 31. The conductive layer 81 can be formed in the following manner: after a conductive film is formed, a resist mask is formed, the conductive film is etched, and then the resist mask is removed.

Next, an insulating layer 82 is formed. For the insulating layer 82, the inorganic insulating film that can be used for the insulating layer 31 can be referred to.

Then, the metal oxide layer 83 is formed. The metal oxide layer 83 can be formed in the following manner: after a metal oxide film is formed, a resist mask is formed, the metal oxide film is etched, and then the resist mask is removed. For the metal oxide layer 83, the materials that can be used for the metal oxide layer 44 can be referred to.

Then, an insulating layer 84 and a conductive layer 85 are formed. For the insulating layer 84, the inorganic insulating film that can be used for the insulating layer 31 can be referred to. The insulating layer 84 and the conductive layer 85 can be formed in such a manner that after an insulating film to be the insulating layer 84 and a conductive film to be the conductive layer 85 are formed, a resist mask is formed, the insulating film and the conductive film are etched, and then the resist mask is removed.

Next, the insulating layer 33 that covers the metal oxide layer 83, the insulating layer 84, and the conductive layer 85 is formed. The insulating layer 33 can be formed using a method similar to that of the insulating layer 31.

The insulating layer 33 preferably contains hydrogen. The hydrogen contained in the insulating layer 33 is diffused to the metal oxide layer 83 in contact with the insulating layer 33, so that part of the metal oxide layer 83 has reduced resistance. Since part of the metal oxide layer 83 serves as a low-resistance region, the on-state current and the field-effect mobility of the transistor 80 can be increased.

Next, openings reaching the metal oxide layer 83 are formed in the insulating layer 33.

Next, a conductive layer 86*a* and a conductive layer 86*b* are formed. The conductive layer 86*a* and the conductive layer 86b can be formed in the following manner: after a conductive film is formed, a resist mask is formed, the conductive film is etched, and then the resist mask is removed. Each of the conductive layer 86a and the conductive layer 86b is electrically connected to the metal oxide layer 83 through the openings in the insulating layer 33.

In the above manner, the transistor 80 can be manufactured (FIG. 15(B)). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The metal oxide layer 83 includes a channel region and the low-resistance region. The channel region overlaps with the conductive layer 85 with the insulating layer 84 provided therebetween. The low-resistance region includes a portion connected to the conductive layer 86a and a portion connected to the conductive layer 86b.

Figure 15C:
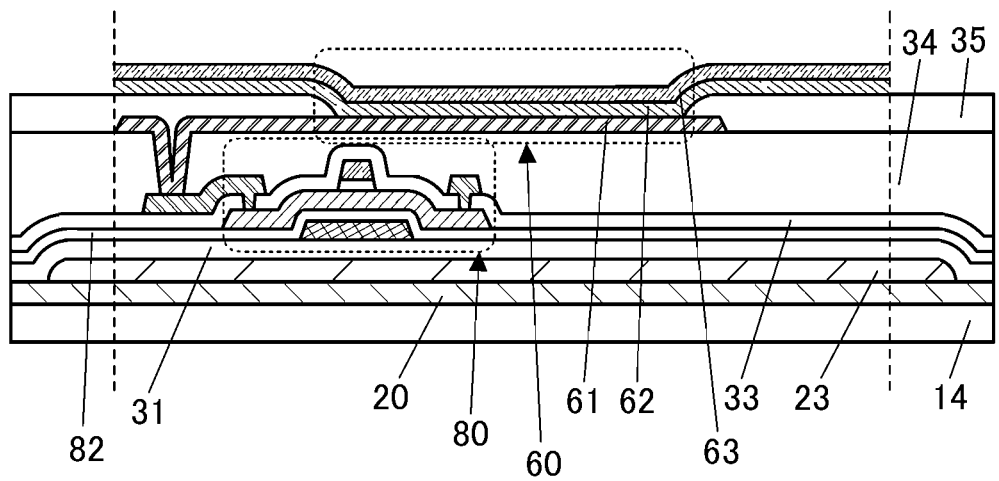

Next, the components from the insulating layer 34 to the light-emitting element 60 are formed over the insulating layer 33 (FIG. 15(C)). For the steps, the manufacturing method example 1 can be referred to.

Figure 16A:
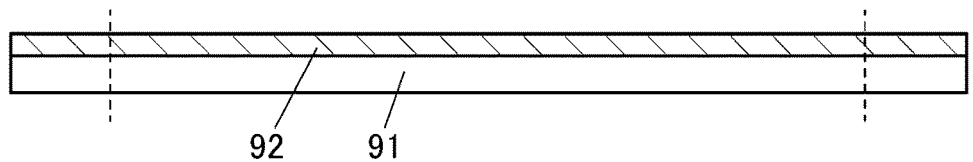
FIGS. 16A-D Cross-sectional views illustrating an example of a manufacturing method of a display device.
Figure 16B:
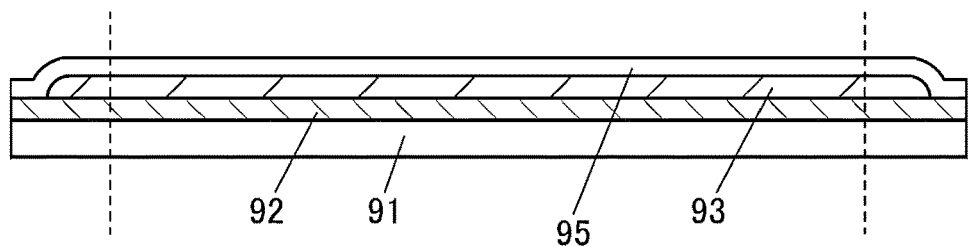
Figure 16C:
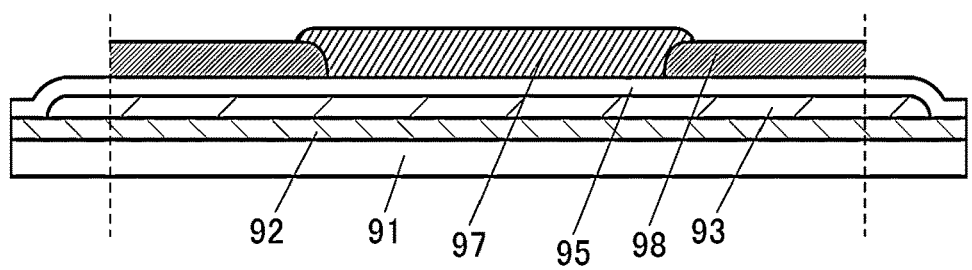

Furthermore, the steps illustrated in FIGS. 16(A) to (C) are performed independently of the steps illustrated in FIGS. 15(A) to (C). First, a metal oxide layer 92 is formed over a formation substrate 91 in a manner similar to that of the step of forming the metal oxide layer 20 over the formation substrate 14 (FIG. 16(A)). After that, in a manner similar to that of the step of forming the resin layer 23 over the metal oxide layer 20, a first layer is formed over the metal oxide layer 92 and heat treatment is performed to form a resin layer 93 (FIG. 16(B)). Then, in a manner similar to that of the step of forming the insulating layer 31 over the resin layer 23, an insulating layer 95 covering an end portion of the resin layer 93 is formed over the resin layer 93 (FIG. 16(B)).

Next, the coloring layer 97 and a light-blocking layer 98 are formed over the insulating layer 95 (FIG. 16(C)).

A color filter or the like can be used as the coloring layer 97. The coloring layer 97 is placed to overlap with a display region of the light-emitting element 60.

A black matrix or the like can be used as the light-blocking layer 98. The light-blocking layer 98 is placed to overlap with the insulating layer 35.

Figure 16D:
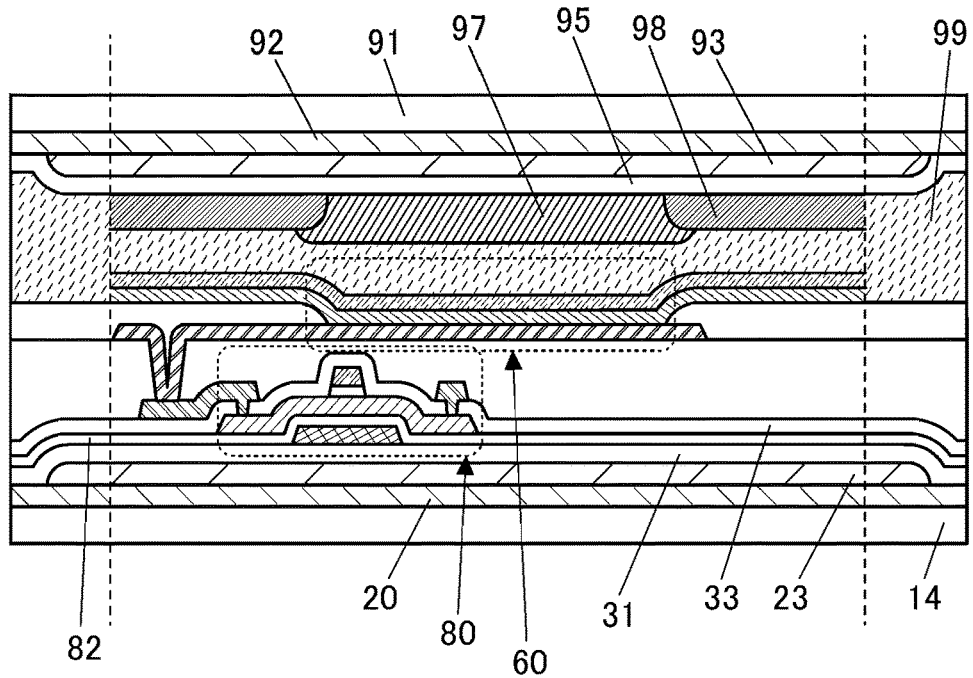

Then, with the use of an adhesive layer 99, the surface of the formation substrate 14 where the transistor 80 and the like are formed and the surface of the formation substrate 91 where the resin layer 93 and the like are formed are bonded to each other (FIG. 16(D)).

Figure 17:
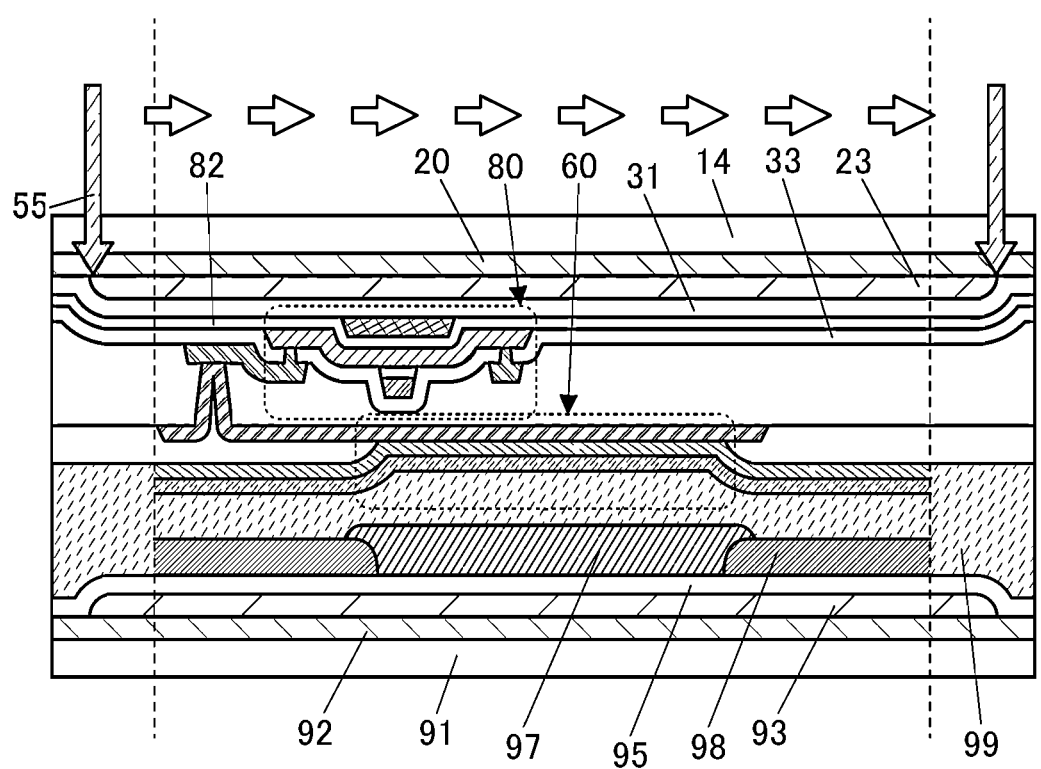
FIG. 17 A cross-sectional view illustrating an example of a manufacturing method of a display device.

Next, the irradiation with the laser light 55 is performed (FIG. 17). The laser light 55 is, for example, a linear laser beam with which scanning is performed from the left side to the right side in FIG. 17, and the major axis is perpendicular to the scanning direction and the incident direction (from top to bottom). In the laser apparatus, the stack is placed with the formation substrate 14 being on the upper side. The stack is irradiated with the laser light 55 from the upper side of the stack (the formation substrate 14).

Either the formation substrate 14 or the formation substrate 91 may be separated first. In this example, separation of the formation substrate 14 precedes that of the formation substrate 91.

The interface between the metal oxide layer 20 and the resin layer 23 or the vicinity thereof is preferably irradiated with the laser light 55 through the formation substrate 14. Furthermore, the inside of the metal oxide layer 20 may be irradiated with the laser light 55 or the inside of the resin layer 23 may be irradiated with the laser light 55.

The metal oxide layer 20 absorbs the laser light 55. The resin layer 23 may absorb the laser light 55.

The irradiation with the laser light 55 reduces adhesion or adhesiveness between the metal oxide layer 20 and the resin layer 23. The resin layer 23 is embrittled by the irradiation with the laser light 55 in some cases.

For the laser light irradiation step, the description of the above peeling method can be referred to.

Figure 18A:
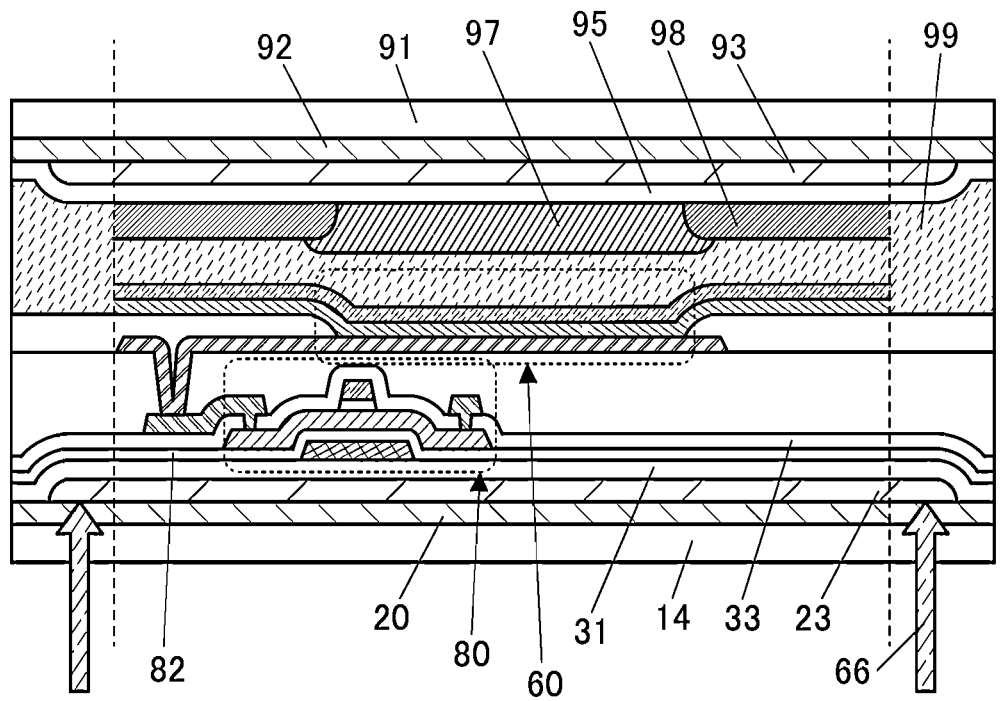
FIGS. 18A-B A cross-sectional view and a top view illustrating an example of a manufacturing method of a display device.

Next, a separation trigger is formed in the resin layer 23 (FIGS. 18(A) and (B)).

Figure 18B:
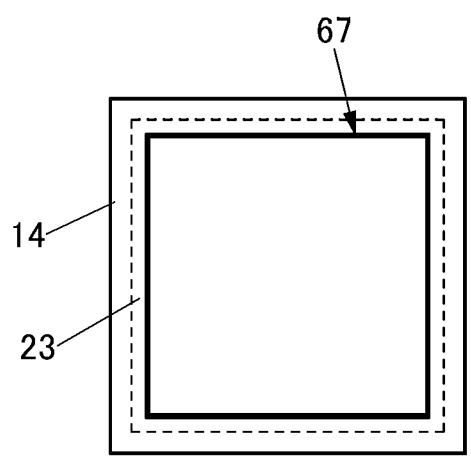

For example, the resin layer 23 is irradiated with laser light 66 in a frame-like shape from the formation substrate 14 side (see a laser-light irradiation region 67 illustrated in FIG. 18(B)). This example is suitable for the case where hard substrates such as glass are used as the formation substrate 14 and the formation substrate 91.

There is no particular limitation on a laser used to form the separation trigger. For example, a continuous wave laser or a pulsed oscillation laser can be used. A condition for laser light irradiation (frequency, power density, energy density, beam profile, or the like) is controlled as appropriate in consideration of the thicknesses, materials, or the like of the formation substrate and the resin layer.

In the manufacturing method example 2, over the metal oxide layer 20 are provided a portion in contact with the resin layer 23 and a portion in contact with the insulating layer 31. The adhesion (adhesiveness) between the metal oxide layer 20 and the insulating layer 31 is higher than that between the metal oxide layer 20 and the resin layer 23. Therefore, unintentional peeling of the resin layer 23 from the metal oxide layer 20 can be inhibited. In a similar manner, over the metal oxide layer 92 are provided a portion in contact with the resin layer 93 and a portion in contact with the insulating layer 95. The adhesion (adhesiveness) between the metal oxide layer 92 and the insulating layer 95 is higher than that between the metal oxide layer 92 and the resin layer 93. Therefore, unintentional peeling of the resin layer 93 from the metal oxide layer 92 can be inhibited.

A separation trigger is formed on either the resin layer 23 or the resin layer 93. The timing of forming a separation trigger can be different between the resin layer 23 and the resin layer 93; therefore, the formation substrate 14 and the formation substrate 91 can be separated in different steps. This can increase the yield of the separation process and that of the manufacturing process of a display device.

Irradiation with the laser light 66 does not need to be performed on the entire area of the resin layer 23 and is performed on part of the resin layer. Accordingly, an expensive laser apparatus requiring high running costs is not needed.

Figure 19A:
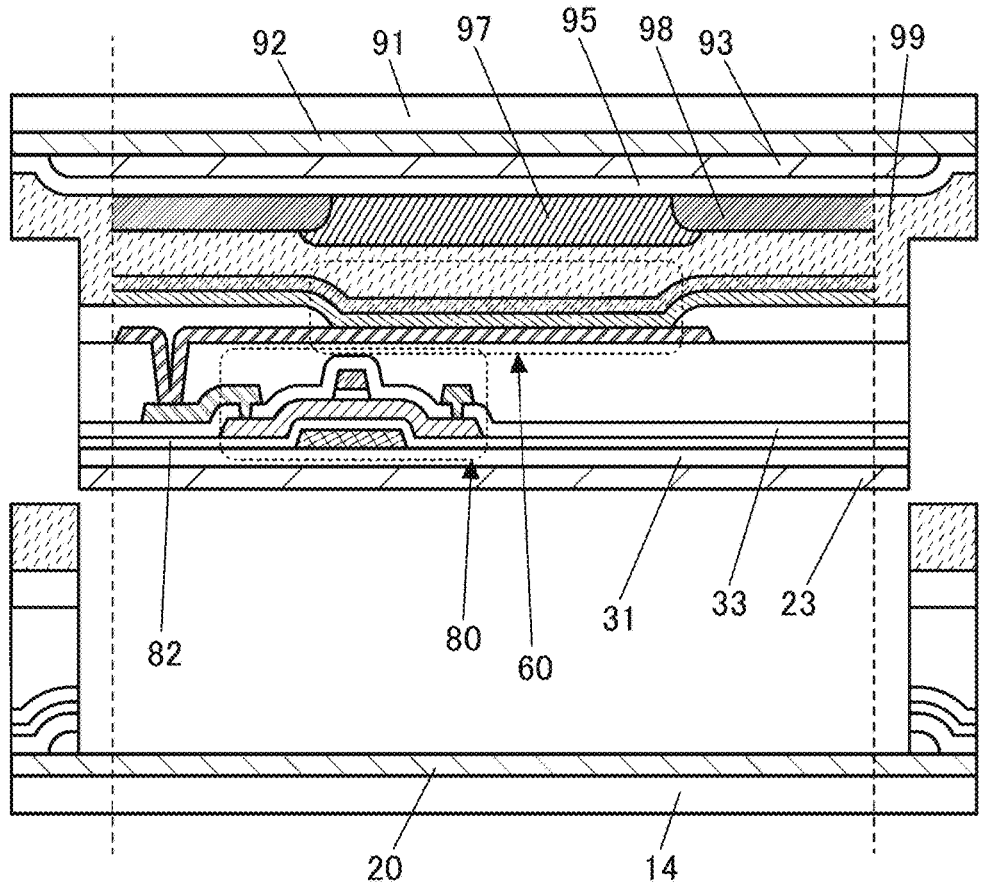
FIGS. 19A-B Cross-sectional views illustrating an example of a manufacturing method of a display device.

Next, the formation substrate 14 and the transistor 80 are separated from each other (FIG. 19(A)). In this example, the formation substrate 14 and a portion inside the region irradiated with the laser light 66 in a frame-like shape (i.e., a portion inside the laser-light irradiation region 67 illustrated in FIG. 18(B)) are separated from each other. Furthermore, although in the example illustrated in FIG. 19(A) separation occurs in the adhesive layer 99 (cohesive failure of the adhesive layer 99 occurs) in a portion outside the region irradiated with the laser light 66 in a frame-like shape, one embodiment of the present invention is not limited to this example. For example, outside the irradiation region 67, separation (also referred to as interfacial failure or adhesive failure) might occur between the adhesive layer 99 and the insulating layer 95 or the insulating layer 33.

In the manufacturing method example 2, the metal oxide layer 20 and the resin layer 23 are stacked and irradiated with light. As a result, the adhesion or adhesiveness between the metal oxide layer 20 and the resin layer 23 can be lowered. Accordingly, the formation substrate 14 and the resin layer 23 can be easily separated from each other.

Figure 19B:
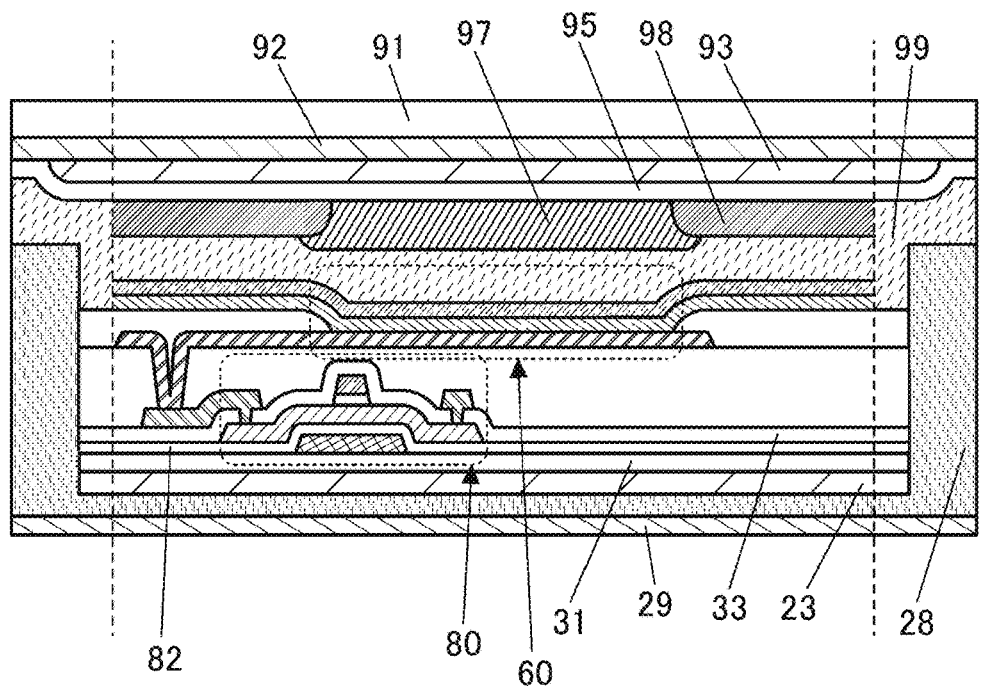

Next, the substrate 29 and the resin layer 23 that is exposed by being separated from the formation substrate 14 are bonded to each other using the adhesive layer 28 (FIG. 19(B)). The substrate 29 can serve as a supporting substrate of the display device.

Figure 20:
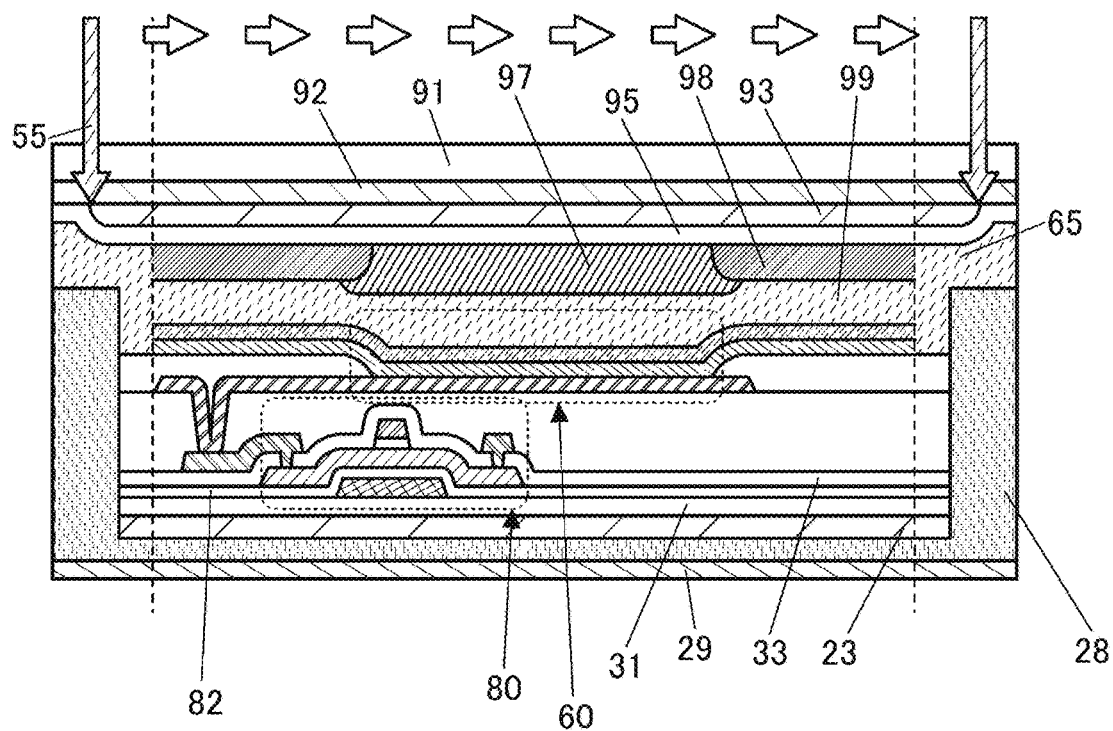
FIG. 20 A cross-sectional view illustrating an example of a manufacturing method of a display device.

Next, the irradiation with the laser light 55 is performed (FIG. 20). The laser light 55 is, for example, a linear laser beam with which scanning is performed from the left side to the right side in FIG. 20, and the major axis is perpendicular to the scanning direction and the incident direction (from top to bottom). In the laser apparatus, the stack is placed with the formation substrate 91 being on the upper side. The stack is irradiated with the laser light 55 from the upper side of the stack (the formation substrate 91).

The interface between the metal oxide layer 92 and the resin layer 93 or the vicinity thereof is preferably irradiated with the laser light 55 through the formation substrate 91. Furthermore, the inside of the metal oxide layer 92 may be irradiated with the laser light 55 or the inside of the resin layer 93 may be irradiated with the laser light 55.

The metal oxide layer 92 absorbs the laser light 55. The resin layer 93 may absorb the laser light 55.

The irradiation with the laser light 55 reduces adhesion or adhesiveness between the metal oxide layer 92 and the resin layer 93. The resin layer 93 is embrittled by irradiation with the laser light 55 in some cases.

For the laser light irradiation step, the description of the above peeling method can be referred to.

Figure 21A:
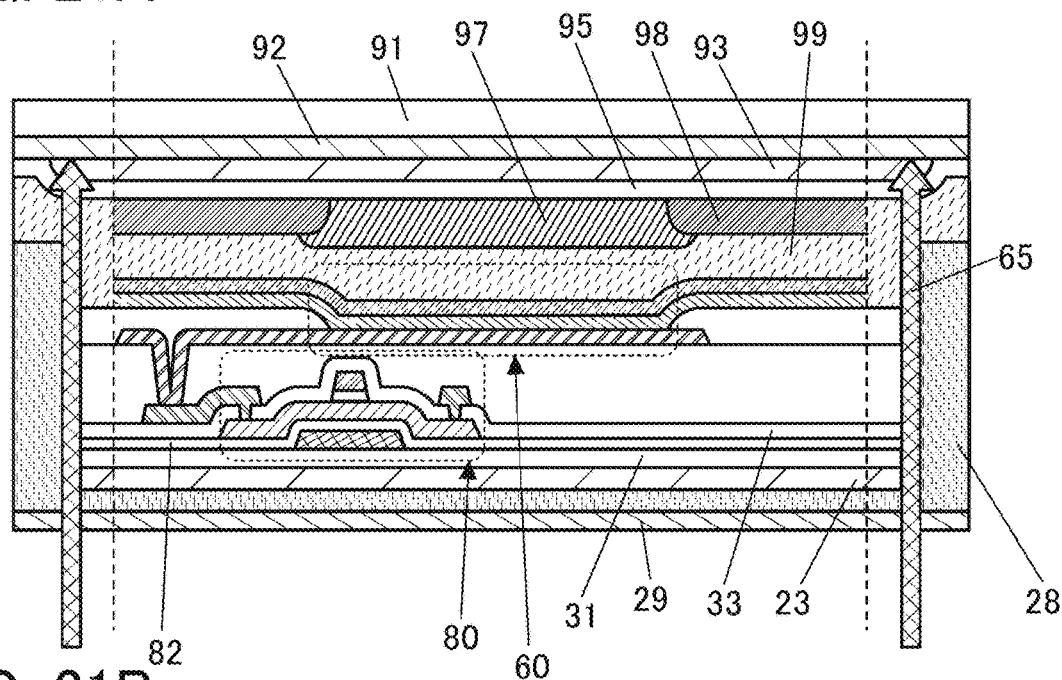
FIGS. 21A-B Cross-sectional views illustrating an example of a manufacturing method of a display device.

Next, a separation trigger is formed in the resin layer 93 (FIG. 21(A)).

In FIG. 21(A), the sharp instrument 65, e.g., a knife, is inserted from the substrate 29 side into a portion located inward from an end portion of the resin layer 93 to make a cut in a frame-like shape. This is suitable for the case where a resin is used for the substrate 29.

Alternatively, in a manner similar to that of the formation of the separation trigger in the resin layer 23, the resin layer 93 may be irradiated with laser light in a frame-like shape from the formation substrate 91 side.

The formation of the separation trigger enables the formation substrate 91 and the resin layer 93 to be separated from each other at desired timing. Accordingly, the timing of the separation can be controlled and the force required for the separation is small. This can increase the yield of the separation process and that of the manufacturing process of a display device.

Figure 21B:
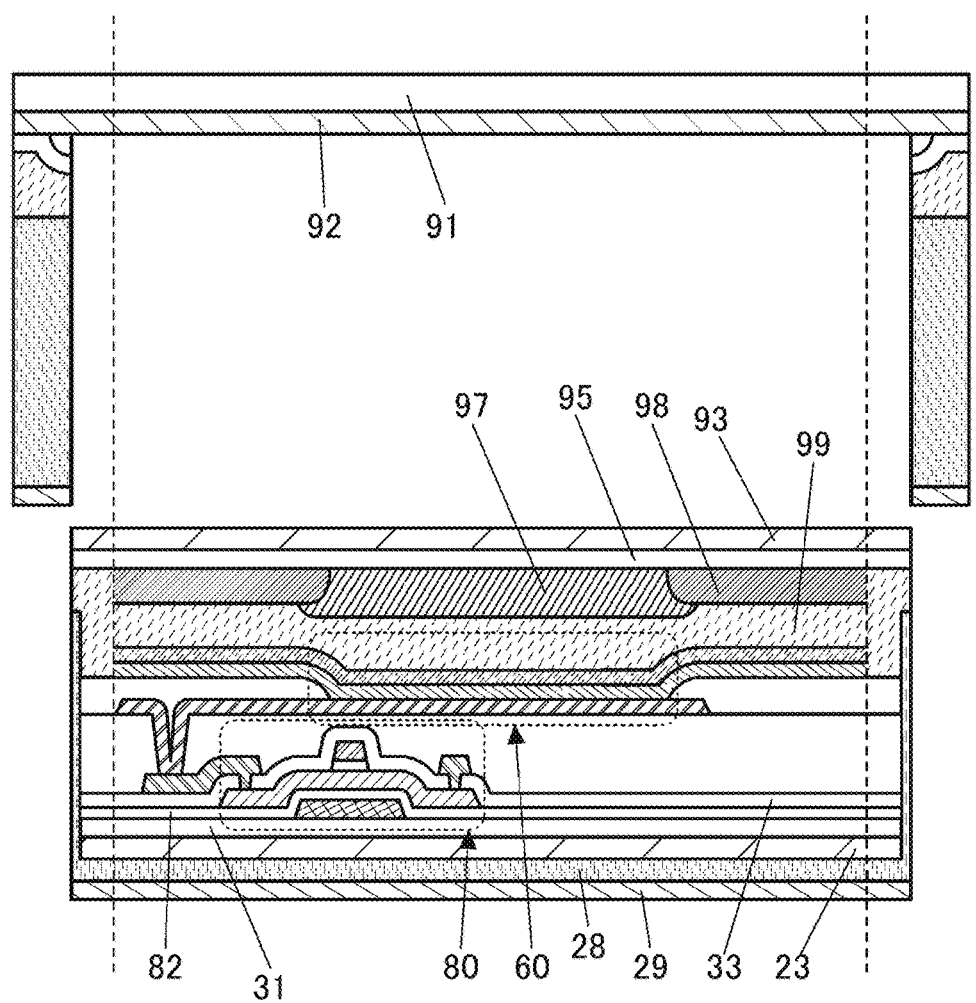

Next, the formation substrate 91 and the transistor 80 are separated from each other (FIG. 21(B)). In this example, the formation substrate 91 and a portion inside the frame-like cut are separated from each other.

In the manufacturing method example 2, the metal oxide layer 92 and the resin layer 93 are stacked and irradiated with light. As a result, the adhesion or adhesiveness between the metal oxide layer 92 and the resin layer 93 can be lowered. Accordingly, the formation substrate 91 and the resin layer 93 can be easily separated from each other.

Figure 22A:
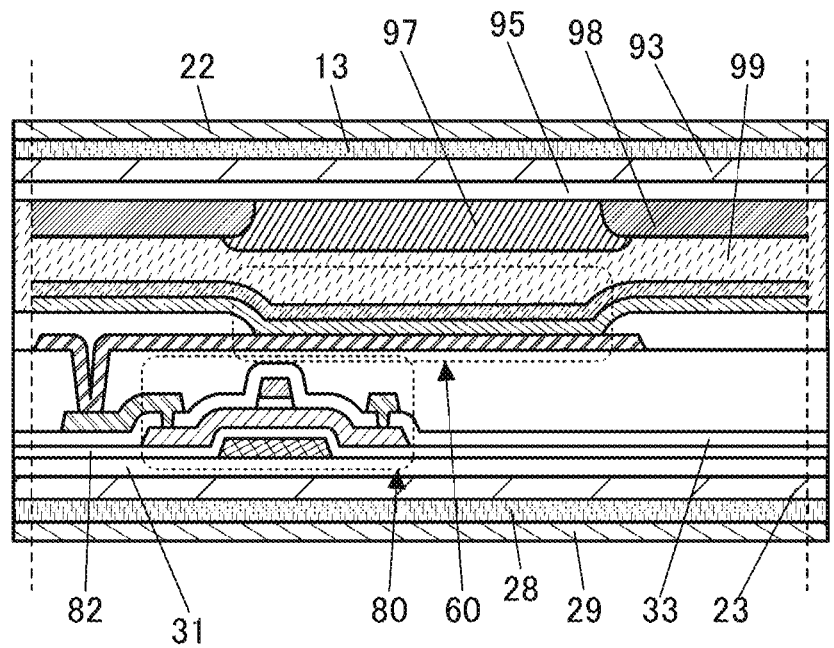
FIGS. 22A-B Cross-sectional views illustrating examples of a manufacturing method of a display device.

Next, a substrate 22 and the resin layer 93 that is exposed by being separated from the formation substrate 91 are bonded to each other using an adhesive layer 13 (FIG. 22(A)). The substrate 22 can serve as a supporting substrate of the display device.

In FIG. 22(A), light emitted from the light-emitting element 60 is extracted to the outside of the display device through the coloring layer 97, the insulating layer 95, and the resin layer 93. Thus, the resin layer 93 preferably has high visible-light transmittance. In one embodiment of the present invention, the resin layer 93 can have a small thickness. Accordingly, the resin layer 93 can have a high visible-light transmittance, which inhibits a reduction in light extraction efficiency of the light-emitting element 60.

Furthermore, in one embodiment of the present invention, the interface between the metal oxide layer 92 and the resin layer 93 or the vicinity thereof is irradiated with light, and the metal oxide layer 92 absorbs part of the light. Thus, even when the resin layer 93 has low light absorptance, the metal oxide layer 92 and the resin layer 93 can be easily separated from each other. Therefore, a material having high visible-light transmittance can be used for the resin layer 93. Consequently, a decrease in light extraction efficiency of the light-emitting element 60 can be prevented.

Figure 22B:
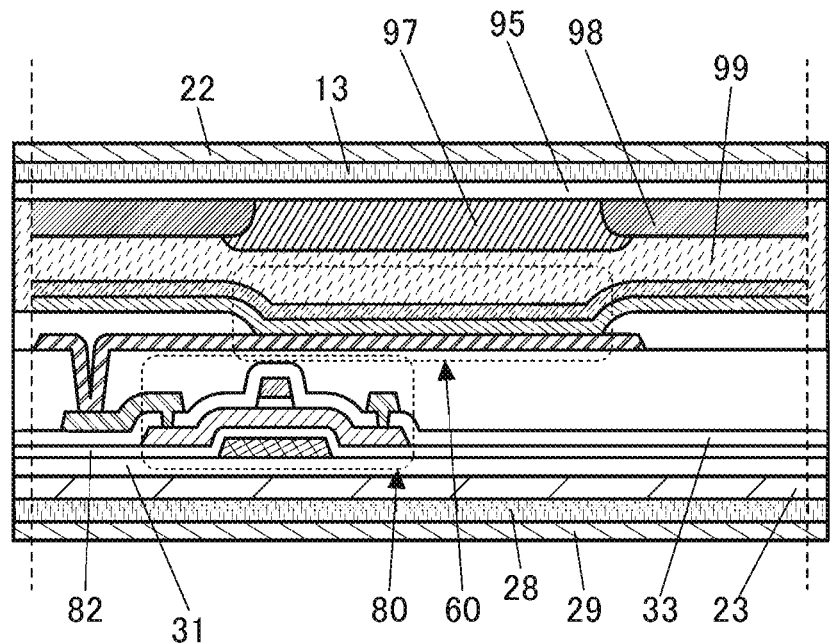

The resin layer 93 may be removed. In that case, the light extraction efficiency of the light-emitting element 60 can be further increased. FIG. 22(B) illustrates an example in which the resin layer 93 is removed and the substrate 22 is bonded to the insulating layer 95 with the adhesive layer 13.

The material that can be used for the adhesive layer 75b can be used for the adhesive layer 13.

The material that can be used for the substrate 75a can be used for the substrate 22.

In the manufacturing method example 2, the peeling method of one embodiment of the present invention is conducted twice to manufacture a display device. In one embodiment of the present invention, each of the functional elements and the like included in the display device is formed over the formation substrate; thus, even in the case where a high-resolution display device is manufactured, high alignment accuracy of a flexible substrate is not required. It is thus easy to attach the flexible substrate.

In addition, the use of the cleaning method of a substrate of this embodiment makes it possible to clean or retreat each of the formation substrate 14 and the formation substrate 91 after separation. For example, since the formation substrate 14 and the formation substrate 91 (e.g., glass substrates) or a stack including the formation substrate 14 and the metal oxide layer 20 and a stack including the formation substrate 91 and the metal oxide layer 92 can be repeatedly used multiple times in the peeling method of this embodiment, the manufacturing costs can be reduced.

Modification Example

In the manufacturing method example 2 (FIG. 16(D)), the case has been described where the adhesive layer 99 overlaps with both a portion where the metal oxide layer 20 and the insulating layer 31 are in contact with each other and a portion where the metal oxide layer 92 and the insulating layer 95 are in contact with each other.

The adhesion (adhesiveness) between the metal oxide layer 20 and the insulating layer 31 and the adhesion (adhesiveness) between the metal oxide layer 92 and the insulating layer 95 are higher than the adhesion (adhesiveness) between the metal oxide layer 20 and the resin layer 23 and the adhesion (adhesiveness) between the metal oxide layer 92 and the resin layer 93, respectively.

When peeling is caused at the interface between the metal oxide layer 20 and the insulating layer 31 or the interface between the metal oxide layer 92 and the insulating layer 95, peeling might be failed, for example, reducing the yield of peeling. Therefore, the process is suitable in which only the portion that overlaps with the resin layer is separated from the formation substrate after formation of a separation trigger in the resin layer in a frame-like shape.

Figure 23A:
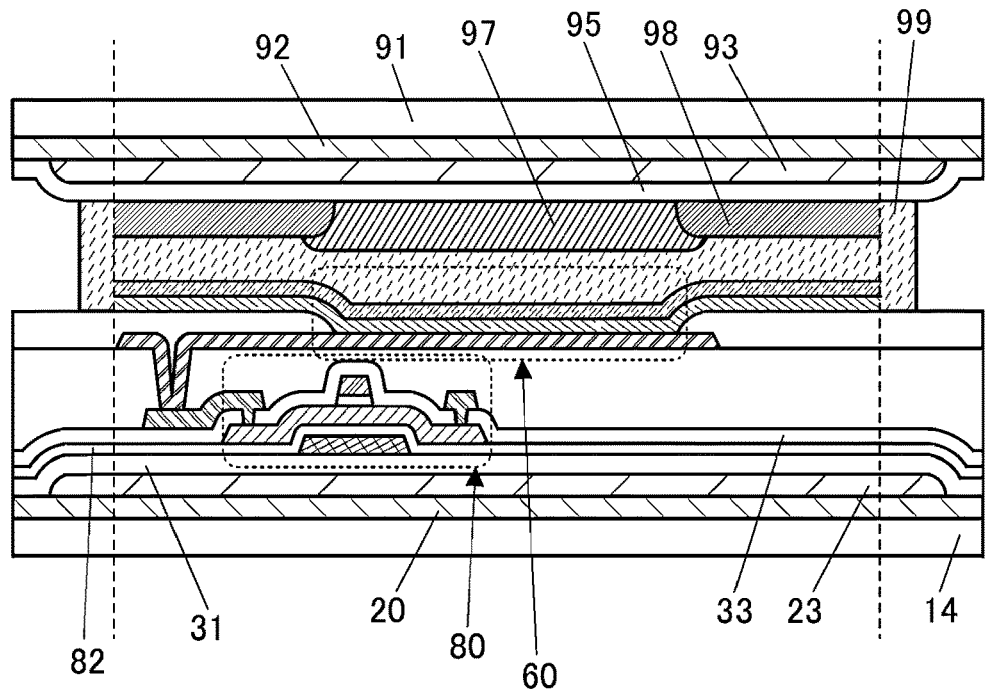
FIGS. 23A-B Cross-sectional views illustrating examples of a manufacturing method of a display device.

It is also possible to employ a structure in which the adhesive layer 99 does not overlap with the portion where the metal oxide layer 20 and the insulating layer 31 are in contact with each other and the portion where the metal oxide layer 92 and the insulating layer 95 are in contact with each other, as illustrated in FIGS. 23(A) and (B).

When an adhesive or an adhesive sheet having a low fluidity, for example, is used for the adhesive layer 99, the adhesive layer 99 can be easily formed to have an island-like shape (FIG. 23(A)).

Figure 23B:
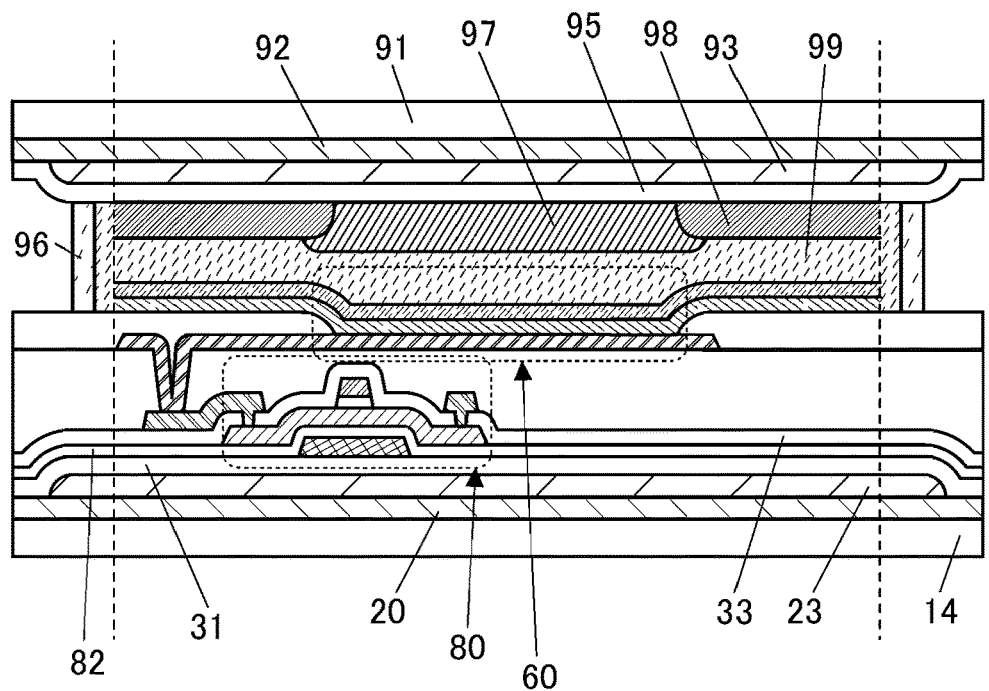

Alternatively, a partition 96 having a frame-like shape may be formed and the adhesive layer 99 may fill the portion surrounded by the partition 96 and be cured (FIG. 23(B)).

In the case where the partition 96 is used as a component of a display device, a cured resin is preferably used for the partition 96. In that case, it is preferable that the partition 96 not overlap with the portion where the metal oxide layer 20 and the insulating layer 31 are in contact with each other and the portion where the metal oxide layer 92 and the insulating layer 95 are in contact with each other, either.

In the case where the partition 96 is not used as a component of a display device, an uncured resin or a semi-cured resin is preferably used for the partition 96. In that case, the partition 96 may overlap with one or both of the portion where the metal oxide layer 20 and the insulating layer 31 are in contact with each other and the portion where the metal oxide layer 92 and the insulating layer 95 are in contact with each other.

In the example described in this embodiment, an uncured resin is used for the partition 96, and the partition 96 does not overlap with the portion where the metal oxide layer 20 and the insulating layer 31 are in contact with each other and the portion where the metal oxide layer 92 and the insulating layer 95 are in contact with each other.

Description is made on a method for forming a separation trigger in the structure in which the adhesive layer 99 does not overlap with the portion where the metal oxide layer 20 and the insulating layer 31 are in contact with each other and the portion where the metal oxide layer 92 and the insulating layer 95 are in contact with each other. An example in which the formation substrate 91 is peeled is described below. A similar method can be used when the formation substrate 14 is peeled.

FIGS. 24(A) to (E) illustrate positions of irradiation with the laser light 66 in the case where the formation substrate 91 and the resin layer 93 are separated from each other.

Figure 24A:
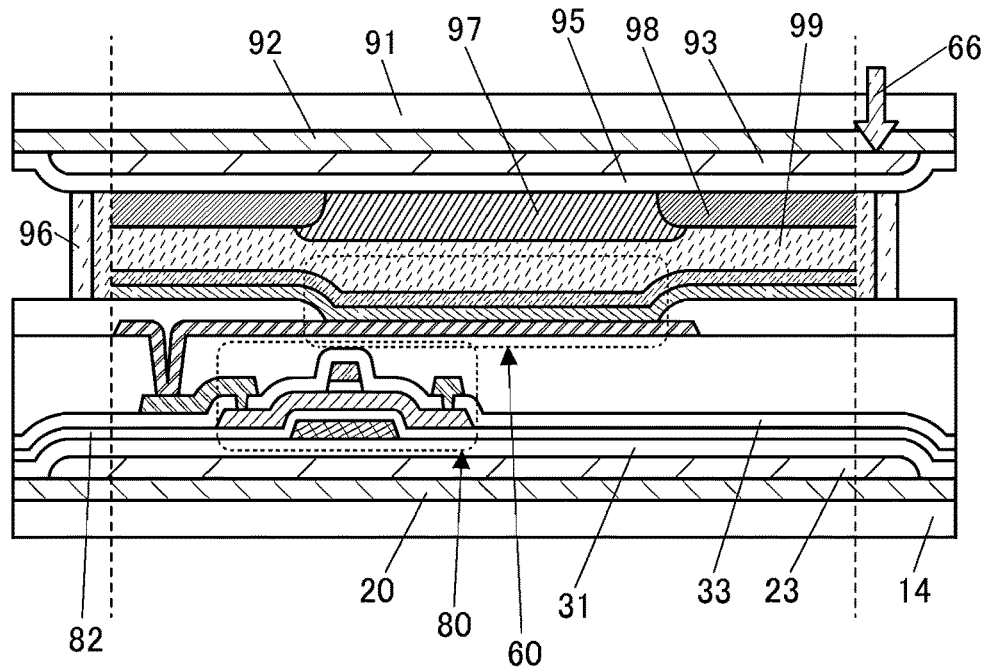
FIGS. 24A-E A cross-sectional view and top views illustrating examples of a manufacturing method of a display device.

As illustrated in FIG. 24(A), at least one place of a region where the resin layer 93 and the adhesive layer 99 overlap with each other is irradiated with the laser light 66, whereby the separation trigger can be formed.

It is preferable that the force for separating the formation substrate 91 and the resin layer 93 from each other be locally exerted on the separation trigger; therefore, the separation trigger is preferably formed in the vicinity of an end portion of the adhesive layer 99 rather than at the center of the adhesive layer 99. It is particularly preferable to form the separation trigger in the vicinity of the corner portion compared to the vicinity of the side portion among the vicinities of the end portion.

FIGS. 24(B) to (E) illustrate examples of the laser-light irradiation region 67.

Figure 24B:
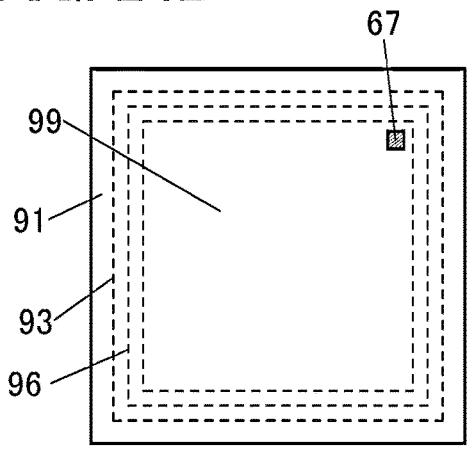

In FIG. 24(B), one laser-light irradiation region 67 is shown at the corner portion of the adhesive layer 99.

Figure 24C:
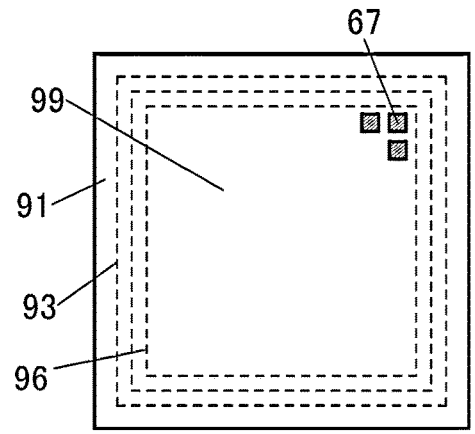
Figure 24D:
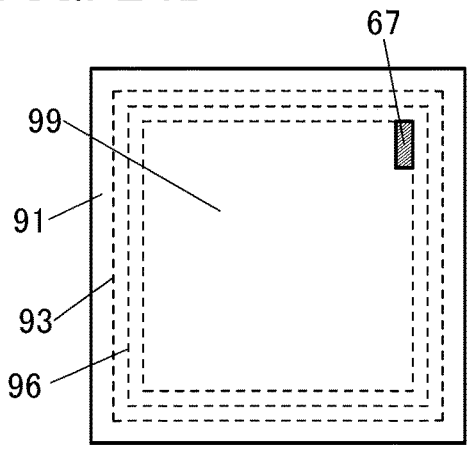
Figure 24E:
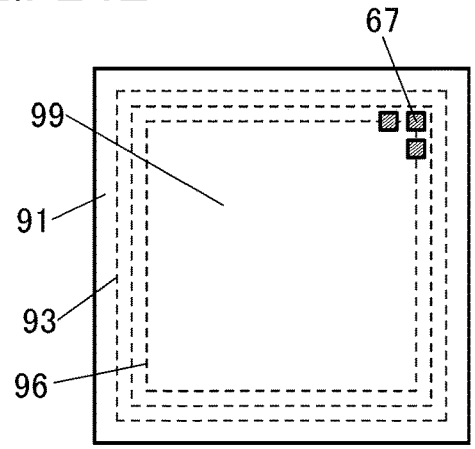

The separation trigger can be formed in the form of a solid line or a dashed line by continuous or intermittent irradiation with laser light. In FIG. 24(C), three laser-light irradiation regions 67 are shown at the corner portion of the adhesive layer 99. FIG. 24(D) illustrates an example in which the laser-light irradiation region 67 abuts on and extends along one side of the adhesive layer 99. As illustrated in FIG. 24(E), the laser-light irradiation region 67 may be positioned not only in a region where the adhesive layer 99 and the resin layer 93 overlap with each other but also in a region where the partition 96 not cured and the resin layer 93 overlap with each other.

Then, the formation substrate 91 and the resin layer 93 can be separated from each other. Note that part of the partition 96 remains on the formation substrate 14 side in some cases. The partition 96 may be removed or the next step may be performed without removal of the partition 96.

Structure Example 2 of Display Device

Figure 25A:
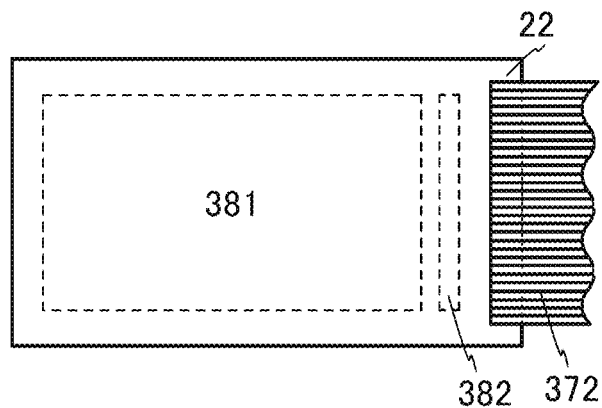
FIGS. 25A-B A top view and a cross-sectional view illustrating an example of a display device.
Figure 25B:
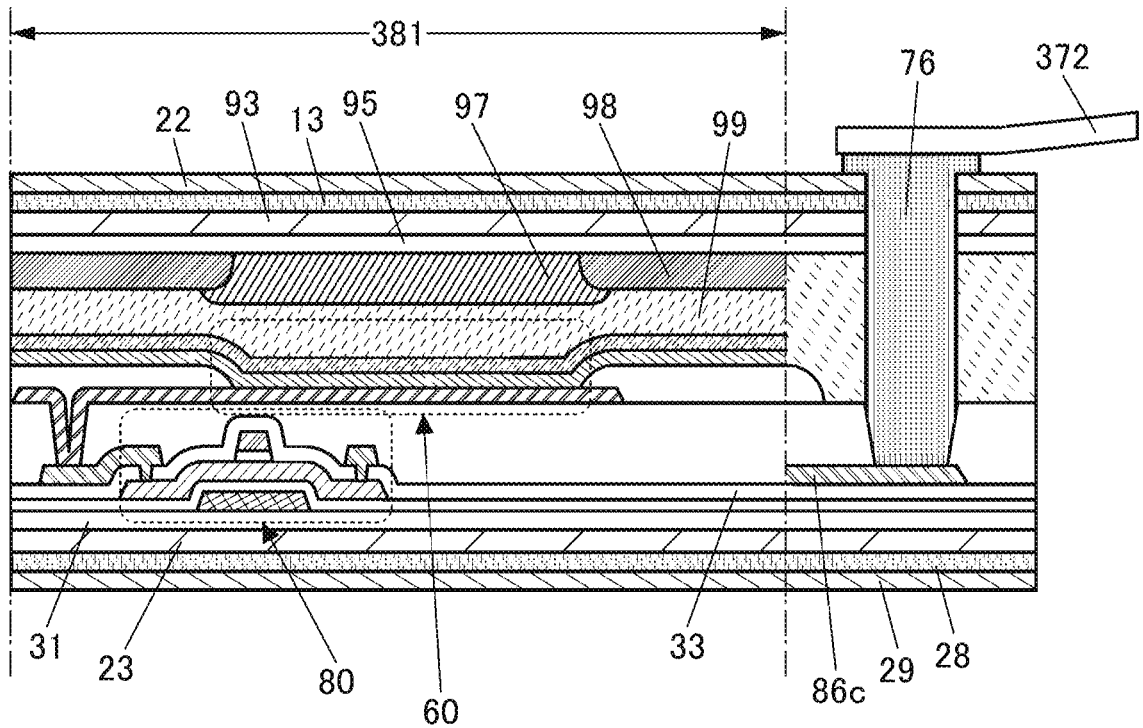

FIG. 25(A) is a top view of a display device 10B. FIG. 25(B) is an example of a cross-sectional view illustrating the display portion 381 of the display device 10B and a cross-sectional view illustrating a portion for connection to the FPC 372.

The display device 10B can be manufactured with the use of the above manufacturing method example 2. The display device 10B can be held in a bent state and can be bent repeatedly, for example.

The display device 10B includes the substrate 22 and the substrate 29. The substrate 22 side is the display surface side of the display device 10B. The display device 10B includes the display portion 381 and the driver circuit portion 382. The FPC 372 is attached to the display device 10B.

A film is preferably used as each of the substrate 22 and the substrate 29, and a resin film is particularly preferably used. In that case, the display device can be reduced in weight and thickness. Furthermore, the display device using a film substrate is less likely to be broken than that in the case of using glass, a metal, or the like. In addition, the display device can have higher flexibility.

A conductive layer 86c and the FPC 372 are electrically connected through the connector 76 (FIG. 25(B)). The conductive layer 86c can be formed using the same material and the same step as those of the source and the drain of the transistor.

Example of Stack Manufacturing Apparatus

Next, an example of a stack manufacturing apparatus will be described with reference to FIG. 26. With the stack manufacturing apparatus illustrated in FIG. 26, a layer to be peeled can be peeled from a formation substrate by the peeling method of this embodiment and transferred to another substrate. With the use of the stack manufacturing apparatus illustrated in FIG. 26, a stack such as a semiconductor device or a display device can be manufactured.

Figure 26:
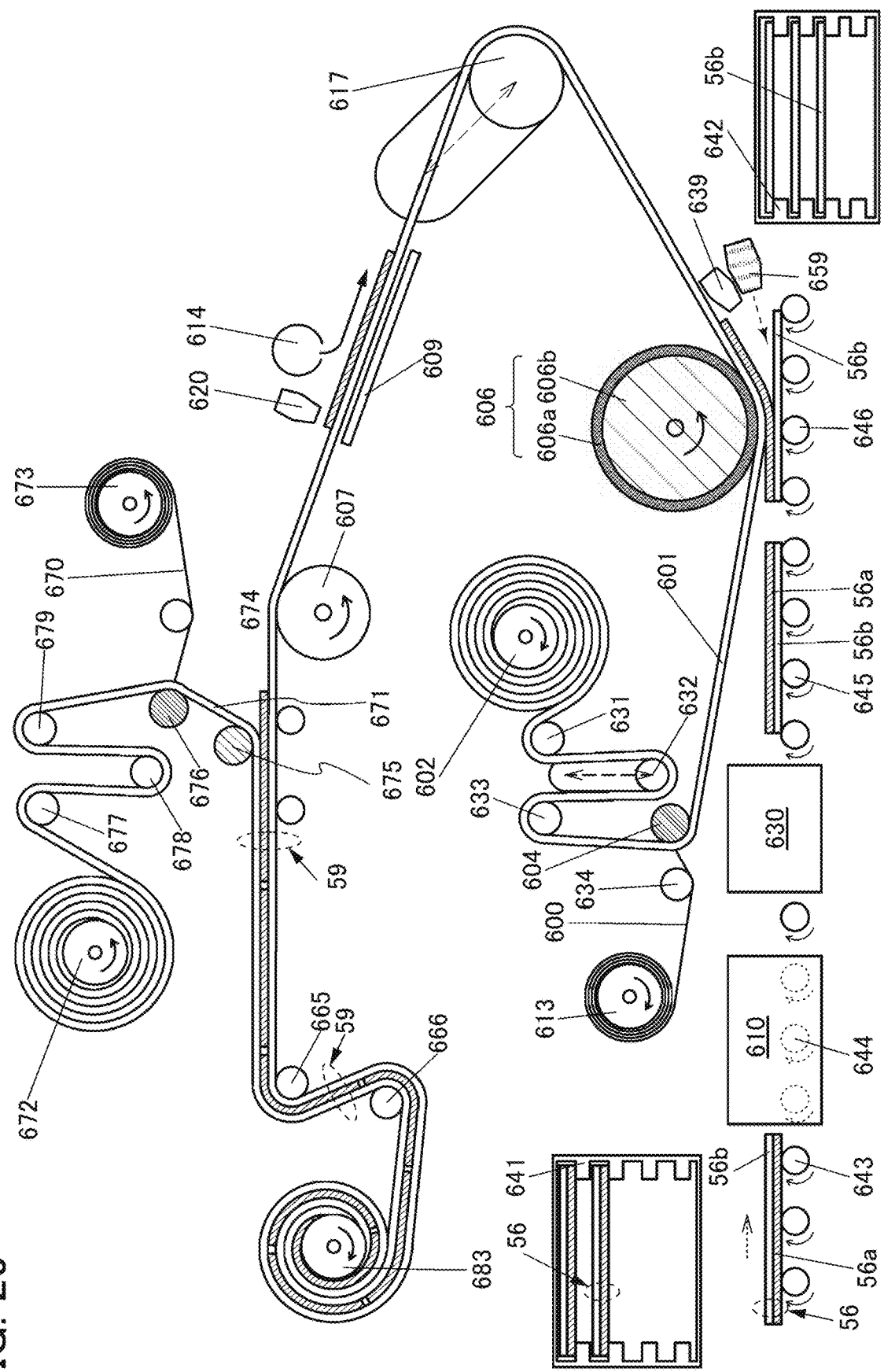
FIG. 26 A drawing illustrating an example of a stack manufacturing apparatus.

The stack manufacturing apparatus illustrated in FIG. 26 includes a laser irradiation unit 610, a substrate reversing unit 630, a plurality of transfer rollers (e.g., transfer rollers 643, 644, 645, and 646), a tape reel 602, a wind-up reel 683, a direction changing roller 604, and a press roller 606.

A stack 56 that can be treated with the stack manufacturing apparatus illustrated in FIG. 26 has, for example, a structure in which a member 56a to be peeled and a support 56b are stacked. In the stack 56, peeling occurs between the member 56a to be peeled and the support 56b. The member 56*a* to be peeled includes a resin layer and the support 56*b* includes a formation substrate, for example.

The stack manufacturing apparatus illustrated in FIG. 26 attaches a support 601 to the stack 56 and pulls the support 601, so that the member 56*a* to be peeled is peeled from the stack 56. Since the stack 56 can be automatically divided with the use of the support 601, the processing time can be shortened and the manufacturing yield of products can be improved.

The member 56*a* to be peeled that is separated from the support 56*b* is bonded to a support 671 with an adhesive. As a result, a stack 59 in which the support 601, the member 56*a* to be peeled, and the support 671 are stacked in this order can be manufactured.

The plurality of transfer rollers can transfer the stack 56. The transfer mechanism that transfers the stack 56 is not limited to a transfer roller and may be a conveyor belt, a transfer robot, or the like. Furthermore, the stack 56 may be placed over a stage over the transfer mechanism.

The transfer roller 643, the transfer roller 644, the transfer roller 645, and the transfer roller 646, each of which is one of the plurality of transfer rollers that are lined up, are provided at predetermined intervals and rotationally driven in the direction in which the stack 56, the member 56*a* to be peeled, or the support 56*b* is sent (the clockwise direction as indicated by solid arrows). The plurality of lined-up transfer rollers are each rotationally driven by a driving portion (e.g., a motor), which is not illustrated.

The laser irradiation unit 610 is a unit for irradiating the stack 56 with laser light. As a laser, for example, an excimer laser that emits ultraviolet light with a wavelength of 308 nm can be used. Furthermore, a high-pressure mercury lamp, a UV-LED, or the like may be used.

As illustrated in FIG. 26, the stack 56 is transferred to the laser irradiation unit 610 with the support 56*b* positioned on the upper side.

The excimer laser is a pulsed laser with high output, which can shape a beam into a linear form with an optical system. The substrate is moved at an irradiation position of a linear laser light beam, so that the whole or necessary portion of the substrate can be irradiated with laser light. Note that when the length of a linear beam is longer than or equal to one side of the substrate used, moving the substrate only in one direction enables the whole substrate to be irradiated with laser light. The oscillation frequency of the pulsed laser is preferably greater than or equal to 1 Hz and less than or equal to 300 Hz, further preferably around 60 Hz.

As an excimer laser apparatus, besides an apparatus on which one laser oscillator is mounted, an apparatus on which two or more laser oscillators are mounted can also be used. In the apparatus on which a plurality of laser oscillators are mounted, laser light that is output in synchronization from the laser oscillators is synthesized (superimposed) with an optical system, so that laser light with high energy density can be obtained. Thus, in the application according to this embodiment, a glass substrate whose size is larger than or equal to the 3.5th generation (600 mm×720 mm), larger than or equal to the 6th generation (1500 mm×1850 mm), larger than or equal to the 7th generation (1870 mm×2200 mm), or larger than or equal to the 8th generation (2160 mm×2460 mm) can be treated. Furthermore, in the apparatus on which a plurality of laser oscillators are mounted, the output variations of laser light emitted from the laser oscillators compensate for each other, so that a variation in intensity per pulse is reduced, and high-yield treatment can be performed.

Note that instead of a plurality of laser oscillators, a plurality of excimer laser apparatuses may be used.

Figure 27A:
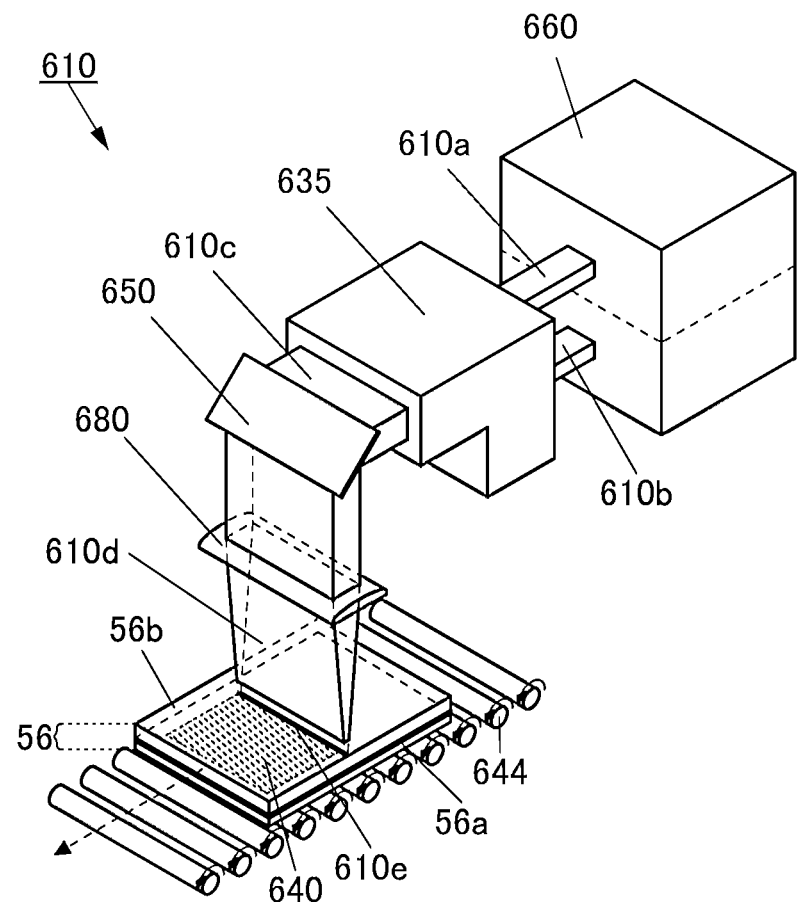
FIGS. 27A-B Drawings illustrating an example of a laser irradiation unit.

FIG. 27(A) illustrates an example of the laser irradiation unit 610 using an excimer laser. Laser light 610*a* and laser light 610*b* emitted from an excimer laser apparatus 660 having two laser oscillators are synthesized by an optical system 635. Moreover, laser light 610*c* that is extended horizontally by the optical system 635 is incident on a lens 680 via a mirror 650. Laser light 610*d* transmitted through the lens 680 is reduced compared with the laser light 610*c*. At this time, the processing region 640 included in the stack 56 is irradiated with the laser light 610*d* through the support 56*b* (e.g., a glass substrate). Hereinafter, part of the laser light 610*d* with which the processing region 640 is irradiated is referred to as a linear beam 610*e*.

Note that although the example including two laser oscillators is described here, the structure including one laser oscillator may be used, in which case the apparatus can be simplified. Furthermore, the structure including three or more laser oscillators may be used, in which case the intensity of the linear beam 610*e* can be increased.

By moving the stack 56 by the transfer roller 644 in a direction indicated by an arrow in the drawing, the processing region 640 can be irradiated with the linear beam 610*e*.

The irradiation with the linear beam 610*e* is performed while the stack 56 is transferred by the transfer roller 644 at a certain speed as illustrated in FIG. 27(A); thus, the processing time can be shortened. Note that the stack 56 may be placed on a stage that is movable at least in one direction, and the irradiation with the linear beam 610*e* may be performed while the stage is moved. Note that in the case of using a stage, the stage is preferably movable in a lateral direction with respect to a travelling direction and a height direction and is preferably capable of adjusting the position or the depth of the focus of the linear beam 610*e*. Note that although FIG. 27(A) illustrates an example where the irradiation with the linear beam 610*e* is performed by moving the stack 56, one embodiment of the present invention is not limited thereto. For example, the stack 56 may be irradiated with the linear beam 610*e* by fixing the stack 56 and moving the excimer laser apparatus 660 or the like.

In the example illustrated in FIG. 27(A), the processing region 640 that is irradiated with the linear beam 610*e* is located inward from an end portion of the stack 56. Thus, a region outside the processing region 640 maintains a strong adhesion state, which can prevent peeling during transfer. Note that the width of the linear beam 610*e* may be the same as that of the stack 56 or larger than that of the stack 56. In that case, the whole stack 56 can be irradiated with the linear beam 610*e*.

Figure 27B:
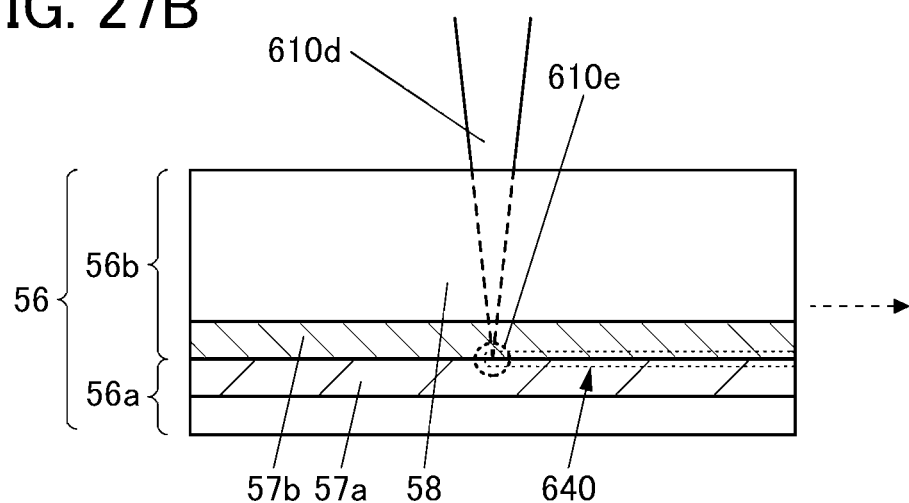

FIG. 27(B) illustrates a state where the processing region 640 of the stack 56 is irradiated with the linear beam 610*e*. The stack 56 includes a formation substrate 58, a first layer 57*a*, and a second layer 57*b*. Here, a portion including the formation substrate 58 and the second layer 57*b* corresponds to the support 56*b*, and a portion including the first layer 57*a* corresponds to the member 56*a* to be peeled.

For example, the first layer 57*a* corresponds to the resin layer 23 and the second layer 57*b* corresponds to the metal oxide layer 20.

It is preferable that the laser light 610*d* pass through the formation substrate 58 and an interface between the first layer 57*a* and the second layer 57*b* or the vicinity thereof be irradiated with the linear beam 610*e*. It is particularly preferable that the focus of the linear beam 610*e* be positioned at the interface between the first layer 57*a* and the second layer 57*b* or the vicinity thereof.

Furthermore, when the focus of the linear beam 610e is positioned at the interface between the first layer 57a and the second layer 57b, water which might exist at the interface between the first layer 57a and the second layer 57b is vaporized and the volume of the water rapidly increases in some cases. In that case, a peeling phenomenon is assumed to occur at the interface between the first layer 57a and the second layer 57b or the vicinity thereof owing to the increase in the volume of the water.

Note that there is a technique of crystallizing an amorphous silicon film by irradiation of the amorphous silicon film with laser light. In the case of the technique, the laser light is focused on the inside of the amorphous silicon film. However, in one embodiment of the present invention, as illustrated in FIG. 27(B), the focus of the laser light (here, the linear beam 610e) is at the interface between the first layer 57a and the second layer 57b or the vicinity thereof. In this manner, one embodiment of the present invention is different from the technique of crystallizing an amorphous silicon film in the focus position of laser light.

Furthermore, in the case where the depth of the focus of the linear beam 610e is sufficiently large (deep), the focus of the linear beam 610e is positioned not only at the interface between the first layer 57a and the second layer 57b or in the vicinity thereof but also across the entire first layer 57a in the thickness direction, the entire second layer 57b in the thickness direction, or both the entire first layer 57a and the entire second layer 57b in the thickness directions in some cases.

Note that as the excimer laser, a laser having a wavelength of 308 nm or longer is preferably used. When the wavelength is 308 nm or longer, the laser light that is necessary for processing can be sufficiently transmitted even when a glass substrate is used for the support 56b.

The substrate reversing unit 630 illustrated in FIG. 26 is a unit for turning the stack 56 upside down. For example, the substrate reversing unit 630 can include transfer rollers between which the stack 56 is sandwiched from above and below and the transfer rollers can include a rotatable mechanism. Note that the structure of the substrate reversing unit 630 is not limited thereto, and the transfer rollers between which the stack 56 is sandwiched from above and below may be placed in a spiral, or the substrate reversing unit 630 may include a transfer arm which is capable of reversing.

In the stack 56 after passing through the substrate reversing unit 630, the member 56a to be peeled is positioned on the upper side as illustrated in FIG. 26.

The tape reel 602 can unreel the support 601 in a rolled sheet form. The speed at which the support 601 is unreeled is preferably adjustable. When the speed is set relatively low, for example, failure in peeling of the stack or a crack in a peeled member can be inhibited.

The wind-up reel 683 can wind up the stack 59.

The tape reel 602 and the wind-up reel 683 can apply tension to the support 601.

The support 601 is unreeled continuously or intermittently. It is preferable to unreel the support 601 continuously because peeling can be performed at a uniform speed and with a uniform force. In a peeling process, the peeling preferably proceeds successively without a stop in the middle, and further preferably, the peeling proceeds at a constant speed. When the peeling stops in the middle of the process and then the peeling resumes from the same region, distortion or the like occurs in the region, unlike in the case where the peeling successively proceeds. Thus, a minute structure of the region or the characteristics of an electronic device or the like in the region are changed, which might influence display of a display device, for example.

As the support 601, a film in a rolled sheet form made of an organic resin, a metal, an alloy, glass, or the like can be used.

In FIG. 26, the support 601 is a member that constitutes a device to be manufactured (e.g., a flexible device) together with the member 56a to be peeled, which is typified by a flexible substrate. The support 601 may be a member that does not constitute the device to be manufactured, which is typified by a carrier tape.

The delivery direction of the support 601 can be changed by the direction changing roller 604. In the example illustrated in FIG. 26, the direction changing roller 604 is positioned between the tape reel 602 and the press roller 606.

The support 601 is bonded to the stack 56 (the member 56a to be peeled) by the press roller 606 and the transfer roller 645.

In the structure illustrated in FIG. 26, the support 601 can be prevented from being in contact with the stack 56 before reaching the press roller 606. Accordingly, air bubbles can be inhibited from being included between the support 601 and the stack 56.

The press roller 606 is rotated by a driving portion (e.g., a motor) which is not illustrated. When the press roller 606 rotates, the force of peeling the member 56a to be peeled is applied to the stack 56; thus, the member 56a to be peeled is peeled. At this time, preferably, a peeling trigger has been formed in the stack 56. Peeling of the member 56a to be peeled starts from the peeling trigger. As a result, the stack 56 is divided into the member 56a to be peeled and the support 56b.

The mechanism that peels the member 56a to be peeled from the stack 56 is not limited to the press roller 606, and a structure body having a convex surface (or a convex curved surface or a convex-shaped curved surface) can be used. For example, a cylindrical (including circular cylindrical, right circular cylindrical, elliptic cylindrical, parabolic cylindrical, and the like) or spherical structure body can be used. A roller such as a drum-shaped roller can be used, for example. Examples of the shape of the structure body include a column with a bottom surface constituted by a curved line (e.g., a cylinder with a perfect circle-shaped bottom surface or an elliptic cylinder with an ellipse-shaped bottom surface), and a column with a bottom surface constituted by a curved line and a straight line (e.g., a column with a semicircular bottom surface or a semi-elliptical bottom surface). When the shape of the structure body is any of such columns, the convex surface corresponds to a curved surface of the column.

As a material for the structure body, a metal, an alloy, an organic resin, rubber, and the like can be given. The structure body may have a space or a hollow inside. As the rubber, natural rubber, urethane rubber, nitrile rubber, neoprene rubber, and the like can be given. In the case of using rubber, it is preferable to use a material unlikely to be charged by friction or peeling or to take countermeasures to prevent static electricity. For example, the press roller 606 illustrated in FIG. 26 includes a hollow cylinder 606a formed using rubber or an organic resin and a circular cylinder 606b formed using a metal or an alloy and positioned inside the cylinder 606a.

The rotation speed of the press roller 606 is preferably adjustable. By adjusting the rotation speed of the press roller 606, the yield of peeling can be further increased.

The press roller 606 and the plurality of transfer rollers may be movable in at least one direction (e.g., vertically, horizontally, or back and forth). The distance between the convex surface of the press roller 606 and a supporting surface of the transfer roller is preferably adjustable because peeling can be performed on stacks with a variety of thicknesses.

There is no particular limitation on an angle at which the press roller 606 bends back the support 601. FIG. 26 illustrates an example where the press roller 606 bends back the support 601 at an obtuse angle.

The stack manufacturing apparatus illustrated in FIG. 26 further includes a roller 617. The roller 617 can deliver the support 601 from the press roller 606 to the wind-up reel 683 along the convex surface.

The roller 617 is movable in one or more directions.

The roller 617 can apply tension to the support 601 by moving the shaft of the roller 617. That is, the roller 617 is also referred to as a tension roller. Specifically, the support 601 can be pulled in the delivery direction changed with the press roller 606.

Moving the shaft of the roller 617 enables the roller 617 to control the angle at which the press roller 606 bends back the support 601.

The roller 617 can bend back the support 601 to change the delivery direction of the support 601. For example, the delivery direction of the support 601 may be changed to the horizontal direction. Alternatively, after the roller 617 bends back the support 601 to change the delivery direction of the support 601, the delivery direction of the support 601 may be further changed to the horizontal direction by a direction changing roller 607 located between the roller 617 and the wind-up reel 683.

The stack manufacturing apparatus illustrated in FIG. 26 further includes guide rollers (e.g., guide rollers 631, 632, and 633), a wind-up reel 613, a liquid feeding mechanism 659, a drying mechanism 614, and ionizers (ionizers 639 and 620).

The stack manufacturing apparatus may include a guide roller that guides the support 601 to the wind-up reel 683. One guide roller may be used, or a plurality of guide rollers may be used. Like the guide roller 632, the guide roller may be capable of applying tension to the support 601.

A tape 600 (also called separate film) may be bonded to at least one surface of the support 601. In this case, the stack manufacturing apparatus preferably includes a reel that can wind up the tape 600 bonded to one surface of the support 601. FIG. 26 illustrates an example in which the wind-up reel 613 is positioned between the tape reel 602 and the press roller 606. Furthermore, the stack manufacturing apparatus may include a guide roller 634. The guide roller 634 can guide the tape 600 to the wind-up reel 613.

The stack manufacturing apparatus may include the drying mechanism 614. Since a functional element (e.g., a transistor or a thin film integrated circuit) included in the member 56a to be peeled is vulnerable to static electricity, it is preferable that a liquid be fed to the interface between the member 56a to be peeled and the support 56b before peeling or that the peeling be performed while a liquid is fed to the interface. Furthermore, the presence of the liquid in the portion where the peeling proceeds can decrease the force required for the peeling. The peeling can be performed while a liquid is fed to the interface with the liquid feeding mechanism 659. Since a watermark might be formed if the liquid is vaporized while being adhered to the member 56a to be peeled, the liquid is preferably removed immediately after the peeling. Thus, blowing is preferably performed on the member 56a to be peeled including a functional element to remove a droplet left on the member 56a to be peeled. Therefore, watermark generation can be suppressed. Furthermore, a carrier plate 609 may be provided to prevent slack in the support 601.

It is preferable that an air flow downward along the inclination of the support 601 so that the droplet drips down while the support 601 is transferred in an oblique direction relative to the horizontal plane.

Although the transfer direction of the support 601 can also be perpendicular to the horizontal plane, the transfer direction that is oblique to the horizontal plane enables higher stability and less shaking of the support 601 during the transfer.

During the process, a static eliminator included in the stack manufacturing apparatus is preferably used at a position where static electricity might be generated. There is no particular limitation on the static eliminator, and for example, a corona discharge ionizer, a soft X-ray ionizer, or an ultraviolet ionizer can be used.

For example, it is preferable that the stack manufacturing apparatus be provided with an ionizer and static elimination be performed by spraying the member 56a to be peeled with air, a nitrogen gas, or the like from the ionizer to reduce effects of static electricity on the functional element. It is particularly preferable to use the ionizer in a step of bonding two members to each other and a step of dividing one member.

For example, the stack 56 is preferably divided into the member 56a to be peeled and the support 56b while the vicinity of the interface between the member 56a to be peeled and the support 56b is irradiated with ions using the ionizer 639 to remove static electricity.

The stack manufacturing apparatus may include a substrate load cassette 641 and a substrate unload cassette 642. For example, the stack 56 can be supplied to the substrate load cassette 641. The substrate load cassette 641 can supply the stack 56 to the transfer mechanism or the like. Furthermore, the support 56b can be supplied to the substrate unload cassette 642.

A tape reel 672 can unreel the support 671 in a rolled sheet form. For the support 671, a material similar to that for the support 601 can be used.

The tape reel 672 and the wind-up reel 683 can apply tension to the support 671.

The stack manufacturing apparatus may include guide rollers 677, 678, and 679 that guide the support 671 to the wind-up reel 683.

The delivery direction of the support 671 can be changed by the direction changing roller 676.

A press roller 675 can bond the member 56a to be peeled to the support 671 that is unreeled by the tape reel 672 while applying pressure to them. Accordingly, inclusion of air bubbles between the support 671 and the member 56a to be peeled can be inhibited.

A separation tape 670 may be bonded to at least one surface of the support 671. A reel 673 can wind up the separation tape 670. A guide roller 674 can guide the separation tape 670 to the reel 673.

The manufactured stack 59 may be wound up or cut. FIG. 26 illustrates an example in which the wind-up reel 683 winds up the stack 59. A guide roller guiding the stack 59 to the wind-up reel 683, such as guide rollers 665 and 666, may be provided.

In the stack manufacturing apparatus illustrated in FIG. 26, the member 56a to be peeled is peeled from the stack 56 by the press roller 606 and the member 56*a* to be peeled can be transferred to the support 671 by the press roller 675.

As described above, in the peeling method described in this embodiment, the metal oxide layer and the resin layer are stacked over the formation substrate and the peelability of the resin layer with respect to the metal oxide layer is adjusted by light irradiation. Furthermore, over the metal oxide layer are provided a portion in contact with the resin layer and a portion in contact with the insulating layer, so that the resin layer can be peeled from the formation substrate at desired timing. Therefore, display devices and the like can be manufactured with a high yield by the peeling method described in this embodiment.

This embodiment can be combined with the other embodiments as appropriate. Moreover, in this specification, in the case where a plurality of structure examples are shown in one embodiment, the structure examples can be combined as appropriate.

Embodiment 2

In this embodiment, a display device that can be manufactured by applying one embodiment of the present invention will be described with reference to FIG. 28 and FIG. 29.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which performs display by reflecting external light can be used. Such an element does not include a light source (or does not use an artificial light source); thus, power consumed in performing display can be significantly reduced.

As the first display element, typically, a reflective liquid crystal element can be used. Alternatively, as the first display element, an element or the like using a microcapsule method, an electrophoretic method, an electrowetting method, an Electronic Liquid Powder (registered trademark) method, or the like can be used, other than a shutter type MEMS (Micro Electro Mechanical System) element or an optical interference type MEMS element.

As the second display element, a light-emitting element is preferably used. Since the luminance and the chromaticity of light emitted from such a display element are not affected by external light, vivid display that has high color reproducibility (wide color gamut) and a high contrast can be performed.

As the second display element, a self-luminous light-emitting element such as an OLED (Organic Light Emitting Diode), an LED (Light Emitting Diode), or a QLED (Quantum-dot Light Emitting Diode) can be used.

The display device of this embodiment has a first mode in which an image is displayed using only the first display element, a second mode in which an image is displayed using only the second display element, and a third mode in which an image is displayed using the first display element and the second display element, and can be automatically or manually switched between these modes.

In the first mode, an image is displayed using the first display element and external light. The first mode, which does not need a light source, is an extremely low power consumption mode. When sufficient external light enters the display device (e.g., in a bright environment), for example, display can be performed by using light reflected by the first display element. The first mode is effective in the case where external light is white light or light near white light and is sufficiently strong, for example. The first mode is a mode suitable for displaying text. Furthermore, the first mode enables eye-friendly display owing to the use of reflected external light, by which eyestrain is not easily caused.

In the second mode, an image is displayed using light emitted from the second display element. Thus, extremely vivid display (with high contrast and excellent color reproducibility) can be performed regardless of the illuminance and the chromaticity of external light. The second mode is effective in the case of extremely low illuminance, such as in a night environment or in a dark room, for example. When bright display is performed in a dark environment, a user may feel that the display is too bright. To prevent this, display with reduced luminance is preferably performed in the second mode. Thus, not only a reduction in glare but also low power consumption can be achieved. The second mode is a mode suitable for displaying a vivid image (a still image and a moving image) or the like.

In the third mode, display is performed using both light reflected by the first display element and light emitted from the second display element. While the third mode performs more vivid display than the first mode, the power consumption can be lower than that in the second mode. The third mode is effective in the case where the illuminance is relatively low or in the case where the chromaticity of external light is not white, for example, in an environment under indoor illumination or in a time period such as morning or evening.

With such a structure, a highly convenient display device with high visibility regardless of the ambient brightness can be fabricated. Specifically, a highly convenient display device with high visibility under external light and indoors can be fabricated.

Note that the third mode can be referred to as a mode employing a hybrid display method.

Furthermore, the display device and the input/output device described in this embodiment can be referred to as a hybrid display.

Hybrid display is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display performing hybrid display is locally observed, a pixel or a subpixel performing display using any one of the plurality of display elements and a pixel or a subpixel performing display using two or more of the plurality of display elements are included in some cases.

Note that in this specification and the like, hybrid display satisfies any one or a plurality of the above-described structures.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display has a function of displaying a letter and/or an image using one or both of reflected light and self-emitted light in a display portion.

The display device of this embodiment includes a plurality of first pixels including the first display elements and a plurality of second pixels including the second display elements. The first pixels and the second pixels are preferably arranged in matrices.

Each of the first pixels and the second pixels can include one or more subpixels. For example, each pixel can include one subpixel (e.g., white (W)), three subpixels (e.g., three colors of red (R), green (G), and blue (B), or three colors of yellow (Y), cyan (C), and magenta (M)), or four subpixels (e.g., four colors of red (R), green (G), blue (B), and white (W), or four colors of red (R), green (G), blue (B), and yellow (Y)).

In the display device of this embodiment, the first pixels can perform full-color display and the second pixels can perform full-color display. Alternatively, in the display device of this embodiment, the first pixels can perform black-and-white display or grayscale display and the second pixels can perform full-color display. Performing black-and-white display or grayscale display using the first pixels is suitable for displaying information that need not be displayed in color, such as text information.

Figure 28:
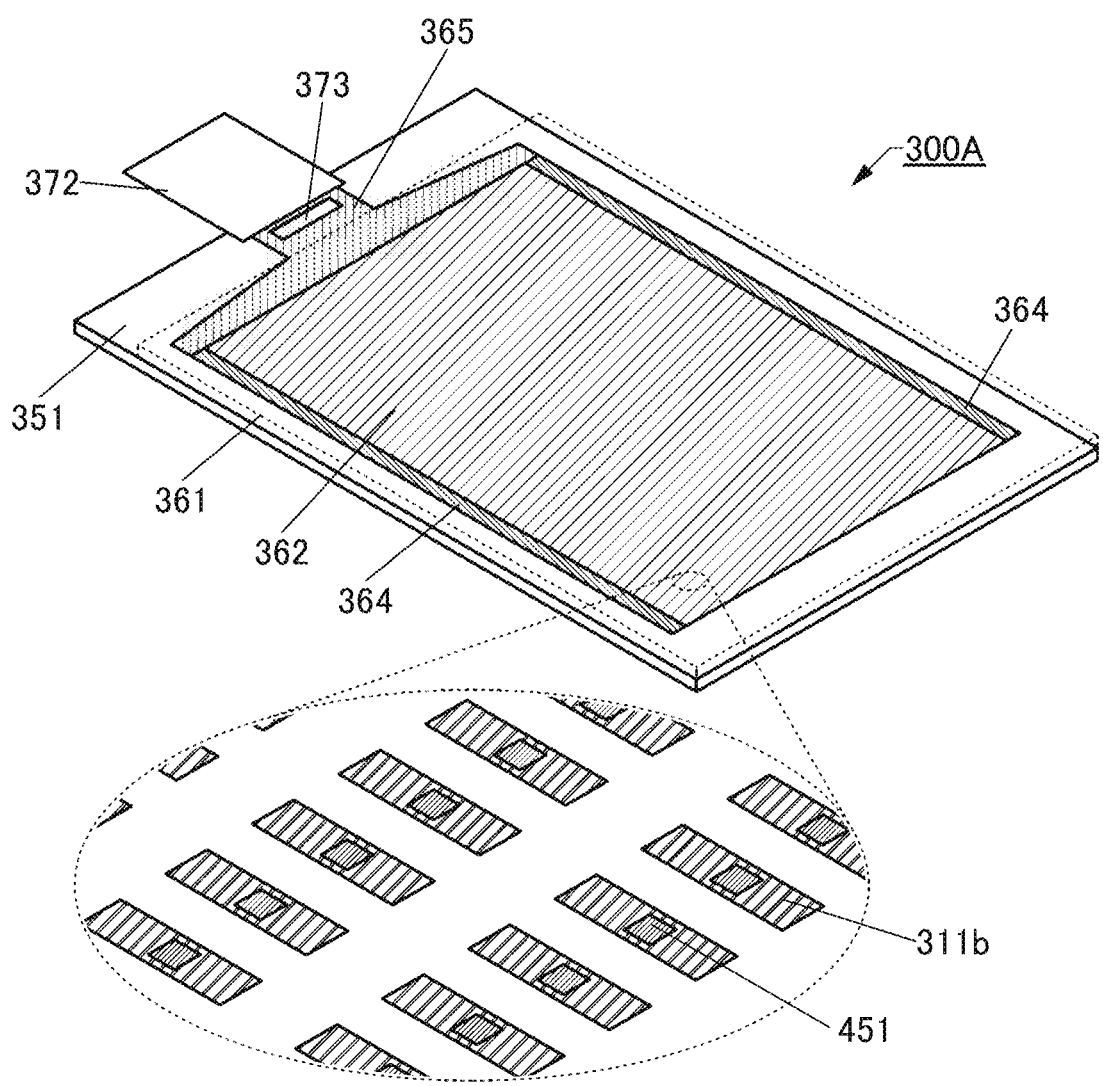
FIG. 28 A perspective view illustrating an example of a display device.

FIG. 28 is a schematic perspective view of a display device 300A. The display device 300A has a structure in which a substrate 351 and a substrate 361 are bonded to each other. In FIG. 28, the substrate 361 is denoted by a dashed line.

The display device 300A includes a display portion 362, a circuit 364, a wiring 365, and the like. FIG. 28 illustrates an example in which the display device 300A is provided with an IC (integrated circuit) 373 and an FPC 372. Thus, the structure illustrated in FIG. 28 can be regarded as a display module including the display device 300A, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 28 illustrates an example in which the IC 373 is provided over the substrate 351 by a COG (Chip On Glass) method, a COF (Chip on Film) method, or the like. An IC including a scan line driver circuit, a signal line driver circuit, or the like can be used as the IC 373, for example. Note that the display device 300A and the display module are not necessarily provided with an IC. In addition, the IC may be mounted on the FPC by a COF method or the like.

FIG. 28 illustrates an enlarged view of part of the display portion 362. Electrodes 311b included in a plurality of display elements are arranged in a matrix in the display portion 362. The electrodes 311b each have a function of reflecting visible light, and each function as a reflective electrode of a liquid crystal element 180.

In addition, as illustrated in FIG. 28, the electrode 311b includes an opening 451. Furthermore, the display portion 362 includes a light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the opening 451 is small, part of light from the light-emitting element 170 is blocked by the electrode 311b and cannot be extracted to the outside, in some cases. The sufficiently large opening 451 can reduce waste of light emitted from the light-emitting element 170.

Figure 29:
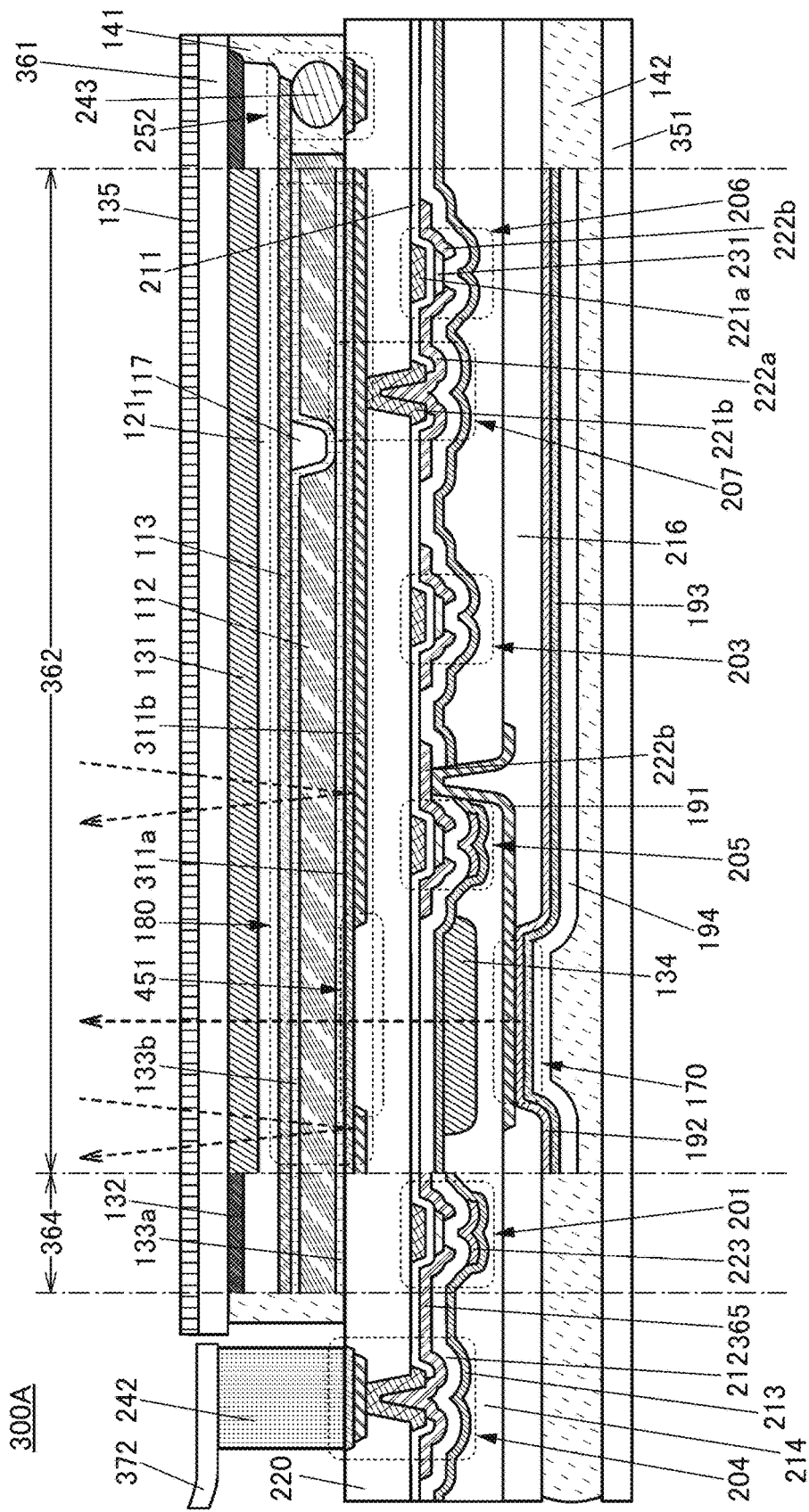
FIG. 29 A cross-sectional view illustrating an example of a display device.

FIG. 29 illustrates an example of cross-sections of part of a region including the FPC 372, part of a region including the circuit 364, and part of a region including the display portion 362 of the display device 300A illustrated in FIG. 28.

The display device 300A illustrated in FIG. 29 includes a transistor 201, a transistor 203, a transistor 205, a transistor 206, the liquid crystal element 180, the light-emitting element 170, an insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with an adhesive layer 142.

The substrate 361 is provided with the coloring layer 131, a light-blocking layer 132, an insulating layer 121, an electrode 113 functioning as a common electrode of the liquid crystal element 180, an alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 functions as a spacer for holding a cell gap of the liquid crystal element 180. In the case where the insulating layer 117 transmits visible light, the insulating layer 117 may be placed to overlap with a display region of the liquid crystal element 180.

The liquid crystal element 180 is a reflective liquid crystal element. The liquid crystal element 180 has a stacked-layer structure in which an electrode 311a serving as a pixel electrode, the liquid crystal layer 112, and the electrode 113 are stacked. The electrode 311b that reflects visible light is provided in contact with the electrode 311a on the substrate 351 side. The electrode 311b includes the opening 451. The electrode 311a and the electrode 113 transmit visible light. An alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of the liquid crystal can be controlled with a voltage that is applied between the electrode 311b and the electrode 113, and thus optical modulation of light can be controlled. In other words, the intensity of light emitted through the polarizing plate 135 can be controlled. Light except for light in a particular wavelength range is absorbed by the coloring layer 131 and thus, extracted light is red light, for example.

As illustrated in FIG. 29, the electrode 311a that transmits visible light is preferably provided at the opening 451. In that case, the liquid crystal layer 112 is aligned in a region overlapping with the opening 451 as in the other regions, whereby occurrence of an alignment defect of the liquid crystals in a boundary portion of these regions and resulting undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in a region where the adhesive layer 141 is provided. In the connection portion 252, a conductive layer obtained by processing the same conductive film as the electrode 311a is electrically connected to part of the electrode 113 through a connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like whose surface is coated with a metal material can be used. It is preferable to use nickel or gold as the metal material because contact resistance can be reduced. It is also preferable to use a particle coated with layers of two or more kinds of metal materials, such as nickel further coated with gold. A material capable of elastic deformation or plastic deformation is preferably used for the connector 243. At this time, as illustrated in FIG. 29, the connector 243, which is a conductive particle, has a shape that is vertically crushed in some cases. Thus, the contact area between the connector 243 and a conductive layer electrically connected to this can be increased, so that contact resistance can be reduced and the occurrence of problems such as bad connection can be suppressed.

The connector 243 is preferably placed so as to be covered with the adhesive layer 141. For example, the connectors 243 are dispersed in the adhesive layer 141 which is not yet cured.

The light-emitting element 170 is a bottom-emission light-emitting element. The light-emitting element 170 has a stacked-layer structure in which an electrode 191 serving as a pixel electrode, an EL layer 192, and an electrode 193 serving as a common electrode are stacked in this order from the insulating layer 220 side. The electrode 191 is connected to a conductive layer 222b included in the transistor 205 through an opening provided in an insulating layer 214. The transistor 205 has a function of controlling the driving of the light-emitting element 170. An insulating layer 216 covers an end portion of the electrode 191. The electrode 193 includes a material that reflects visible light, and the electrode 191 includes a material that transmits visible light. An insulating layer 194 is provided to cover the electrode 193. Light from the light-emitting element 170 is emitted to the substrate 361 side through the coloring layer 134, the insulating layer 220, the opening 451, the electrode 311a, and the like.

The liquid crystal element 180 and the light-emitting element 170 can exhibit various colors when the color of the coloring layer varies among pixels. The display device 300A can perform color display using the liquid crystal element 180. The display device 300A can perform color display using the light-emitting element 170.

The transistor 201, the transistor 203, the transistor 205, and the transistor 206 are formed on a plane of the insulating layer 220 on the substrate 351 side. These transistors can be fabricated through the same process.

A circuit electrically connected to the liquid crystal element 180 is preferably formed on the same plane on which a circuit electrically connected to the light-emitting element 170 is formed. Accordingly, the thickness of the display device can be made smaller than that in the case where the two circuits are formed on different planes. Furthermore, since the two transistors can be formed through the same process, a manufacturing process can be simplified as compared to the case where the two transistors are formed on different planes.

The pixel electrode of the liquid crystal element 180 is positioned on the opposite side of the pixel electrode of the light-emitting element 170, with a gate insulating layer of the transistor provided therebetween.

Here, in the case where the transistor 206 including a metal oxide in its channel formation region and having an extremely low off-state current is used, the case where a memory element electrically connected to the transistor 206 is used, or the like, the gradation can be maintained even if writing operation to a pixel is stopped in displaying a still image using the liquid crystal element 180. In other words, display can be maintained even with an extremely low frame rate. In one embodiment of the present invention, the frame rate can be made extremely low and driving with low power consumption can be performed.

The transistor 203 is a transistor that controls whether the pixel is selected or not (also referred to as a switching transistor or a selection transistor). The transistor 205 is a transistor that controls current flowing to the light-emitting element 170 (also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 has a function of a planarization layer. Note that the number of insulating layers covering the transistor is not limited and may be one or two or more.

A material through which impurities such as water or hydrogen do not easily diffuse is preferably used for at least one of the insulating layers that cover the transistors. Thus, such an insulating layer can function as a barrier film. Such a structure can effectively suppress diffusion of the impurities to the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and the conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 and the transistor 206.

The structure in which the semiconductor layer where a channel is formed is provided between two gates is used for the transistor 201 and the transistor 205. Such a structure enables the control of the threshold voltages of transistors. The two gates may be connected to each other and supplied with the same signal to operate the transistors. Such a transistor can have higher field-effect mobility and thus have a higher on-state current than other transistors. Consequently, a circuit capable of high-speed operation can be manufactured. Furthermore, the area occupied by a circuit portion can be reduced. The use of the transistor having a high on-state current can reduce signal delay in wirings and can suppress display unevenness even if the number of wirings is increased when a display device is increased in size or resolution.

Alternatively, by supplying a potential for controlling the threshold voltage to one of the two gates and a potential for driving to the other, the threshold voltages of the transistors can be controlled.

There is no limitation on the structure of the transistors included in the display device. The transistor included in the circuit 364 and the transistors included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. By the formation of a conductive film that forms the conductive layer 223 under an atmosphere containing oxygen, oxygen can be supplied to the insulating layer 212. The proportion of an oxygen gas in a deposition gas is preferably higher than or equal to 90% and lower than or equal to 100%. Oxygen supplied to the insulating layer 212 is supplied to the semiconductor layer 231 by subsequent heat treatment; as a result, a reduction of oxygen vacancies in the semiconductor layer 231 can be achieved.

It is particularly preferable to use a low-resistance metal oxide for the conductive layer 223. In that case, an insulating film that releases hydrogen, such as a silicon nitride film, is preferably used for the insulating layer 213. Hydrogen can be supplied into the conductive layer 223 during the formation of the insulating layer 213 or by the subsequent heat treatment, whereby the electric resistance of the conductive layer 223 can be effectively reduced.

The coloring layer 134 is provided in contact with the insulating layer 213. The coloring layer 134 is covered with the insulating layer 214.

A connection portion 204 is provided in a region where the substrate 351 and the substrate 361 do not overlap with each other. In the connection portion 204, the wiring 365 is electrically connected to the FPC 372 via a connection layer 242. The connection portion 204 has a structure similar to that of the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 placed on the outer surface of the substrate 361, a linear polarizing plate may be used and a circularly polarizing plate can also be used. As a circularly polarizing plate, a stack of a linear polarizing plate and a quarter-wave retardation plate can be used, for example. This can reduce reflection of external light. Furthermore, the cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film suppressing the attachment of dust, a water repellent film suppressing the attachment of stain, a hard coat film suppressing generation of a scratch caused by the use, or the like may be placed on the outer surface of the substrate 361.

For each of the substrate 351 and the substrate 361, glass, quartz, ceramic, sapphire, an organic resin, or the like can be used. When the substrate 351 and the substrate 361 are formed using a flexible material, the flexibility of the display device can be increased.

A liquid crystal element using, for example, a vertical alignment (VA) mode can be used as the liquid crystal element 180. As the vertical alignment mode, an MVA (Multi-Domain Vertical Alignment) mode, a PVA (Patterned Vertical Alignment) mode, an ASV (Advanced Super View) mode, or the like can be used.

A liquid crystal element using a variety of modes can be used as the liquid crystal element 180. For example, a liquid crystal element using, instead of a VA mode, a TN (Twisted Nematic) mode, an IPS (In-Plane-Switching) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an STN (Super Twisted Nematic) mode, a TBA (Transverse Bend Alignment) mode, an ECB (Electrically Controlled Birefringence) mode, a guest-host mode, or the like can be used.

The liquid crystal element is an element that controls transmission or non-transmission of light by an optical modulation effect of the liquid crystal. The optical modulation effect of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an optimal liquid crystal material can be used depending on the mode or design to be used.

To control the alignment of the liquid crystal, the alignment films can be provided. Note that in the case where a horizontal electric field mode is employed, a liquid crystal exhibiting a blue phase for which no alignment film is used may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition that includes a liquid crystal exhibiting a blue phase and a chiral material has a short response time and is optically isotropic. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 135 is provided on the display surface side. Besides, a light diffusion plate is preferably placed on the display surface side because visibility can be improved.

A front light may be provided on the outer side of the polarizing plate 135. As the front light, an edge-light front light is preferably used. A front light including an LED is preferably used because power consumption can be reduced.

For the materials that can be used for the light-emitting element, the transistors, the insulating layers, the conductive layers, the adhesive layers, the connection layer, and the like, the description in Embodiment 1 can be referred to.

As described above, the display device of this embodiment includes two types of display elements and can be used with switching between a plurality of display modes, and thus can have high visibility and high convenience regardless of ambient brightness.

This embodiment can be combined with the other embodiments as appropriate.

Embodiment 3

Described in this embodiment is a metal oxide applicable to a transistor disclosed in one embodiment of the present invention. In particular, details about a metal oxide and a CAC (Cloud-Aligned Composite)-OS are described below.

A CAC-OS or a CAC-metal oxide has a conducting function in a part of the material and has an insulating function in a part of the material; as a whole, the CAC-OS or the CAC-metal oxide has a function of a semiconductor. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium. It is particularly preferable that a metal oxide contain indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

In contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Ion) and high field-effect mobility (μ) can be achieved.

Moreover, a semiconductor element using the CAC-OS has high reliability. Thus, the CAC-OS is most suitable for a variety of semiconductor devices such as displays.

This embodiment can be combined with the other embodiments as appropriate.

Embodiment 4

In this embodiment, a display module and electronic devices of one embodiment of the present invention will be described.

Figure 30A:
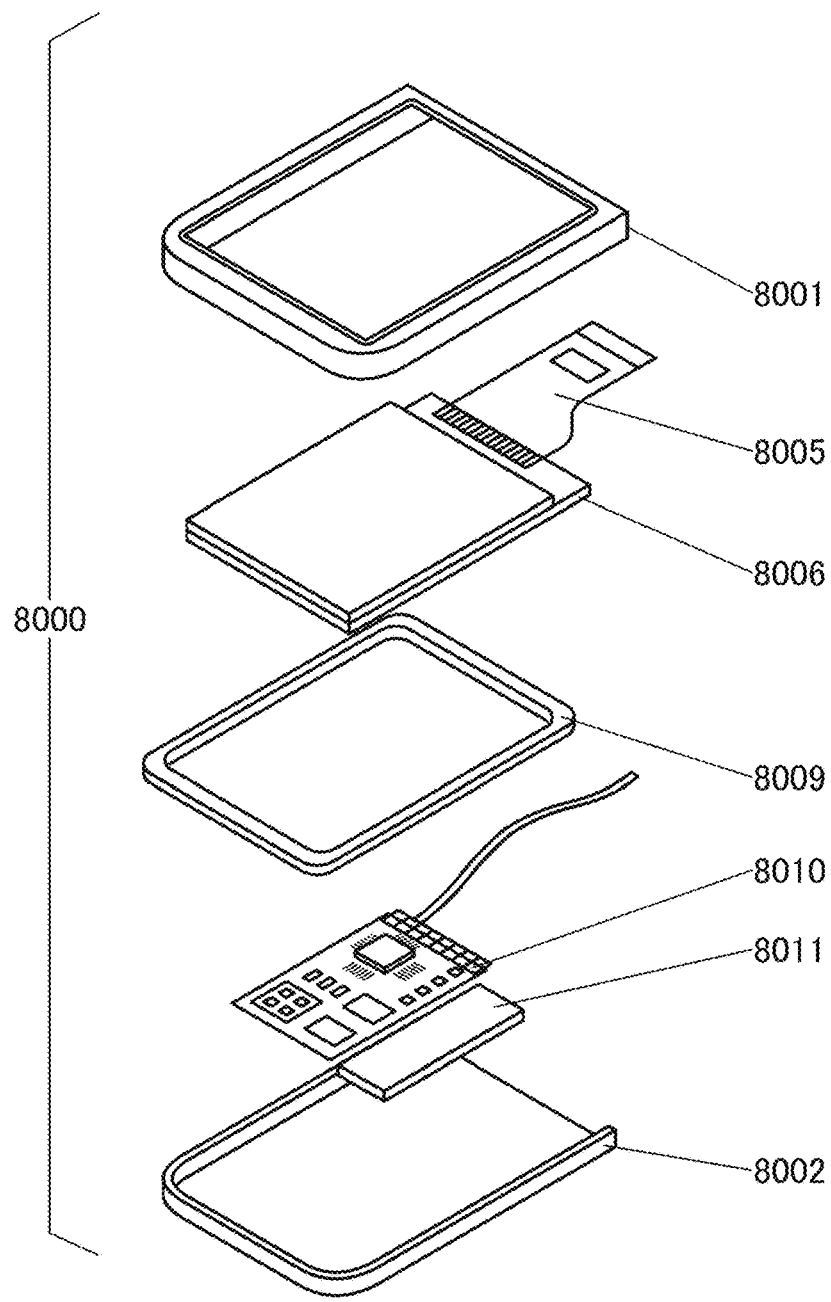
FIGS. 30A-B Drawings illustrating an example of a display module.

In a display module 8000 in FIG. 30(A), a display panel 8006 connected to an FPC 8005, a frame 8009, a printed circuit board 8010, and a battery 8011 are provided between an upper cover 8001 and a lower cover 8002.

The display device manufactured using one embodiment of the present invention can be used for, for example, the display panel 8006. Thus, the display module can be manufactured with a high yield.

The shape and size of the upper cover 8001 and the lower cover 8002 can be changed as appropriate in accordance with the size of the display panel 8006.

Furthermore, a touch panel may be provided so as to overlap with the display panel 8006. As the touch panel, a resistive or capacitive touch panel can be used, overlapping with the display panel 8006. Furthermore, instead of providing the touch panel, the display panel 8006 may have a touch panel function.

The frame 8009 has a function of an electromagnetic shield for blocking electromagnetic waves generated by the operation of the printed circuit board 8010, in addition to a function of protecting the display panel 8006. The frame 8009 may also have a function of a radiator plate.

The printed circuit board 8010 includes a power supply circuit and a signal processing circuit for outputting a video signal and a clock signal. A power source for supplying power to the power supply circuit may be an external commercial power source or may be the battery 8011 provided separately. The battery 8011 can be omitted in the case of using a commercial power source.

Moreover, the display module 8000 may be additionally provided with a component such as a polarizing plate, a retardation plate, or a prism sheet.

Figure 30B:
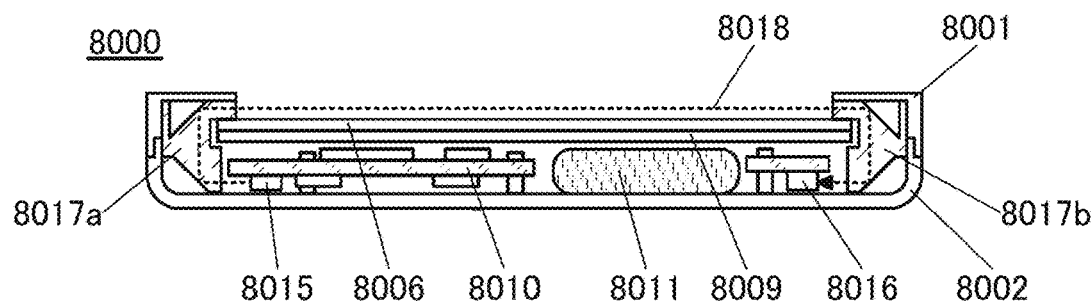

FIG. 30(B) is a schematic cross-sectional view of the display module 8000 with an optical touch sensor.

The display module 8000 includes a light-emitting portion 8015 and a light-receiving portion 8016 which are provided on the printed circuit board 8010. Furthermore, a pair of light guide portions (a light guide portion 8017a and a light guide portion 8017b) are provided in a region surrounded by the upper cover 8001 and the lower cover 8002.

For example, a plastic or the like can be used for the upper cover 8001 and the lower cover 8002. Furthermore, the upper cover 8001 and the lower cover 8002 can each be thin. For example, each cover can have a thickness greater than or equal to 0.5 mm and less than or equal to 5 mm. Therefore, the display module 8000 can be significantly lightweight. The upper cover 8001 and the lower cover 8002 can be manufactured with a small amount of material, and therefore, manufacturing costs can be reduced.

The display panel 8006 overlaps with the printed circuit board 8010 and the battery 8011 with the frame 8009 located therebetween. The display panel 8006 and the frame 8009 are fixed to the light guide portion 8017a and the light guide portion 8017b.

Light 8018 emitted from the light-emitting portion 8015 travels over the display panel 8006 through the light guide portion 8017a and reaches the light-receiving portion 8016 through the light guide portion 8017b. For example, blocking of the light 8018 by a sensing target such as a finger or a stylus enables detection of touch operation.

A plurality of light-emitting portions 8015 are provided along two adjacent sides of the display panel 8006, for example. A plurality of light-receiving portions 8016 are provided so as to face the light-emitting portions 8015. Accordingly, information about the position of touch operation can be obtained.

As the light-emitting portion 8015, a light source such as an LED element can be used, for example. It is particularly preferable to use a light source that emits infrared light, which is not visually recognized by users and is harmless to users, as the light-emitting portion 8015.

As the light-receiving portion 8016, a photoelectric element that receives light emitted from the light-emitting portion 8015 and converts it into an electrical signal can be used. A photodiode that can receive infrared light can be favorably used.

For the light guide portion 8017a and the light guide portion 8017b, members that transmit at least the light 8018 can be used. With the use of the light guide portion 8017a and the light guide portion 8017b, the light-emitting portion 8015 and the light-receiving portion 8016 can be placed under the display panel 8006, and a malfunction of the touch sensor due to external light reaching the light-receiving portion 8016 can be suppressed. It is particularly preferable to use a resin which absorbs visible light and transmits infrared light. This is more effective in suppressing the malfunction of the touch sensor.

Highly reliable electronic devices with curved surfaces can be manufactured by one embodiment of the present invention. In addition, flexible and highly reliable electronic devices can be manufactured by one embodiment of the present invention.

Examples of electronic devices include a television set, a desktop or notebook personal computer, a monitor for a computer or the like, a digital camera, a digital video camera, a digital photo frame, a mobile phone, a portable game machine, a portable information terminal, an audio reproducing device, and a large game machine such as a pachinko machine.

Furthermore, the display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 31A:
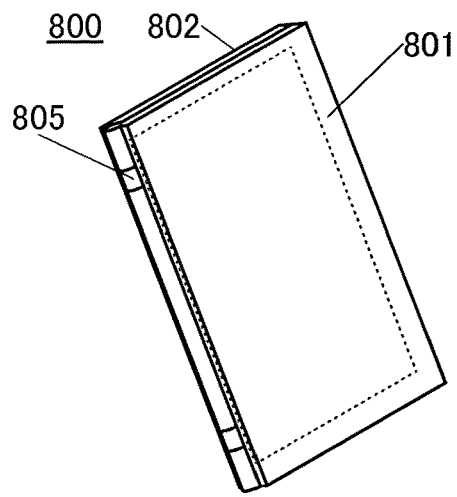
FIGS. 31A-D Drawings illustrating examples of electronic devices.

A portable information terminal 800 illustrated in FIGS. 31(A) and (B) includes a housing 801, a housing 802, a display portion 803, a hinge portion 805, and the like.

Figure 31B:
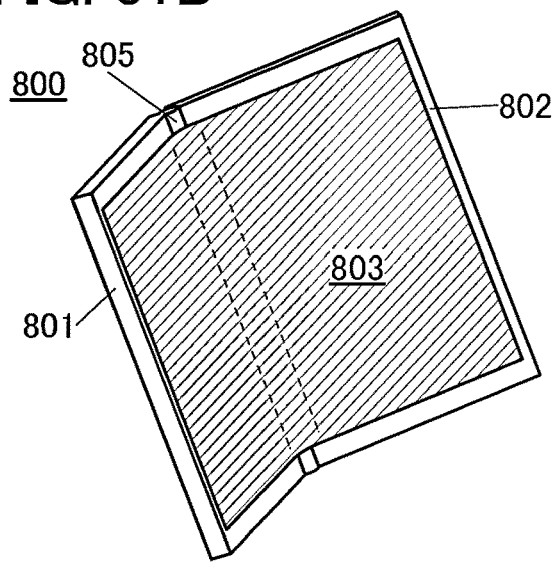

The housing 801 and the housing 802 are joined with the hinge portion 805. The portable information terminal 800 can be opened as illustrated in FIG. 31(B) from a closed state (FIG. 31(A)). Thus, the portable information terminal 800 has high portability when carried and excellent visibility when used because of its large display region.

In the portable information terminal 800, the flexible display portion 803 is provided across the housing 801 and the housing 802 which are joined to each other by the hinge portion 805.

The display device manufactured using one embodiment of the present invention can be used for the display portion 803. Thus, the portable information terminal can be manufactured with a high yield.

The display portion 803 can display at least one of text information, a still image, a moving image, and the like. When text information is displayed on the display portion, the portable information terminal 800 can be used as an e-book reader.

When the portable information terminal 800 is opened, the display portion 803 is held while being in a significantly curved form. For example, the display portion 803 is held while including a curved portion with a radius of curvature greater than or equal to 1 mm and less than or equal to 50 mm, preferably greater than or equal to 5 mm and less than or equal to 30 mm. Part of the display portion 803 can perform display in a curved surface shape since pixels are continuously arranged from the housing 801 to the housing 802.

The display portion 803 functions as a touch panel and can be controlled with a finger, a stylus, or the like.

The display portion 803 is preferably formed using one flexible display. Thus, unbroken, continuous display can be performed between the housing 801 and the housing 802. Note that each of the housing 801 and the housing 802 may be provided with a display.

The hinge portion 805 preferably includes a locking mechanism so that an angle formed between the housing 801 and the housing 802 does not become larger than a predetermined angle when the portable information terminal 800 is opened. For example, an angle at which the housing 801 and the housing 802 become locked (they are not opened any further) is preferably greater than or equal to 90° and less than 180° and can be typically 90°, 120°, 135°, 150°, 175°, or the like. In that case, the convenience, safety, and reliability of the portable information terminal 800 can be improved.

When the hinge portion 805 includes a locking mechanism, excessive force is not applied to the display portion 803; thus, breakage of the display portion 803 can be prevented. Therefore, a highly reliable portable information terminal can be provided.

The housing 801 and the housing 802 may include a power button, an operation button, an external connection port, a speaker, a microphone, or the like.

Either of the housing 801 and the housing 802 is provided with a wireless communication module, and data can be transmitted and received through a computer network such as the Internet, a LAN (Local Area Network), or Wi-Fi (registered trademark).

Figure 31C:
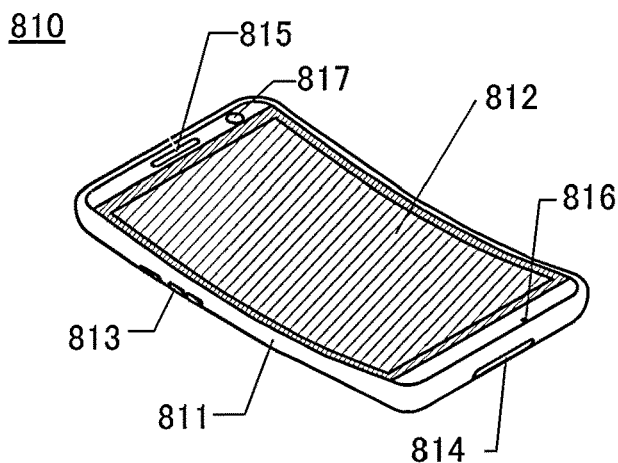

A portable information terminal 810 illustrated in FIG. 31(C) includes a housing 811, a display portion 812, an operation button 813, an external connection port 814, a speaker 815, a microphone 816, a camera 817, and the like.

The display device manufactured using one embodiment of the present invention can be used for the display portion 812. Thus, the portable information terminal can be manufactured with a high yield.

In the portable information terminal 810, the display portion 812 is provided with a touch sensor. All operations including making a call and inputting letters can be performed by touch on the display portion 812 with a finger, a stylus, or the like.

In addition, the operation of the operation button 813 can switch the power ON and OFF operations and types of images displayed on the display portion 812. For example, switching from a mail creation screen to a main menu screen can be performed.

Moreover, when a detection device such as a gyroscope sensor or an acceleration sensor is provided inside the portable information terminal 810, the (horizontal or vertical) orientation of the portable information terminal 810 can be determined so that the direction of display on the screen of the display portion 812 can be automatically changed. Furthermore, the direction of display on the screen can be changed by touch on the display portion 812, operation with the operation button 813, sound input using the microphone 816, or the like.

The portable information terminal 810 has, for example, one or a plurality of functions selected from a telephone, a personal organizer, an information browsing device, and the like. Specifically, the portable information terminal 810 can be used as a smartphone. The portable information terminal 810 is capable of executing a variety of applications such as mobile phone calls, e-mailing, text viewing and writing, music reproduction, video replay, Internet communication, and games, for example.

Figure 31D:
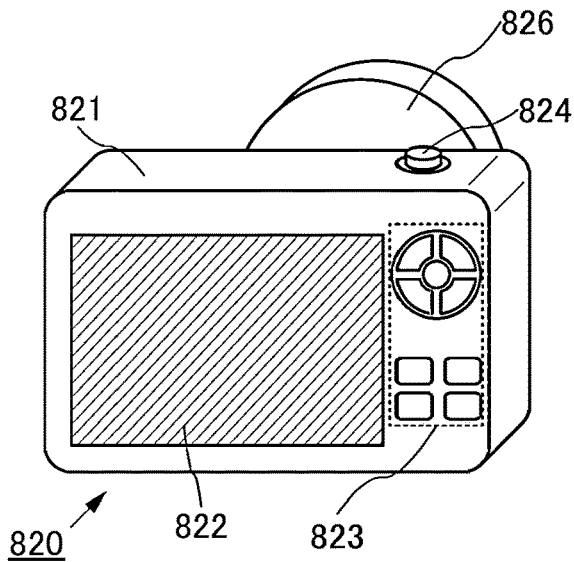

A camera 820 illustrated in FIG. 31(D) includes a housing 821, a display portion 822, operation buttons 823, a shutter button 824, and the like. Moreover, a detachable lens 826 is attached to the camera 820.

The display device manufactured using one embodiment of the present invention can be used for the display portion 822. Thus, the camera can be manufactured with a high yield.

Here, the camera 820 is configured such that the lens 826 is replaceable and detachable from the housing 821; however, the lens 826 and the housing 821 may be integrated with each other.

The camera 820 can take still images or moving images with the push of the shutter button 824. In addition, the display portion 822 has a function of a touch panel, and images can also be taken by touch on the display portion 822.

Note that the camera 820 can be additionally equipped with a stroboscope, a viewfinder, and the like. Alternatively, they may be incorporated into the housing 821.

FIGS. 32(A) to (E) illustrate electronic devices. These electronic devices include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device manufactured using one embodiment of the present invention can be favorably used for the display portion 9001. Thus, the electronic devices can be manufactured with a high yield.

The electronic devices illustrated in FIGS. 32(A) to (E) can have a variety of functions. For example, they can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a memory medium and displaying it on the display portion. Note that the functions which the electronic devices illustrated in FIGS. 32(A) to (E) have are not limited to these, and they may have other functions.

Figure 32A:
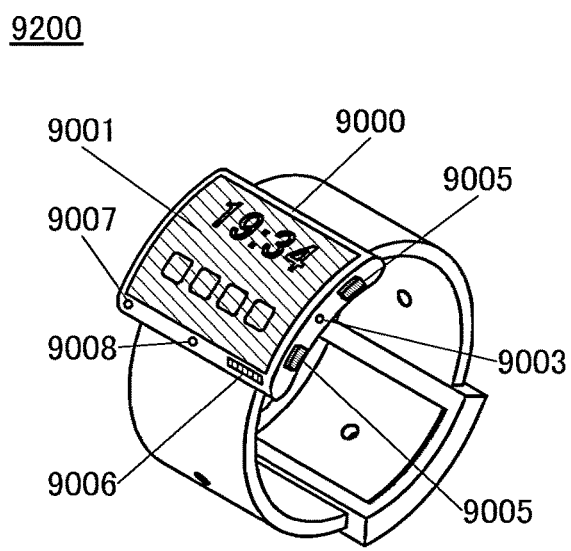
FIGS. 32A-E Drawings illustrating examples of electronic devices.
Figure 32B:
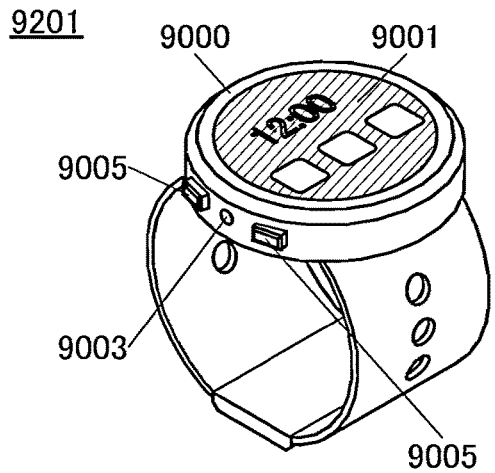

FIG. 32(A) and FIG. 32(B) are perspective views illustrating a wristwatch-type portable information terminal 9200 and a wristwatch-type portable information terminal 9201, respectively.

The portable information terminal 9200 illustrated in FIG. 32(A) is capable of executing a variety of applications such as mobile phone calls, e-mailing, text viewing and writing, music reproduction, Internet communication, and computer games. In addition, the display portion 9001 is provided such that its display surface is curved, and display can be performed along the curved display surface. Moreover, the portable information terminal 9200 can perform standards-based near field communication. For example, mutual communication with a headset capable of wireless communication enables hands-free calling. Furthermore, the portable information terminal 9200 includes the connection terminal 9006 and can exchange data directly with another information terminal through a connector. Power charging through the connection terminal 9006 is also possible. Note that the charging operation may be performed by wireless power feeding without through the connection terminal 9006.

Unlike in the portable information terminal illustrated in FIG. 32(A), the display surface of the display portion 9001 is not curved in the portable information terminal 9201 illustrated in FIG. 32(B). Furthermore, the external shape of the display portion of the portable information terminal 9201 is a non-rectangular shape (a circular shape in FIG. 32(B)).

Figure 32C:
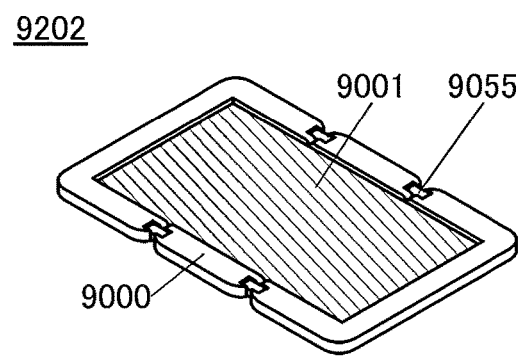
Figure 32D:
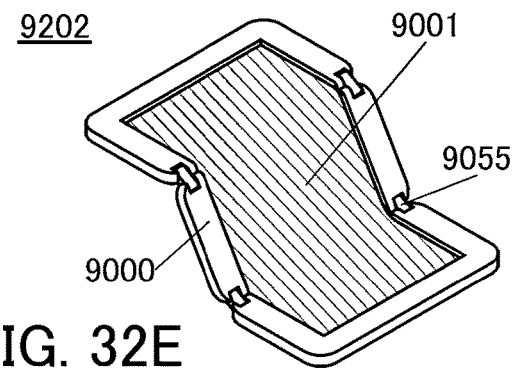
Figure 32E:
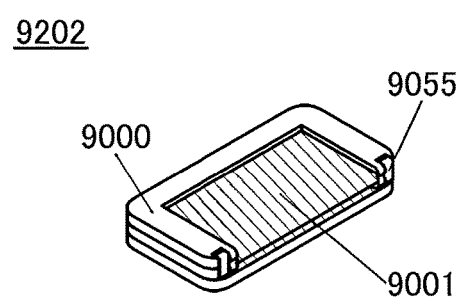

FIGS. 32(C) to (E) are perspective views illustrating a foldable portable information terminal 9202. Note that FIG. 32(C) is a perspective view of the portable information terminal 9202 in an open state; FIG. 32(D) is a perspective view of the portable information terminal 9202 that is being changed from one of an open state and a folded state to the other; and FIG. 32(E) is a perspective view of the portable information terminal 9202 in a folded state.

The portable information terminal 9202 is highly portable in a folded state and has high display browsability due to a seamless large display region in an open state. The display portion 9001 included in the portable information terminal 9202 is supported by three housings 9000 joined with hinges 9055. By being bent between two housings 9000 with the hinges 9055, the portable information terminal 9202 can be reversibly changed in shape from an open state to a folded state. For example, the portable information terminal 9202 can be bent with a radius of curvature greater than or equal to 1 mm and less than or equal to 150 mm.

This embodiment can be combined with the other embodiments as appropriate.

Example 1

In this example, the results of peeling a resin layer from a formation substrate are described.

A fabrication method of a sample of this example is described with reference to FIG. and FIG. 6.

First, the metal oxide layer 20 was formed over the formation substrate 14 (FIG. 5(A1)).

As the formation substrate 14, an approximately 0.7-mm-thick glass substrate was used. As the metal oxide layer 20, a titanium oxide film was formed. Specifically, first, an approximately 5-nm-thick titanium film was formed by a sputtering method. After that, baking was performed at 450° C. for one hour while a mixed gas of a nitrogen gas and an oxygen gas (580 NL/min, an oxygen concentration of 20%) was supplied, so that the titanium oxide film was formed.

Next, the first layer 24 was formed over the metal oxide layer 20 (FIG. 5(B)). The first layer 24 was formed using a non-photosensitive material containing a soluble polyimide resin. The thickness at the time of application of the material was approximately 2.0 μm.

Subsequently, heat treatment was performed on the first layer 24, so that the resin layer 23 was formed (FIG. 5(C)). As the heat treatment, baking was performed at a temperature of 350° C. for one hour in an $N_2$ atmosphere.

Then, a UV-peeling tape (corresponding to the adhesive layer 75*b* and the substrate 75*a* in FIG. 5(D)) was attached to the resin layer 23.

The sample of this example was irradiated with laser light from the formation substrate 14 side (FIG. 6(A)). In a top view, the entire surface of the sample was irradiated with laser light. Note that a mask (not illustrated) for shielding light was provided in the peripheral portion of the sample at the time of the irradiation.

As a laser oscillator for laser light, a XeCl excimer laser with a wavelength of 308 nm was used. The short-axis light-condensing width of the beam was 625 μm, and the energy density was approximately 440 mJ/cm². Note that the sample was divided into four regions with different irradiation conditions of laser light. The numbers of shots for the four regions were 10 shots, 20 shots, 30 shots, and 40 shots. The repetition rate was 60 Hz. The scanning speed depends on the number of shots. The scanning speed in the region with shots was 3.75 mm/second, that in the region with 20 shots was 1.90 mm/second, that in the region with 30 shots was 1.25 mm/second, and that in the region with 40 shots was 0.93 mm/second.

The absorptance and the transmittance of the light with a wavelength of 308 nm of the stacked-layer structure including the formation substrate 14 and the metal oxide layer 20 were approximately 75% and approximately 13%, respectively. Thus, all of an interface between the metal oxide layer 20 and the resin layer 23, the inside of the metal oxide layer 20, and the inside of the resin layer 23 were presumably irradiated with the laser light.

After the laser light irradiation, the formation substrate 14 was peeled from the sample by cutting a portion located inward from the peripheral portion with a cutter from the substrate 75*a* side of the sample (FIG. 6(B1)).

Figure 33:
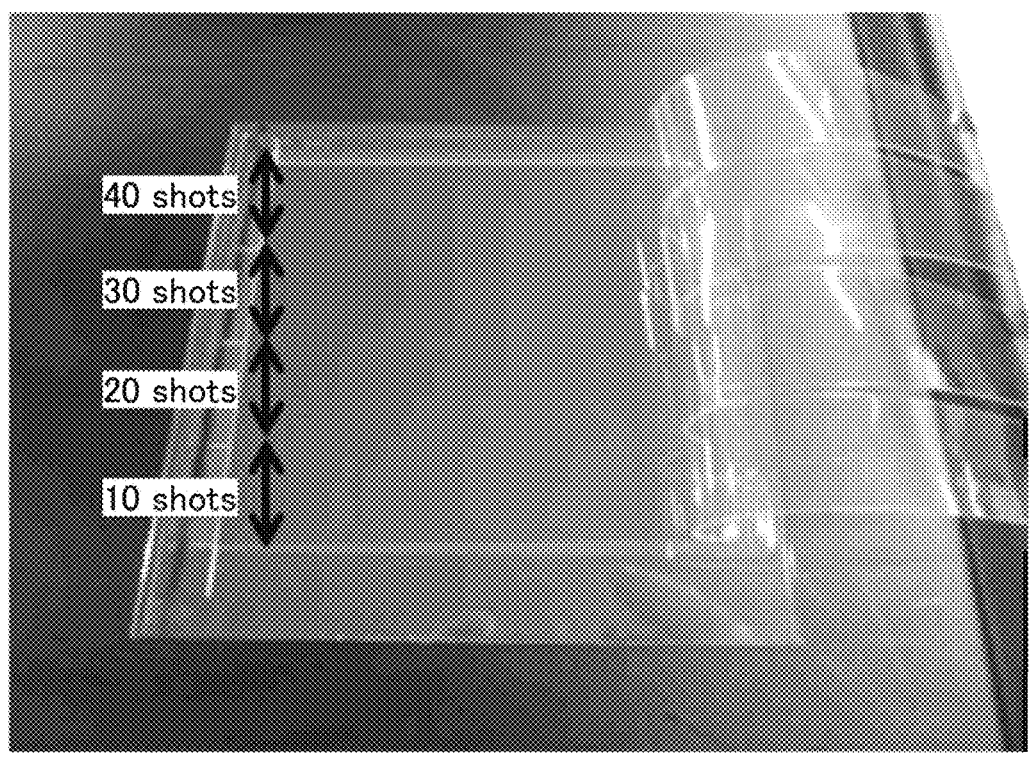
FIG. 33 A drawing showing peeling results of Example 1.

As shown in FIG. 33, the substrate 75*a* was able to be peeled from the formation substrate 14 in any of the regions where the number of shots were 10 shots to 40 shots.

FIG. 34 shows the results of cross-sectional STEM (Scanning Transmission Electron Microscopy) observation of the sample where the number of shots was 10 shots.

Figure 34A:
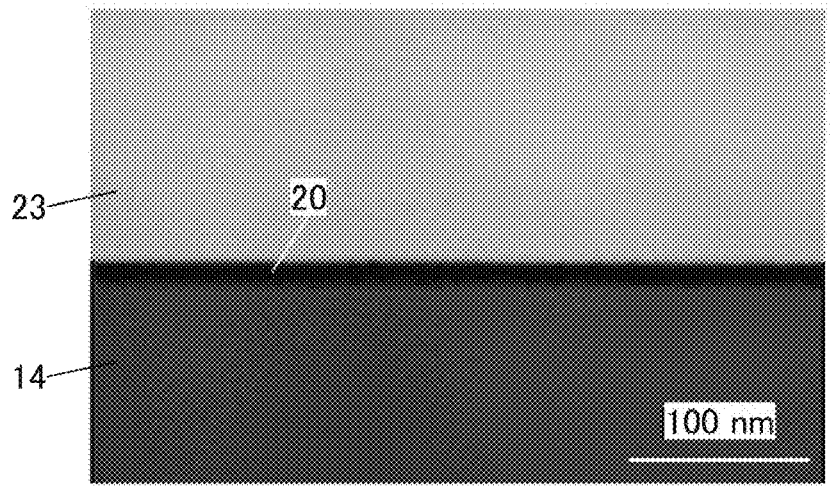
FIGS. 34A-C Cross-sectional STEM observation images of a sample of Example 1.
Figure 34B:
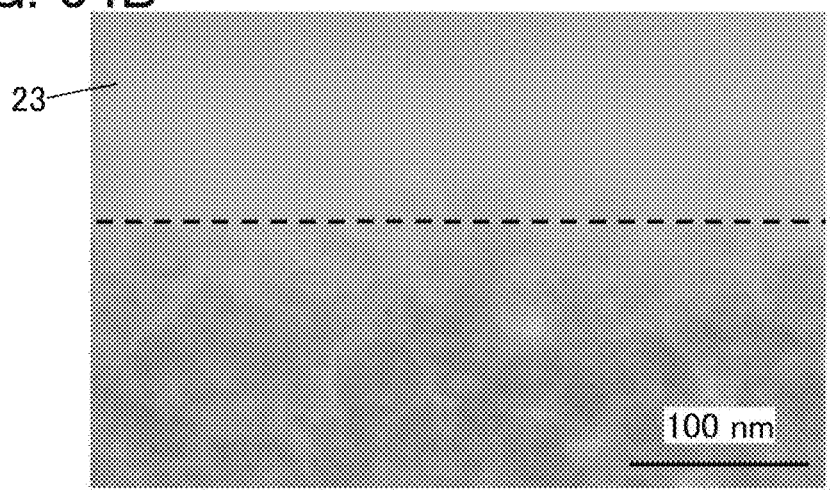
Figure 34C:
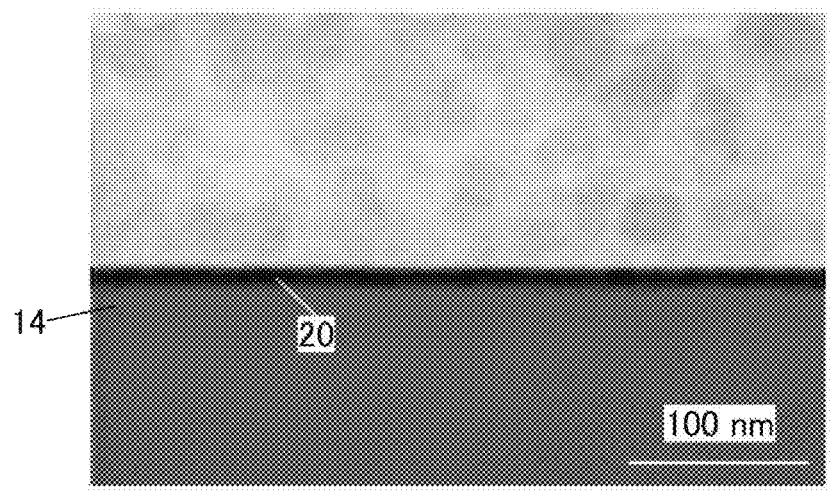

FIG. 34(A) shows a cross-sectional STEM image of the sample before peeling. The thickness of the metal oxide layer 20 was approximately 14 nm. FIG. 34(B) shows a cross-sectional STEM image of the peeled substrate 75*a* side. The metal oxide layer 20 was not observed between the resin layer 23 and a coat layer formed for the observation. Furthermore, titanium was not detected on the resin layer 23 side by analysis using energy dispersive X-ray spectroscopy (EDX). FIG. 34(C) shows a cross-sectional STEM image of the peeled formation substrate 14 side. The thickness of the metal oxide layer 20 was approximately 11 nm. From the above results, the separation was presumably achieved at the interface between the metal oxide layer 20 and the resin layer 23.

It was confirmed from the results in this example that the formation substrate 14 was able to be peeled at the interface between the metal oxide layer 20 and the resin layer 23 by the peeling method of one embodiment of the present invention. The stack of the formation substrate 14 and the metal oxide layer 20 can be cleaned by the use of the cleaning method of a substrate of one embodiment of the present invention. Thus, the formation substrate 14 alone or the stack of the formation substrate 14 and the metal oxide layer 20 can be reused.

Furthermore, it was found that the formation substrate 14 was able to be peeled at the interface between the metal oxide layer 20 and the resin layer 23 under any of the conditions where the energy densities were approximately 306 mJ/cm², approximately 324 mJ/cm², approximately 342 mJ/cm², and approximately 360 mJ/cm² (each shot number was 10 shots). Thus, it was found that the treatment was able to be performed at an energy density lower than that under the condition used in a laser crystallization step. Accordingly, the number of substrates which can be treated by a laser apparatus can be increased. Furthermore, the laser apparatus can be used for a long period, and the running costs of the laser apparatus can be reduced.

DESCRIPTION OF NUMERALS

14 formation substrate
16 region
17 region
18 foreign matter
19 metal layer
metal oxide layer
21 liquid feeding mechanism
23 resin layer
24 first layer
layer to be peeled
26 linear beam
27 processing region
50 oxygen plasma
55 laser light
75*a* substrate
75*b* adhesive layer
150 multi-chamber equipment
151 ashing apparatus
152 transfer chamber
153 load lock chamber
154 cassette port 155 substrate supply chamber
160 in-line equipment
161 pretreatment portion
161a loader portion
161b pretreatment chamber
162 treatment chamber
163 treatment chamber
164 treatment chamber
165 posttreatment portion
165a posttreatment chamber
165b unloader portion
170 light-emitting element
171 vacuum chamber
172 ICP coil
173 gas flow path
174 high-frequency power source
175 substrate stage
176 substrate to be treated
177 high-frequency power source
178 automatic pressure control valve
179a turbo molecular pump
179b dry pump

The invention claimed is:

1. A method for manufacturing a display device, comprising:
a step of forming a stack and a metal oxide layer over a first formation substrate;
a step of irradiating the stack with laser light through the first formation substrate;
a step of separating the stack and the metal oxide layer; and
a step of attaching a first substrate including a flexible material to a surface of the stack where the metal oxide layer is separated,
wherein the stack comprises a layer comprising a transistor and a light-emitting device, and a resin layer between the layer and the first formation substrate, and
wherein a focus of the laser light is at an interface between the resin layer and the metal oxide layer or a vicinity thereof.

2. The method for manufacturing a display device according to claim 1,
wherein the stack comprises a second substrate, and
wherein the layer is between the first formation substrate and the second substrate.

3. The method for manufacturing a display device according to claim 2, wherein the second substrate is attached onto the layer by a bonding layer.

4. The method for manufacturing a display device according to claim 2, wherein the second substrate comprises a flexible material.

5. The method for manufacturing a display device according to claim 1, wherein the separation is executed in a manner that a part of the resin layer remains over the first formation substrate.

6. The method for manufacturing a display device according to claim 1, wherein a channel formation region of the transistor comprises polycrystalline silicon.

7. The method for manufacturing a display device according to claim 1, wherein the transistor is between the first formation substrate and the light-emitting device.

8. A method for manufacturing a display device, comprising:
a step of forming a first stack over a second stack;
a step of performing laser irradiation through a first formation substrate;
a step of separating the first stack and the second stack; and
a step of attaching a first substrate to a first surface of the first stack, the first surface being a surface where the second stack is separated,
wherein the first stack comprises a first layer comprising a transistor and a light-emitting device, and a resin layer between the first layer and the second stack,
wherein the second stack comprises the first formation substrate and a second layer over the first formation substrate, and
wherein a focus of the laser light is the first surface of the first stack.

9. The method for manufacturing a display device according to claim 8,
wherein the first stack comprises a second substrate, and
wherein the first layer is between the first formation substrate and the second substrate.

10. The method for manufacturing a display device according to claim 9, wherein the second substrate is attached onto the first layer by a bonding layer.

11. The method for manufacturing a display device according to claim 9, wherein the second substrate comprises a flexible material.

12. The method for manufacturing a display device according to claim 8, wherein the separation is executed in a manner that a part of the resin layer remains over the second stack.

13. The method for manufacturing a display device according to claim 8, wherein a channel formation region of the transistor comprises polycrystalline silicon.

14. The method for manufacturing a display device according to claim 8, wherein the transistor is between the first formation substrate and the light-emitting device.

15. A method for manufacturing a display device, comprising:
a step of forming a first stack over a second stack;
a step of performing laser irradiation through a first formation substrate;
a step of separating the first stack and the second stack; and
a step of attaching a first substrate including a flexible material to a first surface of the first stack, the first surface being a surface where the second stack is separated,
wherein the first stack comprises a first layer comprising a transistor and a light-emitting device, and a resin layer between the first layer and the second stack,
wherein the second stack comprises the first formation substrate and a second layer over the first formation substrate, and
wherein a focus of the laser light is the first surface of the first stack.

16. The method for manufacturing a display device according to claim 15,
wherein the first stack comprises a second substrate, and
wherein the first layer is between the first formation substrate and the second substrate.

17. The method for manufacturing a display device according to claim 16, wherein the second substrate is attached onto the first layer by a bonding layer.

18. The method for manufacturing a display device according to claim 16, wherein the second substrate comprises a flexible material.

19. The method for manufacturing a display device according to claim 15, wherein a channel formation region of the transistor comprises polycrystalline silicon.

20. The method for manufacturing a display device according to claim 15, wherein the transistor is between the first formation substrate and the light-emitting device.

21. The method for manufacturing a display device according to claim 8, wherein the second layer is a metal oxide layer.

\* \* \* \* \*